(12) United States Patent
Fu

(10) Patent No.: US 12,727,324 B2
(45) Date of Patent: Sep. 1, 2026

(54) DISPLAY PANEL AND DISPLAY APPARATUS

(71) Applicant: Shanghai Tianma Micro-Electronics Co., Ltd., Shanghai (CN)

(72) Inventor: Jujian Fu, Shanghai (CN)

(73) Assignee: Shanghai Tianma Micro-Electronics Co., Ltd., Shanghai (CN)

( * ) Notice: Subject to any disclaimer, the term of this patent is extended or adjusted under 35 U.S.C. 154(b) by 779 days.

(21) Appl. No.: 17/988,221

(22) Filed: Nov. 16, 2022

(65) Prior Publication Data

US 2024/0040829 A1 Feb. 1, 2024

(30) Foreign Application Priority Data

Jul. 27, 2022 (CN) ......................... 202210890585.3

(51) Int. Cl.

*H10K 50/86* (2023.01)
*H10K 59/122* (2023.01)
*H10K 59/131* (2023.01)
*H10K 59/35* (2023.01)

(52) U.S. Cl.

CPC ......... *H10K 50/865* (2023.02); *H10K 59/122* (2023.02); *H10K 59/131* (2023.02); *H10K 59/353* (2023.02)

(58) Field of Classification Search

CPC .. H10K 50/865; H10K 59/121; H10K 59/122; H10K 59/131; H10K 59/65; H10K 59/353

USPC ............................................................ 257/40

See application file for complete search history.

(56) References Cited

U.S. PATENT DOCUMENTS 11,367,771 B2 * 6/2022 Lee ........................ H10K 59/65
11,741,739 B2 * 8/2023 Sung ................... H10F 39/8023 382/124
2021/0249635 A1 * 8/2021 Cho ..................... H10K 50/858
2021/0335920 A1 * 10/2021 Hong ................... H10K 50/865
2022/0309267 A1 * 9/2022 Kim ................... G06V 40/1318

* cited by examiner

*Primary Examiner* — Toan Ton

(74) *Attorney, Agent, or Firm* — Anova Law Group, PLLC

(57) ABSTRACT

A display panel and a display apparatus are provided in the present disclosure. The display panel includes a first display region and a light-blocking layer. The first display region includes a plurality of light-transmitting regions and a plurality of pixel regions; and a transmittance of a light-transmitting region is greater than a transmittance of a pixel region. The light-blocking layer includes a first opening region and a second opening region; along a direction perpendicular to a plane of the display panel, the first opening region is overlapped with the light-transmitting region, and the second opening region is overlapped with the pixel region; and along a direction in parallel with the plane of the display panel, a minimum distance between the light-transmitting region and the pixel region is D1, and a minimum distance between two adjacent pixel regions is D2, where D1<D2.

16 Claims, 23 Drawing Sheets

DISPLAY PANEL AND DISPLAY APPARATUS

CROSS-REFERENCE TO RELATED APPLICATION

This application claims the priority of Chinese Patent Application No. 202210890585.3, filed on Jul. 27, 2022, the content of which is incorporated herein by reference in its entirety.

TECHNICAL FIELD

The present disclosure generally relates to the field of display technology and, more particularly, relates to a display panel and a display apparatus.

BACKGROUND

Organic light-emitting diode (OLED) display apparatuses are widely used due to their various advantages, such as active light emission, high contrast ratio, fast response speed, lightness, and flexibility. The OLED is a current-type light-emitting device, which mainly includes an anode, a cathode, and an OLED functional layer. The main working principle of OLED is that the OLED functional layer emits light through carrier injection and recombination under the drive of the electric field formed by the anode and the cathode.

With the development of display technology, the full-panel display apparatus has received extensive attention in the market and has broad application prospects. In the existing technology, the full-panel display apparatus is realized by arranging an under-panel photosensitive element, such as a camera, a light sensor, a fingerprint sensor, and/or the like, below a display region; and the display region corresponding to the photosensitive element is called a camera under panel (CUP) region. The camera under panel technology based on the OLED display panel has been paid attention by more mobile phone and panel manufacturers. Due to self-luminous characteristics of the OLED display panel, the panel structure of the OLED display panel may be relatively simple, the thickness of the OLED display panel may be thinner than the thickness of the existing liquid crystal display (LCD) panel, and its own light transmittance of the OLED display panel may be desirable. It is possible to hide the camera below the panel. By placing photosensitive elements including a camera, a light sensor, a fingerprint sensor and/or the like under the CUP region corresponding to the OLED display panel, the CUP region may display pictures normally when the photosensitive elements are not used; and the light from the outside may enter the camera through the CUP region to facilitate image forming when the photosensitive elements are needed, for example, when the camera is needed to capture pictures.

However, in the existing OLED display apparatus based on the camera under panel technology, disposing multiple pixels in the CUP region may result in a low transmittance in the CUP region, which may not reach the light transmittance level required by the camera and make the photosensitive effect relatively low.

Therefore, there is a need to provide a display panel and a display apparatus that can improve the light transmittance of the panel, so that the photosensitive elements in the panel may have desirable light to improve optical effect.

SUMMARY

One aspect of the present disclosure provides a display panel. The display panel includes a first display region, where the first display region includes a plurality of light-transmitting regions and a plurality of pixel regions; and a transmittance of a light-transmitting region of the plurality of light-transmitting regions is greater than a transmittance of a pixel region of the plurality of pixel regions; and further includes a light-blocking layer. The light-blocking layer includes a first opening region and a second opening region; along a direction perpendicular to a plane of the display panel, the first opening region is overlapped with the light-transmitting region, and the second opening region is overlapped with the pixel region; and along a direction in parallel with the plane of the display panel, a minimum distance between the light-transmitting region and the pixel region is D1, and a minimum distance between two adjacent pixel regions is D2, where D1<D2.

Another aspect of the present disclosure provides a display apparatus including a display panel. The display panel includes a first display region, where the first display region includes a plurality of light-transmitting regions and a plurality of pixel regions; and a transmittance of a light-transmitting region of the plurality of light-transmitting regions is greater than a transmittance of a pixel region of the plurality of pixel regions; and further includes a light-blocking layer. The light-blocking layer includes a first opening region and a second opening region; along a direction perpendicular to a plane of the display panel, the first opening region is overlapped with the light-transmitting region, and the second opening region is overlapped with the pixel region; and along a direction in parallel with the plane of the display panel, a minimum distance between the light-transmitting region and the pixel region is D1, and a minimum distance between two adjacent pixel regions is D2, where D1<D2.

Other aspects of the present disclosure can be understood by those skilled in the art in light of the description, the claims, and the drawings of the present disclosure.

BRIEF DESCRIPTION OF THE DRAWINGS

The accompanying drawings, which are incorporated into a part of the specification, illustrate embodiments of the present disclosure and together with the description to explain the principles of the present disclosure.

DETAILED DESCRIPTION

Figure 1:
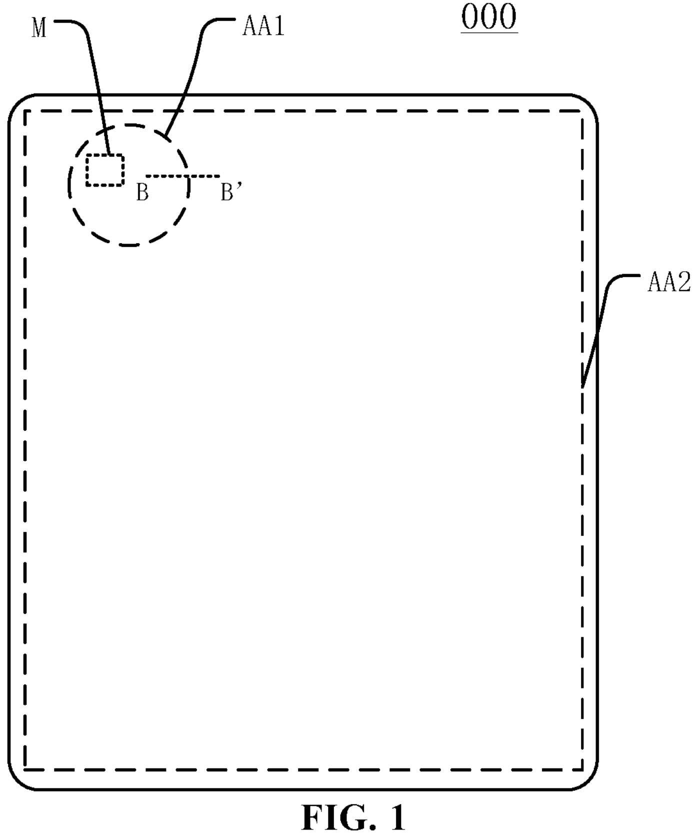
FIG. 1 illustrates a planar structural schematic of a display panel according to various embodiments of the present disclosure.

Various exemplary embodiments of the present disclosure are described in detail with reference to accompanying drawings. It should be noted that unless specifically stated otherwise, relative arrangement of components and steps, numerical expressions and values described in those embodiments may not limit the scope of the present disclosure.

Following description of at least one exemplary embodiment may be merely illustrative and may not be configured to limit the present disclosure and its application or use.

The technologies, methods and apparatuses known to those skilled in the art may not be discussed in detail, but where appropriate, the technologies, methods and apparatuses should be regarded as a part of the present disclosure.

In all examples shown and discussed herein, any specific value should be interpreted as merely exemplary, rather than as a limitation. Therefore, other examples in exemplary embodiment may have different values.

It should be noted that similar reference numerals and letters are configured to indicate similar items in following drawings. Therefore, once an item is defined in one drawing, it does not need to be further discussed in subsequent drawings.

Figure 2:
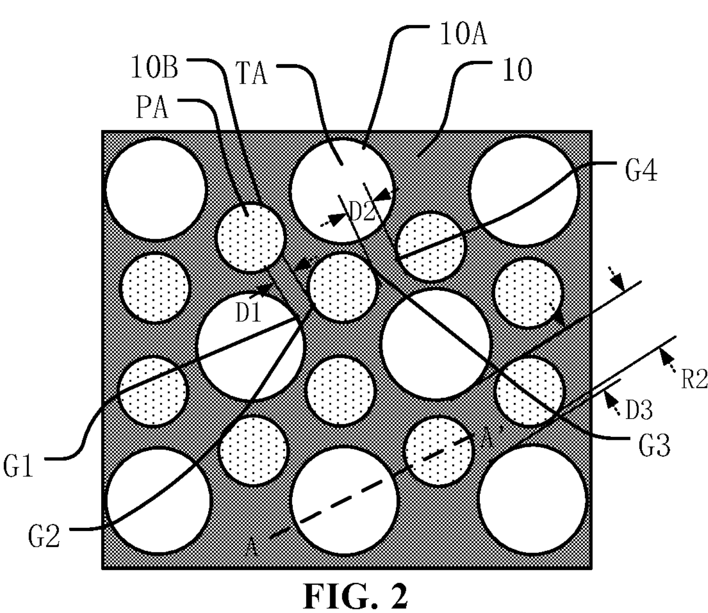
FIG. 2 illustrates a local enlarged schematic of an M region in FIG. 1.

FIG. 1 illustrates a planar structural schematic of a display panel according to various embodiments of the present disclosure. FIG. 2 illustrates a local enlarged schematic of an M region in FIG. 1. The display panel 000 provided by the present disclosure may include the first display region AA1. The first display region AA1 may include a plurality of light-transmitting regions TA (not filled in FIG. 2) and a plurality of pixel regions PA; and the transmittance of the light-transmitting region TA may be greater than transmittance of the pixel region PA.

The film layer structure of the display panel 000 may further include a light-blocking layer 10. It can be understood that the display panel 000 may also include other film layer structures for realizing the display function, which may not be limited in the present disclosure. The light-blocking layer 10 may include the first opening region 10A and the second opening region 10B. Along the direction Z perpendicular to the plane of the display panel, the first opening region 10A may be overlapped with the light-transmitting region TA, and the second opening region 10B may be overlapped with the pixel region PA.

Along the direction in parallel with the plane of the display panel, the minimum distance between the light-transmitting region TA and the pixel region PA is D1, and the minimum distance between two adjacent pixel regions PA is D2, where D1<D2.

For example, the display panel 000 provided by the present disclosure may include at least the first display region AA1. In some embodiments of the present disclosure, the first display region AA1 may also be used as a configuration region corresponding to a photosensitive element. The first display region AA1 needs to have a high transmittance when being used as the configuration region of the photosensitive element. Therefore, the first display region AA1 of the present disclosure may include the plurality of light-transmitting regions TA and the plurality of pixel regions PA. The pixel region PA may be configured to configure sub-pixels for display. The light-transmitting region TA may not be disposed with sub-pixels for display, and may be only configured to pass external light, so that the transmittance of the light-transmitting region TA may be greater than the transmittance of the pixel region PA. When the photosensitive element is not used, the plurality of pixel regions PA in the first display region AA1 may display pictures normally. When the photosensitive element needs to be used, the plurality of light-transmitting regions TA in the first display region AA1 may make external light enter the photosensitive element in such region to realize the photosensitive function.

It can be understood that the first display region AA1 in the present disclosure is used as the configuration region corresponding to the photosensitive element and may be configured to configure photosensitive elements such as a camera, a light sensor, a fingerprint sensor and the like. For example, the first display region AA1 may be used as the configuration region of the camera. When the camera is not used, the plurality of pixel regions PA in the first display region AA1 may display pictures normally. When the camera needs to be used, the plurality of light-transmitting regions TA in the first display region AA1 may make external light enter the camera in such region, so that the camera may capture enough light for image forming and realize the photosensitive function.

The display panel 000 of the present disclosure may include the light-blocking layer 10; and the light-blocking layer 10 may include at least the first opening region 10A and the second opening region 10B within the range of the first display region AA1. The first opening region 10A may correspond to the position of the light-transmitting region TA, that is, along the direction Z perpendicular to the plane of the display panel, the first opening region 10A may be overlapped with the light-transmitting region TA. In some embodiments of the present disclosure, along the direction Z perpendicular to the plane of the display panel, the first opening region 10A may coincide with the light-transmitting region TA. That is, the range of the first opening region 10A of the light-blocking layer 10 may be the range of the light-transmitting region TA in the first display region AA1. The second opening region 10B may correspond to the position of the pixel region PA, that is, along the direction Z perpendicular to the plane of the display panel, the second opening region 10B may be overlapped with the pixel region PA. In some embodiments of the present disclosure, along the direction Z perpendicular to the plane of the display panel, the second opening region 10B may coincide with the pixel region PA. That is, the range of the second opening region 10B of the light-blocking layer 10 may be the range of the pixel region PA in the first display region AA1.

In some embodiments of the present disclosure, the parts other than the first opening region 10A and the second opening region 10B of the light-blocking layer 10 of the present disclosure may be a light-blocking structure. The light-blocking structure may block light. The hollow holes on the light-blocking structure can be understood as the first opening region 10A and the second opening region 10B. The light-blocking structure may respectively define locations of the light-transmitting region TA and the pixel region PA in the first display region AA1.

Figure 3:
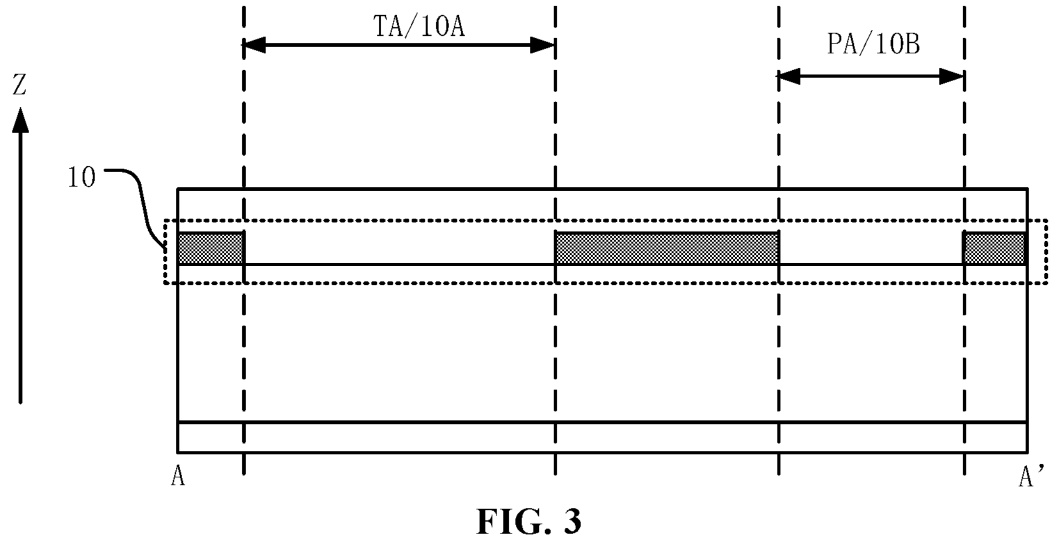
FIG. 3 illustrates a cross-sectional structural view along a line A-A' in FIG. 2.

In some embodiments of the present disclosure, referring to FIGS. 2-3, FIG. 3 illustrates a cross-sectional structural view along a line A-A' in FIG. 2. The light-blocking layer 10 in the present disclosure may be a one-layer light-blocking structure, and the boundary of the first opening region 10A of the light-blocking layer 10 of the one-layer (i.e., single layer) light-blocking structure can be understood as the boundary of the light-transmitting region TA.

It can be understood that the light-blocking layer 10 in the present disclosure may be a light-blocking structure with two or more layers. For example, the light-blocking layer 10 may include the first light-blocking layer and the second light-blocking layer; and the first light-blocking layer and the second light-blocking layer may each include the first opening region 10A and the second opening region 10B, respectively. Therefore, the boundary of the first opening region 10A of the first light-blocking layer can be understood as the boundary of the light-transmitting region TA, and the boundary of the second opening region 10B of the first light-blocking layer can be understood as the boundary of the pixel region PA. Or the boundary of the first opening region 10A of the second light-blocking layer can also be understood as the boundary of the light-transmitting region TA, and the boundary of the second opening region of the second light-blocking layer can be understood as the boundary of the pixel region PA, which may not be limited in present disclosure.

Figure 4:
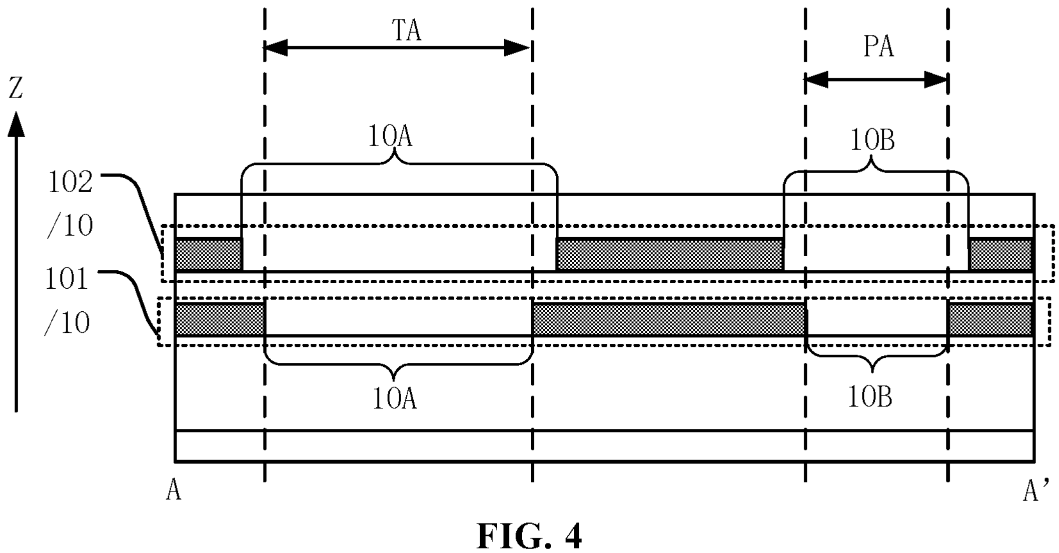
FIG. 4 illustrates another cross-sectional structural view along a line A-A' in FIG. 2.

In some embodiments of the present disclosure, referring to FIGS. 2 and 4, FIG. 4 illustrates another cross-sectional structural view along a line A-A' in FIG. 2. The light-blocking layer 10 may be a light-blocking structure with two or more layers. As shown in FIG. 4, the light-blocking layer 10 may include the first light-blocking layer 101 and the second light-blocking layer 102; and both the first light-blocking layer 101 and the second light-blocking layer 102 may include the first opening region 10A and the second opening region 10B, respectively. When the first opening region 10A of the first light-blocking layer 101 and the first opening region 10A of the second light-blocking layer 102 are overlapped with each other along the direction Z perpendicular to the plane of the display panel, and when the first opening region of the first light-blocking layer 101 is within the range of the first opening region 10A of the second light-blocking layer 102, relatively small boundary of the first opening region 10A of the first light-blocking layer 101 can be understood as the boundary of the light-transmitting region TA. When the second opening region 10B of the first light-blocking layer 101 and the second opening region 10B of the second light-blocking layer 102 are overlapped with each other along the direction Z perpendicular to the plane of the display panel, and when the second opening region 10B of the first light-blocking layer 101 is within the range of the second opening region of the second light-blocking layer 102, relatively small boundary of the second opening region 10B of the first light-blocking layer 101 can be understood as the boundary of the pixel region PA.

Figure 5:
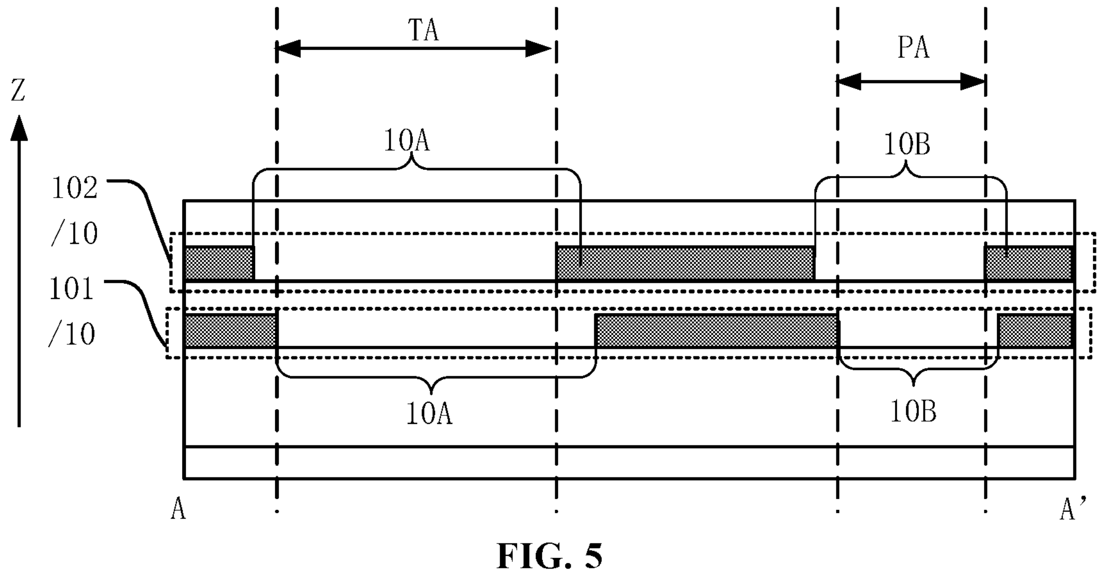
FIG. 5 illustrates another cross-sectional structural view along a line A-A' in FIG. 2.

Furthermore, In some embodiments of the present disclosure, referring to FIGS. 2 and 5, FIG. 5 illustrates another cross-sectional structural view along a line A-A' in FIG. 2. The light-blocking layer 10 may be a light-blocking structure with two or more layers. As shown in FIG. 5, the light-blocking layer 10 may include the first light-blocking layer 101 and the second light-blocking layer 102; and both the first light-blocking layer 101 and the second light-blocking layer 102 may each include the first opening region 10A and the second opening region 10B, respectively. When the first opening region 10A of the first light-blocking layer 101 and the first opening region 10A of the second light-blocking layer 102 are overlapped with each other along the direction Z perpendicular to the plane of the display panel, and when the first opening region 10A of the first light-blocking layer 101 and the first opening region 10A of the second light-blocking layer 102 are staggered from each other, the boundary of the smaller opening formed by the first opening region 10A of the first light-blocking layer 101 and the first opening region 10A of the second light-blocking layer 102 can be understood as the boundary of the light-transmitting region TA. When the second opening region 10B of the first light-blocking layer 101 and the second opening region 10B of the second light-blocking layer 102 are overlapped with each other along the direction Z perpendicular to the plane of the display panel, and when the second opening region 10B of the first light-blocking layer 101 and the second opening region 10B of the second light-blocking layer 102 are staggered from each other, the boundary of the smaller opening formed by the second opening region 10B of the first light-blocking layer 101 and the second opening region 10B of the second light-blocking layer 102 can be understood as the boundary of the pixel region PA.

In the present disclosure, it configures that the minimum distance between the light-transmitting region TA and the pixel region PA along the direction in parallel with the plane of the display panel is D1, that is, there is no other light-transmitting region TA or pixel region PA between one light-transmitting region TA and one pixel region PA adjacent to the one light-transmitting region TA. Therefore, the distance between the edge (can also be a point, such as the point G1 in FIG. 2) of the light-transmitting region TA that is closest to the side of the pixel region PA to the edge (can also be a point, such as the point G2 in FIG. 2) of the pixel region PA that is closest to the side of the light-transmitting region TA can be understood as the minimum distance between the light-transmitting region TA and the pixel region PA. It also configures that the minimum distance between two adjacent pixel regions PA is D2, that is, there is no other pixel region PA between two adjacent pixel regions PA. Therefore, in two adjacent pixel regions PA, the distance between the edge (can also be a point, such as the point G3 in FIG. 2) of one pixel region PA that is closest to the side of another pixel region PA and the edge (can also be a point, such as the point G4 in FIG. 2) of the side of the other pixel region PA that is closest to one pixel region PA can be understood as the minimum distance between two adjacent pixel regions PA.

In the present disclosure, along the direction in parallel with the plane of the display panel, the minimum distance D1 between the light-transmitting region TA and the pixel region PA may be less than the minimum distance D2 between two adjacent pixel regions PA, such that the arrangement positions of the pixel regions PA in the first display region AA1 may be configured according to the arrangement structure of the light-transmitting regions TA. That is, on the basis of satisfying the maximum transmittance of the first display region AA1, after arranging the plurality of light-transmitting regions TA in the first display region AA1, each pixel region PA may be arranged between adjacent light-transmitting regions TA, and the arrangement positions of the pixel regions PA may be reasonably arranged according to the space between the light-transmitting regions TA. Therefore, the minimum distance D1 between the light-transmitting region TA and the pixel region PA may be less than the minimum distance D2 between two adjacent pixel regions PA. The space between the light-transmitting regions TA may be fully utilized to arrange the pixel regions PA, so that the minimum distance D1 between the pixel region PA and its adjacent light-transmitting region TA may be minimized as possible, thereby maximizing the space utilization rate between adjacent light-transmitting regions TA. In the present disclosure, the light transmittance of the first display region AA1 may be maximized while ensuring the light-transmitting region TA with a sufficient region size. In addition, by reasonably arranging the position of the pixel region PA, the pixel region PA may not only be located in the space between the light-transmitting regions TA, and the minimum distance D1 between the pixel region PA and its adjacent light-transmitting region TA may reach the minimum value as possible, which may be less than the minimum distance D2 between two adjacent pixel regions PA. In such way, the maximum space utilization rate of the first display region AA1 may be achieved, which may provide favorable conditions for improving the PPI (i.e., pixels per inch, which refers to the number of pixels per inch) in the first display region AA1; and furthermore, the display quality of the first display region AA1 may be ensured as possible while ensuring the light transmittance to achieve a higher photosensitive effect.

It should be noted that the light-blocking layer 10 of the present disclosure can reuse an original film layer with light-blocking function in the organic light-emitting diode display panel; and the light-blocking layer 10 for blocking light can also be added in the organic light-emitting diode display panel, which may not be limited in the present disclosure and may only need to satisfy that the minimum distance D1 between the light-transmitting region TA defined by the light-blocking layer 10 and the pixel region PA is less than the minimum distance D2 between two adjacent pixel regions PA.

It can be understood that, in FIG. 1 of the present disclosure, the first display region AA1 may be circular only as an example for illustration. In an implementation, the shape of the first display region AA1 may include, but may not be limited to, the circular shape, and may also be other suitable shapes.

In some embodiments of the present disclosure, in the present disclosure, the shape of the orthographic projection of the light-transmitting region TA on the plane of the display panel may include a circle, and the shape of the orthographic projection of the pixel region PA on the plane of the display panel may include a circle, which may only be an example for illustration. During an implementation, the shapes of the light-transmitting region TA and the pixel region PA in the first display region AA1 may also be other shapes. For example, the shape of the orthographic projection of the light-transmitting region TA on the plane of the display panel can also be an ellipse. For example, the shape of the orthographic projection of the pixel region PA on the plane of the display panel can also be an ellipse or a chamfered rectangle. Therefore, the shapes of the light-transmitting region TA and the pixel region PA may be avoided as possible with right-angled edges, and the shapes of the light-transmitting region TA and the pixel region PA in the first display region AA1 may tend to be circles as possible. In such way, the diffraction energy may be distributed as evenly as possible in all directions; furthermore, the diffraction energy in a single direction may be reduced, which may effectively improve the diffraction problem and further improve the optical effect of the camera under panel.

It can be understood that the plurality of pixel regions PA in the drawings of the present disclosure may include the plurality of pixel regions of different colors; and the region sizes of the plurality of pixel regions PA of different colors may be same or different, which may not be limited in the present disclosure. FIG. 2 of the present disclosure may only take that the regions of the plurality of pixel regions PA are same as an example for illustration. During an implementation, configuration may be selected according to actual needs.

It can be understood that the drawings in the present disclosure may be only examples to illustrate the structures included in the display panel 000. In an implementation, the structure of the display panel 000 may include, but may not be limited to, such structure and may also include other structures capable of realizing the display function and the light-sensing function, which may not be described in detail in the present disclosure and may be understood with reference to the structure of the organic light-emitting diode display panel in the existing technology.

In some embodiments of the present disclosure, referring to FIGS. 1-5, in the present disclosure, the area of the orthographic projection of the light-transmitting region TA on the plane of the display panel is S1; and the area of the orthographic projection of the pixel region PA on the plane of the display panel is S2, where S1>S2.

In the present disclosure, it describes that in the first display region AA1 of the display panel 000, the area S1 of the orthographic projection of the light-transmitting region TA on the plane of the display panel may be larger than the area S2 of the orthographic projection of the pixel region PA on the plane of the display panel. That is, the area S1 of the orthographic projection of the light-transmitting region TA on the plane of the display panel may be greater than the area S2 of the orthographic projection of the pixel region PA on the plane of the display panel. The proportion of entire light-transmitting region TA in the first display region AA1 may be increased as possible, thereby being beneficial for improving the transmittance of the first display region AA1 as possible, increasing the light transmittance of the first display region AA1, and improving the optical effect of the camera under panel when the first display region AA1 is disposed with a camera and other photosensitive elements.

In some embodiments of the present disclosure, as shown in FIG. 2, the range of the minimum distance D1 between the light-transmitting region TA and the pixel region PA in the present disclosure may be 0-5 μm; and the range of the minimum distance D2 between two adjacent pixel regions PA may be greater than or equal to 10 μm. Therefore, it may satisfy that the minimum distance D1 between the light-transmitting region TA and the pixel region PA may be less than the minimum distance D2 between two adjacent pixel regions PA; and the light-blocking part of the light-blocking layer 10 may ensure a desirable light-blocking effect between the light-transmitting region TA and the pixel region PA and between two adjacent pixel regions PA.

In some embodiments of the present disclosure, as shown in FIG. 2, the minimum distance between two adjacent light-transmitting regions TA in the present disclosure is D3, the maximum outer diameter of the pixel region PA is R2, and D3 is greater than or equal to R2. Therefore, at least one pixel region PA may be arranged between two adjacent light-transmitting regions TA to maximize apace utilization between the light-transmitting regions TA.

Figure 6:
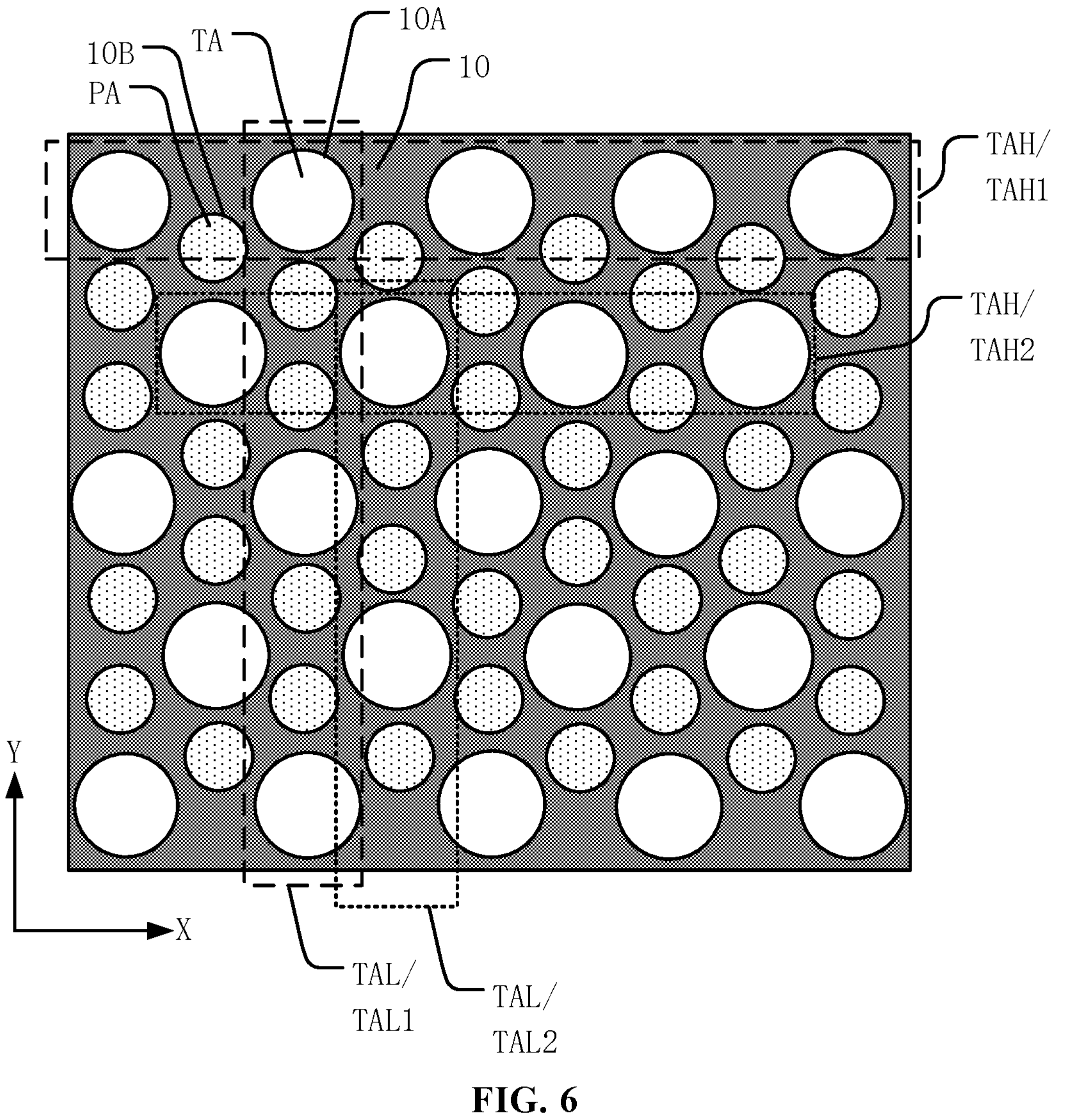
FIG. 6 illustrates another local enlarged schematic of an M region in FIG. 1.

In some embodiments of the present disclosure, referring to FIGS. 1 and 6, FIG. 6 illustrates another local enlarged schematic of the M region in FIG. 1. In the present disclosure, a first multiple light-transmitting regions TA may be arranged along the first direction X to form a light-transmitting row TAH, and a plurality of light-transmitting rows TAH may be arranged along the second direction Y.

A second multiple light-transmitting regions TA may be arranged along the second direction Y to form a light-transmitting column TAL, and a plurality of light-transmitting columns TAL may be arranged along the first direction X. Along the direction in parallel with the plane of the display panel 000, the first direction X may intersect the second direction Y.

The plurality of light-transmitting rows TAH may at least include the m-th light-transmitting row TAH1 and the (m+1)-th light-transmitting row TAH2. Along the first direction X, the light-transmitting region TA in the m-th light-transmitting row TAH1 may be between two adjacent light-transmitting regions TA in the (m+1)-th light-transmitting row TAH2.

The plurality of light-transmitting columns TAL may at least include the n-th light-transmitting column TAL1 and the (n+1)-th light-transmitting column TAL2. Along the second direction Y, the light-transmitting region TA in the n-th light-transmitting column TAL1 may be between two adjacent light-transmitting regions TA in the (n+1)-th light-transmitting column TAL2, where m and n are both positive integers.

In the present disclosure, it describes staggered arrangement manner of the plurality of light-transmitting regions TA in the first display region AA1 of the display panel 000. For example, the first multiple light-transmitting regions TA may be arranged along the first direction X to form a light-transmitting row TAH; the plurality of light-transmitting rows TAH may be arranged along the second direction Y; the second multiple light-transmitting regions TA may be arranged along the second direction Y to form a light-transmitting column TAL; and the plurality of light-transmitting columns TAL may be arranged along the first direction X. The first direction X can be understood as the horizontal direction in FIG. 6 that is in parallel with the direction of the plane of the display panel 000, so that the second direction Y can be understood as the vertical direction in FIG. 6 that is in parallel with the direction of the plane of the display panel 000. In some other optional embodiments, the first direction X can be understood as the vertical direction in FIG. 6 that is in parallel with the direction of the plane of the display panel 000, so that the second direction Y can be understood as the horizontal direction in FIG. 6 (not shown in the drawings) that is in parallel with the direction of the plane of the display panel 000. It can be understood that, in the present disclosure, the first direction X and the second direction Y are perpendicular to each other along the direction in parallel with the plane of the display panel 000, which may be taken as an example for illustration.

In the present disclosure, the plurality of light-transmitting rows TAH may be configured to include at least the m-th light-transmitting row TAH1 and the (m+1)-th light-transmitting row TAH2. That is, the m-th light-transmitting row TAH1 and the (m+1)-th light-transmitting row TAH2 may be two adjacent light-transmitting rows TAH. Along the first direction X, the light-transmitting region TA in the m-th light-transmitting row TAH1 may be between two adjacent light-transmitting regions TA in the (m+1)-th light-transmitting row TAH2. The plurality of light-transmitting columns TAL may at least include the n-th light-transmitting column TAL1 and the (n+1)-th light-transmitting column TAL2. That is, the n-th light-transmitting column TAL1 and the (n+1)-th light-transmitting column TAL2 may be two adjacent light-transmitting columns TAL. Along the second direction Y, the light-transmitting region TA in the n-th light-transmitting column TAL1 may be between two adjacent light-transmitting regions TA in the (n+1)-th light-transmitting column TAL2. Therefore, the light-transmitting regions TA in the first display region AA1 may be staggered with each other in both the first direction X and the second direction Y. In such way, it may avoid that the light-transmitting regions TA of adjacent light-transmitting rows TAH may be aggregated in a same light-transmitting column TAL, and also avoid that the light-transmitting regions TA of adjacent light-transmitting columns TAL may be aggregated in a same light-transmitting row TAH which may result in the plurality of pixel regions PA to be excessively aggregated and the graininess problem in pictures when the first display region AA1 is used for displaying. Therefore, the plurality of light-transmitting regions TA may be staggered along the first direction X and the second direction Y, which may avoid the picture graininess caused by the aggregation of pixels, thereby being beneficial for ensuring the transmittance of the first display region AA1 and improving the display quality of the first display region AA1 when the first display region AA1 is used for displaying.

Figure 7:
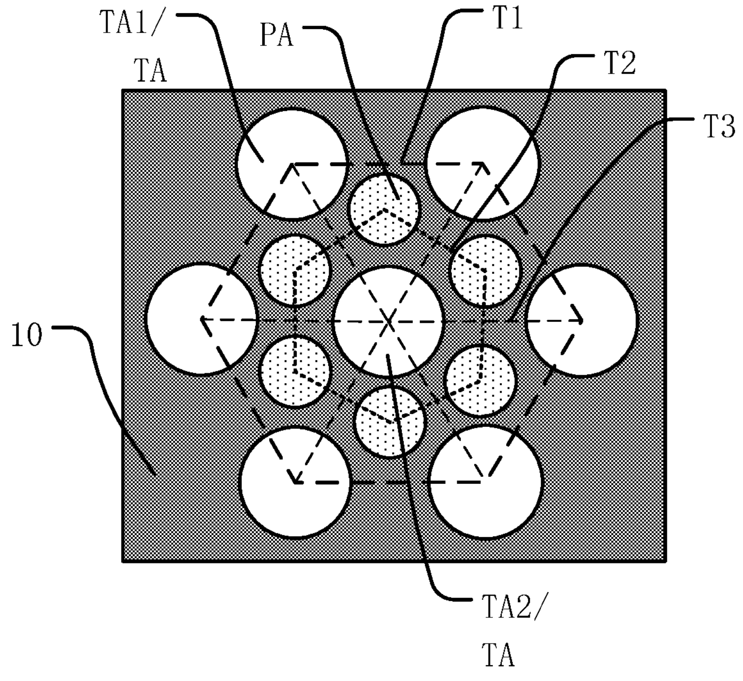
FIG. 7 illustrates a local enlarged schematic of a part of light-transmitting regions and a part of pixel regions in FIG. 6.

In some embodiments of the present disclosure, referring to FIGS. 1, 6 and 7, FIG. 7 illustrates a local enlarged schematic of a part of light-transmitting regions and a part of pixel regions in FIG. 6. In the present disclosure, the light-transmitting regions TA may include a plurality of first-light-transmitting regions TA1; the geometric center point of each of six first-light-transmitting regions TA1 may be a vertex of the first hexagon T1; and the geometric center point of each of six pixel regions PA may be a vertex of the second hexagon T2.

One vertex of the second hexagon T2 may be configured corresponding to one side of the first hexagon T1.

In the present disclosure, it describes that the light-transmitting region TA may include the first-light-transmitting region TA1; and in the arrangement structure of the first display region AA1 of the display panel 000, six first-light-transmitting regions TA1 may be connected to form a structure of the first hexagon T1. In some embodiments of the present disclosure, each first light-transmitting region TA1 may include a geometric center point; and the geometric center points of the six first-light-transmitting regions TA1 may be the six vertices of the first hexagon T1 formed by connecting the geometric center points of the six first-light-transmitting regions TA1. It can be understood that the geometric center point of the first-light-transmitting region TA1 in the present disclosure can be understood as the geometric center point of the orthographic projection of the first-light-transmitting region TA1 on the plane of the display panel. For example, when the orthographic projection of the first-light-transmitting region TA1 on the plane of the display panel is a circle, the geometric center point of the first-light-transmitting region TA1 can be understood as the center of the circle. When the orthographic projection of the first-light-transmitting region TA1 on the plane of the display panel is a chamfered rectangle, the geometric center point of the first-light-transmitting region TA1 can be understood as the intersection of the diagonal lines of the chamfered rectangle, or the first-light-transmitting region TA1 may also include other shapes. In FIG. 7 of the present disclosure, only the first hexagon T1 is a regular hexagon as an example for illustration. During an implementation, the shape of the first hexagon T1 may also be a non-hexagon, which may not be limited in the present disclosure.

In the arrangement structure of the first display region AA1 of the display panel 000 of the present disclosure, six pixel regions PA may be connected to form a structure of the second hexagon T2. In some embodiments of the present disclosure, each pixel region PA may include a geometric center point; and the geometric center points of the six pixel regions PA may be the six vertices of the second hexagon T2 formed by connecting the geometric center points of the six pixel regions PA. It can be understood that the geometric center point of the pixel region PA of the present disclosure can be understood as the geometric center point of the orthographic projection of the pixel region PA on the plane of the display panel. For example, when the orthographic projection of the pixel region PA on the plane of the display panel is a circle, the geometric center point of the pixel region PA can be understood as the center of the circle. When the orthographic projection of the pixel region PA on the plane of the display panel is a chamfered rectangle, the geometric center point of the pixel region PA can be understood as the intersection of each diagonal line of the chamfered rectangle, or the pixel region PA may also include other shapes. In FIG. 7 of the present disclosure, only the second hexagon T2 is a regular hexagon as an example for illustration. During an implementation, the shape of the second hexagon T2 may also be a non-hexagon, which may not be limited in the present disclosure.

In the arrangement structure of the light-transmitting regions TA and the pixel regions PA in the first display region AA1 of the present disclosure, one vertex of the second hexagon T2 (which is formed by connecting center points of the six pixel regions PA) may be configured corresponding to one side of the first hexagon T1 (which is formed by connecting center points of the six first-light-transmitting regions TA1). That is, one vertex of the second hexagon T2 may be at the position of one side of the first hexagon T1, and one vertex of the first hexagon T1 may be at the position of one side of the second hexagon T2. Therefore, the pixel regions PA may be arranged in the space between the light-transmitting regions TA as possible to avoid the case that one vertex of the second hexagon T2 is at the position of one vertex of the first hexagon T1. That is, it may avoid wasting the space between two adjacent light-transmitting regions TA of the first hexagon T1. After arranging the plurality of light-transmitting regions TA in the first display region AA1, each pixel region PA may be arranged between adjacent light-transmitting regions TA as possible, so that the arrangement positions of the pixel regions PA may be reasonably arranged according to the space between the light-transmitting regions TA. That is, the space between the light-transmitting regions TA may be fully utilized to arrange the pixel regions PA to maximize the space utilization between adjacent light-transmitting regions TA and ensure sufficient light transmittance; and the positions of the pixel regions PA may be reasonably arranged, which may be beneficial for improving the pixel arrangement density in the first display region AA1.

In some embodiments of the present disclosure, referring to FIGS. 1, 6 and 7, the plurality of light-transmitting regions TA may include the second-light-transmitting regions TA2; and the second-light-transmitting region TA2 may be in the first hexagon.

The connection lines between the geometric center point of the second-light-transmitting region TA2 and adjacent two vertices of the first hexagon T1 may form a triangle T3.

One pixel region PA may be configured within the range of one triangle T3.

In the present disclosure, it describes that in the arrangement structure of the light-transmitting regions TA and the pixel regions PA in the first display region AA1, when one vertex of the second hexagon T2 (which is formed by connecting the center points of the six pixel regions PA) may be configured correspondingly to one side of the first hexagon T1 (which is formed by connecting the center points of the six first-light-transmitting regions TA1), the first hexagon T1 (which is formed by connecting the center points of the six first-light-transmitting regions TA1) may also include a light-transmitting region TA. Such second-light-transmitting region TA2 configured in the first hexagon T1 may be in the middle of the first hexagon T1. In some embodiments of the present disclosure, the second light-transmitting region TA2 may be at the geometric center of the first hexagon T1, so that the distribution of the plurality of light-transmitting regions TA in the first display region AA1 may be as even-distributed as possible. In the six pixel regions PA forming the second hexagon T2 of the present disclosure, each pixel region PA may be at the triangle T3 which is formed by connecting the geometric center point of the second-light-transmitting region TA2 and adjacent two vertices of the first hexagon T1. In such way, each pixel region PA forming the second hexagon T2 may be between two adjacent first-light-transmitting regions TA1 forming the first hexagon T1 as possible. Furthermore, while ensuring a sufficient light-transmitting area of the light-transmitting regions TA, the space between the light-transmitting regions TA may be fully utilized to arrange the pixel regions PA to maximize the space utilization rate between adjacent light-transmitting regions TA.

It can be understood that, in FIG. 7 of the present disclosure, the triangle T3 is an equilateral triangle only as an example for illustration. During an implementation, the shape of the triangle T3 may also be a non-equilateral triangle, for example, the triangle T3 may be an isosceles triangle or other triangles, which may only need to satisfy that in the six pixel regions PA forming the second hexagon T2, each pixel region PA may be in one triangle T3 formed by connecting the geometric center point of the secondlight-transmitting region TA2 and adjacent two vertices of the first hexagon T1, which may not be limited in the present disclosure herein.

Figure 8:
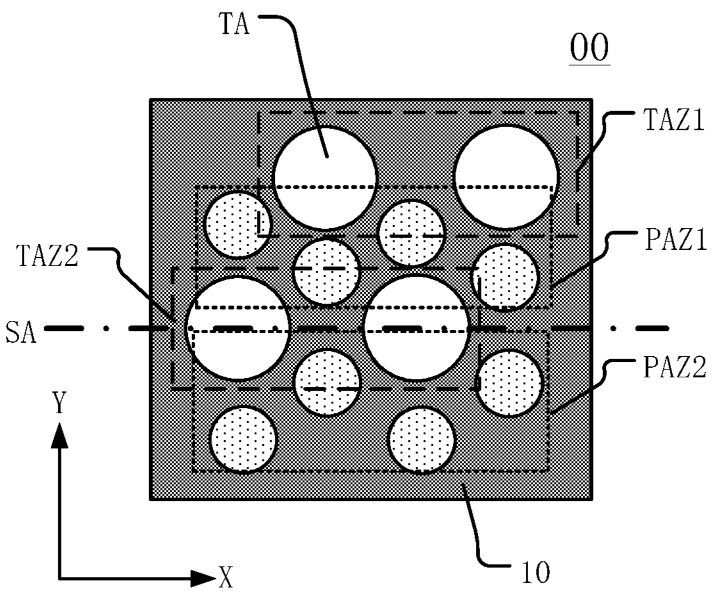
FIG. 8 illustrates a local enlarged schematic of one repeating unit of a first display region in FIG. 6.
Figure 9:
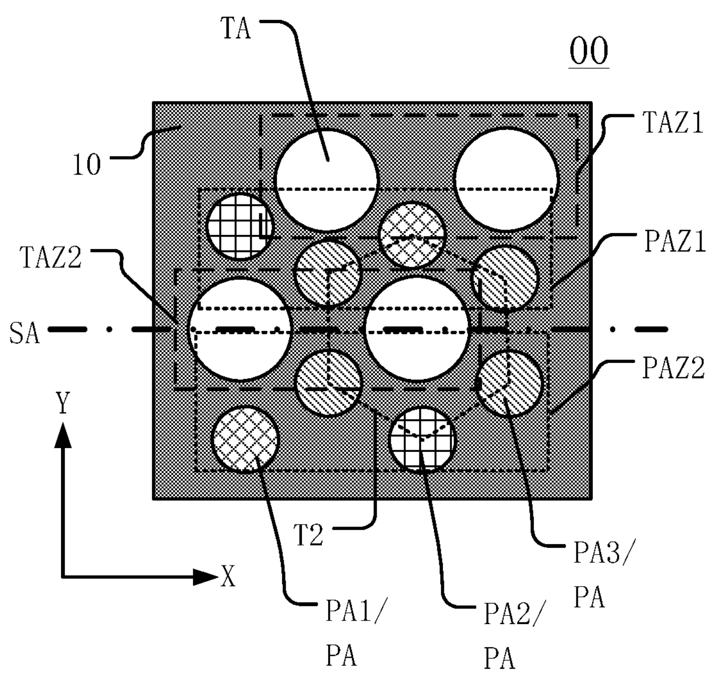
FIG. 9 illustrates another local enlarged schematic of one repeating unit of a first display region in FIG. 6.

In some embodiments of the present disclosure, referring to FIGS. 1, 6, 7, 8 and 9, FIG. 8 illustrates a local enlarged schematic of one repeating unit of a first display region in FIG. 6; and FIG. 9 illustrates another local enlarged schematic of one repeating unit of the first display region in FIG. 6. In the present disclosure, the first display region AA1 may include a plurality of repeating units 00; the repeating unit 00 may include four light-transmitting regions TA and eight pixel regions PA; and in one repeating unit 00, the eight pixel regions PA may include two first-color pixel regions PA1, two second-color pixel regions PA2, and four third-color pixel regions PA3.

In one repeating unit 00, two light-transmitting regions TA may be arranged along the first direction X to form the first light-transmitting group TAZ1, the other two light-transmitting regions TA may be arranged along the first direction X to form the second light-transmitting group TAZ2, and the first light-transmitting group TAZ1 and the second light-transmitting group TAZ2 may be arranged along the second direction Y; and the four pixel regions PA may be arranged along the first direction X to form the first pixel group PAZ1, the other four pixel regions PA may be arranged along the first direction X to form the second pixel group PAZ2, and the first pixel group PAZ1 and the second pixel group PAZ2 may be arranged along the second direction Y.

The first pixel group PAZ1 may be between the first light-transmitting group TAZ1 and the second light-transmitting group TAZ2; and the second pixel group PAZ2 may be on the side of the second light-transmitting group TAZ2 away from the first light-transmitting group TAZ1.

The line connecting the geometric centers of the light-transmitting regions TA in the second-light-transmitting group TAZ2 may be the symmetry axis SA; and the first pixel group PAZ1 and the second pixel group PAZ2 may be symmetrically arranged along the symmetry axis SA.

In the present disclosure, it describe that the arrangement of the pixel regions PA and the light-transmitting regions TA of the first display region AA1 may be formed by the plurality of repeating units 00 arranged in sequence along the first direction X or along the second direction Y. For example, the first display region AA1 may include the plurality of repeating units 00, a plurality of repeating units 00 may be sequentially arranged along the first direction X, and a plurality of repeating units 00 may be sequentially arranged along the second direction Y. The first direction X can be understood as the horizontal direction in FIG. 8, and the second direction Y can be understood as the vertical direction in FIG. 8 (as shown in FIG. 8); or the first direction X can also be understood as the vertical direction in FIG. 8 and the second direction Y can be understood as the horizontal direction in FIG. 8 (not shown in FIG. 8), which may not be limited in the present disclosure. Each repeating unit 00 may include four light-transmitting regions TA and eight pixel regions PA. As shown in FIG. 9, the eight pixel regions PA in one repeating unit 00 may include two first-color pixel regions PA1, two second-color pixel regions PA2, and four third-color pixel regions PA3 (in FIG. 9, different fill patterns are used to distinguish pixel regions of different colors). In some embodiments of the present disclosure, the first-color pixel region PA1 may be a blue pixel region for configuring blue sub-pixels, the second-color pixel region PA2 may be a red pixel region for configuring red sub-pixels, and the third-color pixel region PA3 may be a green pixel region for configuring green sub-pixels, or the first-color pixel region PA1 may also be a pixel region of other colors, which may not be limited in the present disclosure.

In the four light-transmitting regions TA included in one repeating unit 00 of the present disclosure, two light-transmitting regions TA may be arranged along the first direction X to form the first-light-transmitting group TAZ1; the other two light-transmitting regions TA may be arranged along the first direction X to form the second-light-transmitting group TAZ2; and the first light-transmitting group TAZ1 and the second light-transmitting group TAZ2 which are formed may be arranged along the second direction Y. In some embodiments of the present disclosure, it can be understood that one light-transmitting region TA of the first-light-transmitting group TAZ1 may be between two light-transmitting regions TA of the second-light-transmitting group TAZ2. That is, the light-transmitting regions TA in the repeating unit 00 may be staggered with each other.

In the eight pixel regions PA included in one repeating unit 00 of the present disclosure, four pixel regions PA may be arranged along the first direction X to form the first pixel group PAZ1; the other four pixel regions PA may be arranged along the first direction X to form the second pixel group PAZ2; and the formed first pixel group PAZ1 and the second pixel group PAZ2 may be arranged along the second direction Y.

In the present disclosure, the first pixel group PAZ1 may be between the first light-transmitting group TAZ1 and the second light-transmitting group TAZ2, and the second pixel group PAZ2 may be on the side of the second light-transmitting group TAZ2 away from the first light-transmitting group TAZ1. That is, the light-transmitting groups and the pixel groups may be alternately arranged along the second direction Y; and taking the line connecting the geometric center lines of the light-transmitting regions TA in the second-light-transmitting group TAZ2 as the symmetry axis SA, the first pixel group PAZ1 and the second pixel group PAZ2 may be symmetrically arranged along the symmetry axis SA, and the four pixel regions PA of the first pixel group PAZ1 and the four pixel regions PA of the second pixel group PAZ2 may be symmetrically arranged along the symmetry axis SA. Therefore, in the eight pixel regions PA included in one repeating unit 00, six pixel regions PA may be arranged by surrounding one light-transmitting region TA to form the second hexagon T2. Furthermore, while ensuring a sufficient light-transmitting area of the light-transmitting regions TA, the space between the light-transmitting regions TA may be fully utilized to arrange the pixel regions PA to maximize the space utilization rate between adjacent light-transmitting regions TA.

It can be understood that in the present disclosure, the line connecting the geometric centerlines of the light-transmitting regions TA in the second-light-transmitting group TAZ2 may be the symmetry axis SA, and the first pixel group PAZ1 and the second pixel group PAZ2 may be symmetrically arranged along the symmetry axis SA. It can be understood that along the symmetry axis SA, the positions of the four pixel regions PA of the first pixel group PAZ1 may have a one-to-one correspondence with the positions of the four pixel regions PA of the second pixel group PAZ2 along the second direction Y. Within the allowable range of process error, those regions may not be absolutely symmetrical, which may only need to satisfy the approximate position of two pixel regions PA on both sides of the symmetry axis SA.

Figure 10:
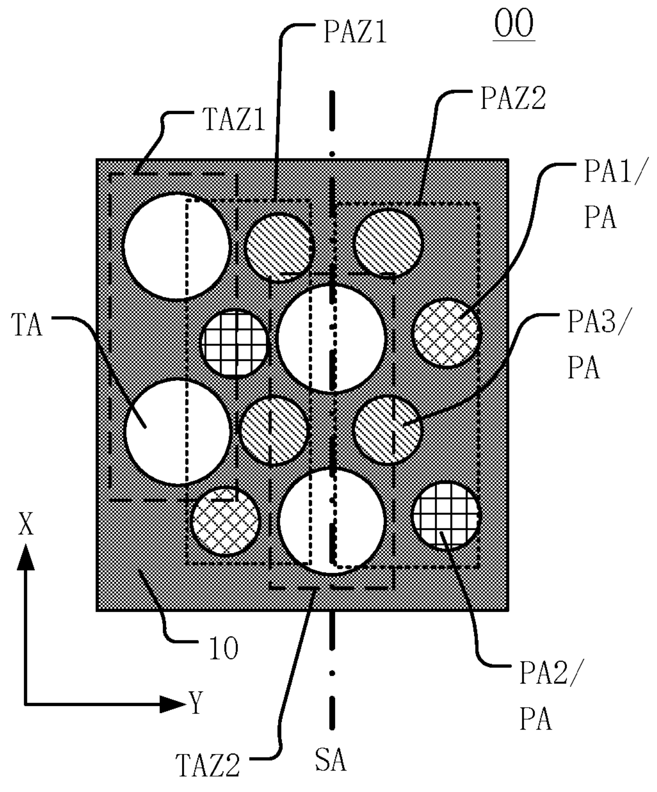
FIG. 10 illustrates another local enlarged schematic of one repeating unit of a first display region in FIG. 6.
Figure 11:
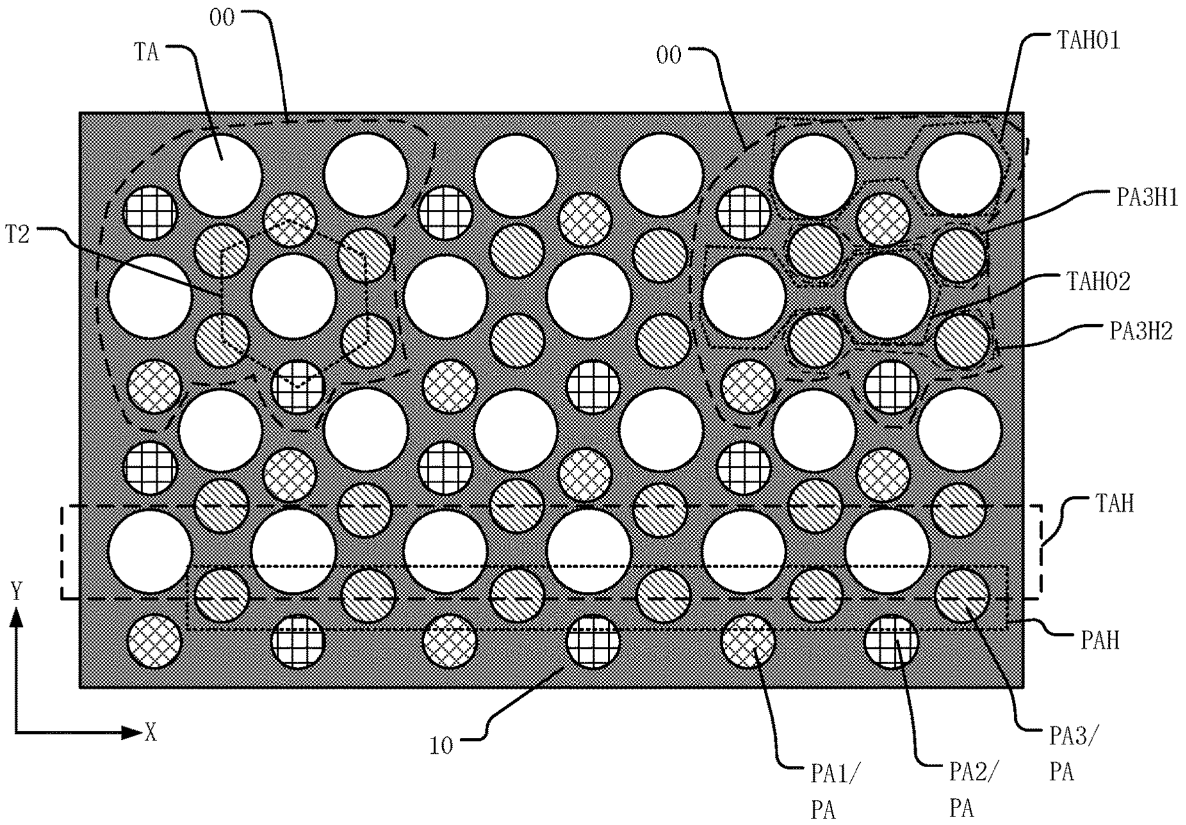
FIG. 11 illustrates an arrangement structural schematic of a plurality of repeating units in a first display region in FIG. 9.
Figure 12:
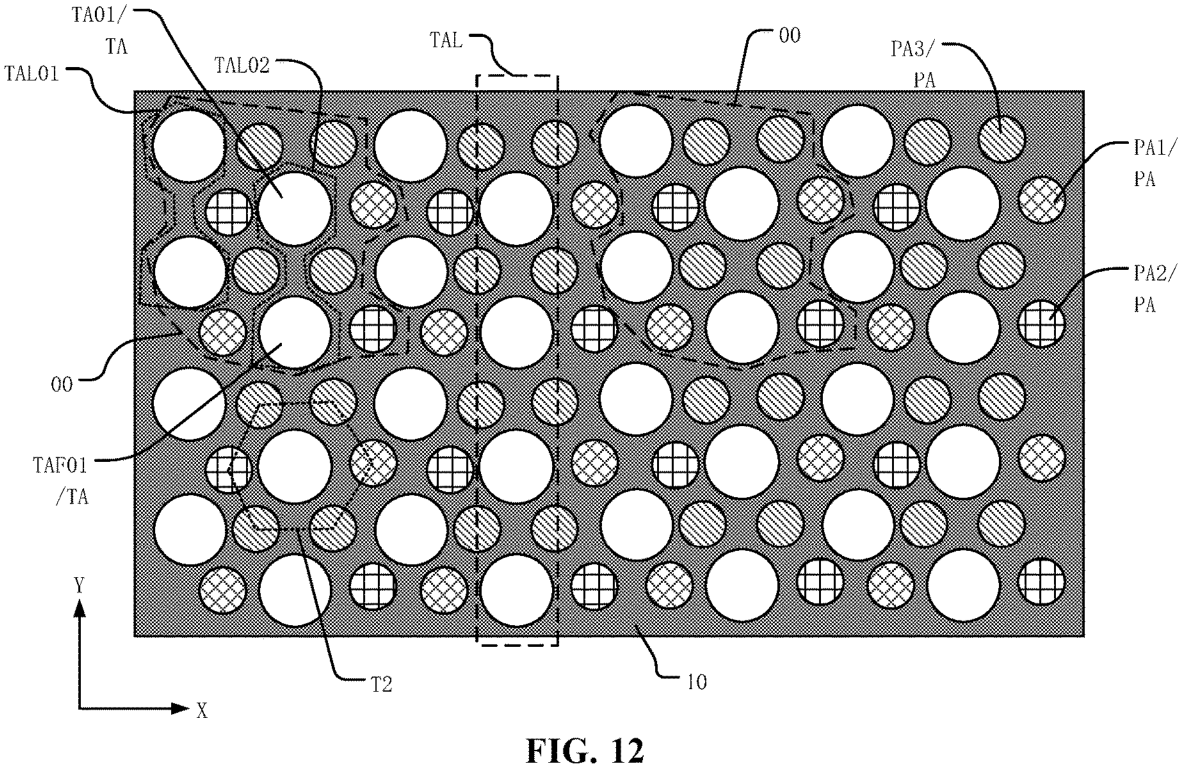
FIG. 12 illustrates another arrangement structural schematic of a plurality of repeating units in a first display region in FIG. 9.

It should be noted that, in FIG. 8 of the present disclosure, the first direction X is the horizontal direction, and the second direction Y is the vertical direction as an example for illustration. In some other embodiments, as shown in FIG. 10, FIG. 10 illustrates another local enlarged schematic of one repeating unit of the first display region in FIG. 6, the first direction X can also be understood as the vertical direction in FIG. 10, and the second direction Y can also be understood as the horizontal direction in FIG. 10. At this point, one repeating unit 00 may also have the design structure shown in FIG. 8, which may not be described in detail in the present disclosure.

In some embodiments of the present disclosure, referring to FIGS. 1, 6, 8 and 9, in the present disclosure, the first display region AA1 may include the plurality of repeating units 00, and one repeating unit 00 may include four light-transmitting regions TA and eight pixel regions PA; and in one repeating unit 00, the eight pixel regions PA may include two first-color pixel regions PA1, two second-color pixel regions PA2, and four third-color pixel regions PA3.

Four third-color pixel regions PA3 may be respectively at four vertex positions of two opposite sides of the second hexagon T2.

In the present disclosure, it describes that the arrangement of the pixel regions PA and the light-transmitting regions TA of the first display region AA1 may be formed by the plurality of repeating units 00 arranged in sequence along the first direction X or along the second direction Y. For example, the first display region AA1 may include the plurality of repeating units 00, the plurality of repeating units 00 may be sequentially arranged along the first direction X, and the plurality of repeating units 00 may be sequentially arranged along the second direction Y. Each repeating unit 00 may include four light-transmitting regions TA and eight pixel regions PA. As shown in FIG. 9, eight pixel regions PA in one repeating unit 00 may include two first-color pixel regions PA1, two second-color pixel regions PA2, and four third-color pixel regions PA3 (different fill patterns in FIG. 9 are used to distinguish pixel regions of different colors). In some embodiments of the present disclosure, the first-color pixel region PA1 may be a blue pixel region for configuring blue sub-pixels, the second-color pixel region PA2 may be a red pixel region for configuring red sub-pixels, the third-color pixel region PA3 may be a green pixel region for configuring green sub-pixels, or the first-color pixel region PA1 may also be a pixel region of other colors, which may not be limited in the present disclosure.

In the eight pixel regions PA included in one repeating unit 00 of the present disclosure, six pixel regions PA may be arranged by surrounding one light-transmitting region TA to form the second hexagon T2. That is, in one repeating unit 00, six pixel regions PA forming the second hexagon T2 may include four third-color pixel regions PA3, one first-color pixel region PA1, and one second-color pixel region PA2. In the present disclosure, it configures that four third-color pixel regions PA3 included in one repeating unit 00 may be respectively at four vertex positions of two opposite sides of the second hexagon T2. Therefore, the first-color pixel region PA1 and the second-color pixel region PA2 may be at the positions of remaining two vertices of the second hexagon T2; and in one repeating unit 00, six pixel regions PA may surround one light-transmitting region TA to form the arrangement structure of the second hexagon T2.

In some embodiments of the present disclosure, referring to FIGS. 1, 6, 8, 9 and 11, FIG. 11 illustrates an arrangement structural schematic of a plurality of repeating units in the first display region in FIG. 9.

In one repeating unit 00 of the present disclosure, four light-transmitting regions TA may be in two adjacent light-transmitting rows TAH, where two light-transmitting regions TA may be arranged along the first direction X to form the first sub-light-transmitting row TAH01, and the other two light-transmitting regions TA may be arranged along the first direction X to form the second sub-light-transmitting row TAH02; and four third-color pixel regions PA3 may be arranged by surrounding one light-transmitting region TA in the second sub-light-transmitting row TAH02.

In four third-color pixel regions PA3, two third-color pixel regions PA3 may be arranged along the first direction X to form the first third-color pixel row PA3H1, and the other two third-color pixel regions PA3 may be arranged along the first direction X to form the second third-color pixel row PA3H2. Along the second direction Y, the first third-color pixel row PA3H1 may be between the first sub-light-transmitting row TAH01 and the second sub-light-transmitting row TAH02; and the second third-color pixel row PA3H2 may be on the side of the second sub-light-transmitting row TAH02 away from the first third-color pixel row PA3H1.

In two first-color pixel regions PA1 and two second-color pixel regions PA2, along the first direction X, one first-color pixel region PA1 may be between two third-color pixel regions PA3 in the first third-color pixel row PA3H1, and one second-color pixel region PA2 may be between two third-color pixel regions PA3 in the second third-color pixel row PA3H2; another first-color pixel region PA1 may be on the side of the third-color pixel region PA3 in the second third-color pixel row PA3H2 away from the second-color pixel region PA2; and another second-color pixel region PA2 may be on the side of the third-color pixel region PA3 in the first third-color pixel row PA3H1 away from the first-color pixel region PA1.

In the present disclosure, it describes that in eight pixel regions PA included in one repeating unit 00, six pixel regions PA may be arranged by surrounding one light-transmitting region TA to form the second hexagon T2. That is, in one repeating unit 00, the six pixel regions PA forming the second hexagon T2 may include four third-color pixel regions PA3, one first-color pixel region PA1, and one second-color pixel region PA2. In such way, four third-color pixel regions PA3 included in one repeating unit 00 may be at four vertex positions of two opposite sides of the second hexagon T2, respectively. Therefore, one first-color pixel region PA1 and one second-color pixel region PA2 may be at the positions of remaining two vertices of the second hexagon T2; and in one repeating unit 00, six pixel regions PA may surround one light-transmitting region TA to form the arrangement structure of the second hexagon T2.

Four light-transmitting regions TA included in one repeating unit 00 of the present disclosure may be in two adjacent light-transmitting rows TAH. Two light-transmitting regions TA may be arranged along the first direction X to form the first sub-light-transmitting row TAH01, and the other two light-transmitting regions TA may be arranged along the first direction X to form the second sub-light-transmitting row TAH02. It can be understood that the first sub-light-transmitting row TAH01 can be understood as a part of the region in the light-transmitting row TAH, and the second sub-light-transmitting row TAH02 can also be understood as a part of the region in the light-transmitting row TAH. Four third-color pixel regions PA3 in one repeating unit 00 may be arranged by surrounding one light-transmitting region TA in the second sub-light-transmitting row TAH02; and four third-color pixel regions PA3 in one repeating unit 00 may be at four vertex positions of two opposite sides of the second hexagon T2.

For four third-color pixel regions PA3 arranged by surrounding one light-transmitting region TA in the second sub-light-transmitting row TAH02, two third-color pixel regions PA3 may be arranged along the first direction X to form the first third-color pixel row PA3H1, and the other two third-color pixel regions PA3 may be arranged along the first direction X to form the second third-color pixel row Line PA3H2. It can be understood that the first third-color pixel row PA3H1 can be understood as a part of the region in the pixel row PAH, and the second third-color pixel row PA3H2 can also be understood as a part of the region in the pixel row PAH. In the present disclosure, it configures that, along the second direction Y, the first third-color pixel row PA3H1 may be between the first sub-light-transmitting row TAH01 and the second sub-light-transmitting row TAH02; and the second third-color pixel row PA3H2 may be on the side of the second sub-light-transmitting row TAH02 away from the first third-color pixel row PA3H1. Therefore, when the plurality of repeating units 00 are arranged, the arrangement structure may satisfy that the first pixel group PAZ1 may be between the first light-transmitting group TAZ1 and the second light-transmitting group TAZ2; and the second pixel group PAZ2 may be on the side of the second light-transmitting group TAZ2 away from the first light-transmitting group TAZ1.

In two first-color pixel regions PA1 and the two second-color pixel regions PA2 included in one repeating unit 00 of the present disclosure, along the first direction X, one first-color pixel region PA1 may be between two third-color pixel regions PA3 in the first third-color pixel row PA3H1, and one second-color pixel region PA2 may be between two third-color pixel regions PA3 in the second third-color pixel row PA3H2, such that the other first-color pixel region PA1 may be on the side of the third-color pixel region PA3 in the second third-color pixel row PA3H2 away from the second-color pixel region PA2, and the other second-color pixel region PA2 may be on the side of the third-color pixel region PA3 in the first third-color pixel row PA3H1 away from the first-color pixel region PA1. Furthermore, the structure that the four pixel regions PA of the first pixel group PAZ1 and the four pixel regions PA of the second pixel group PAZ2 are arranged symmetrically along the symmetry axis SA may be formed; and while ensuring a sufficient light-transmitting area of the light-transmitting regions TA, the space between the light-transmitting regions TA may be fully utilized to arrange the pixel regions PA to maximize the space utilization rate between adjacent light-transmitting regions TA.

In some embodiments of the present disclosure, referring to FIGS. 1, 6, 9 and 12, FIG. 12 illustrates another arrangement structural schematic of a plurality of repeating units in the first display region in FIG. 9.

In one repeating unit 00, four light-transmitting regions TA may be in two adjacent light-transmitting columns TAL, where two light-transmitting regions TA may be arranged along the second direction Y to form the first sub-light-transmitting column TAL01; and the other two light-transmitting regions TA may be arranged along the second direction Y to form the second sub-light-transmitting column TAL02.

Four third-color pixel regions PA3 may be arranged by surrounding one light-transmitting region TA in the second sub-light-transmitting column TAL02; the light-transmitting region TA surrounded by four third-color pixel regions PA3 may be the first central light-transmitting region TA01; and the other light-transmitting region TA in the second sub-light-transmitting column TAL02 may be the first non-central light-transmitting region TAF01.

Along the second direction Y, two third-color pixel regions PA3 may be on two opposite sides of the first central light-transmitting region TA01; and along the first direction X, two third-color pixel regions PA3 may be on two opposite sides of the first central light-transmitting region TA01.

Along the first direction X, one second-color pixel region PA2 and one first-color pixel region PA1 may be respectively on two opposite sides of the first central light-transmitting region TA01.

Along the first direction X, the other second-color pixel region PA2 and the other first-color pixel region PA1 may be respectively on two opposite sides of the first non-central light-transmitting region TAF01.

One second-color pixel region PA2 and one first-color pixel region PA1 may be arranged along the second direction Y and between the first sub-light-transmitting column TAL01 and the second sub-light-transmitting column TAL02.

In the present disclosure, it describes that in eight pixel regions PA included in one repeating unit 00, six pixel regions PA may be arranged by surrounding one light-transmitting region TA to form the second hexagon T2. That is, in one repeating unit 00, six pixel regions PA forming the second hexagon T2 may include four third-color pixel regions PA3, one first-color pixel region PA1, and one second-color pixel region PA2. In such way, four third-color pixel regions PA3 included in one repeating unit 00 may be at four vertex positions of two opposite sides of the second hexagon T2, respectively. Therefore, one first-color pixel region PA1 and one second-color pixel region PA2 may be at the positions of remaining two vertices of the second hexagon T2; and in one repeating unit 00, six pixel regions PA may surround one light-transmitting region TA to form the arrangement structure of the second hexagon T2.

Four light-transmitting regions TA included in one repeating unit 00 of the present disclosure may be in two adjacent light-transmitting columns TAL, where two light-transmitting regions TA may be arranged along the second direction Y to form the first sub-light-transmitting column TAL01, and the other two light-transmitting regions TA may be arranged along the second direction Y to form the second sub-light-transmitting column TAL02. It can be understood that the first sub-light-transmitting column TAL01 may be a part of the region in the transmission column TAL, and the second sub-light-transmitting column TAL02 may be a part of the region in the transmission column TAL. Four third-color pixel regions PA3 in one repeating unit 00 may be arranged by surrounding one light-transmitting region TA in the second sub-light-transmitting column TAL02. The light-transmitting region TA surrounded by the four third-color pixel regions PA3 may be named as the first central light-transmitting region TA01. Therefore, the other light-transmitting region TA in the second sub-light-transmitting column TAL02 may be named as the first non-central light-transmitting region TAF01. Four third-color pixel regions PA3 in one repeating unit 00 may be at four vertex positions of two opposite sides of the second hexagon T2.

Along the second direction Y, two third-color pixel regions PA3 may be on two opposite sides of the first central light-transmitting region TA01; and along the first direction X, two third-color pixel regions PA3 may be on two opposite sides of the first central light-transmitting region TA01. That is, four third-color pixel regions PA3 of one repeating unit 00 may be arranged to be opposite to each other (e.g., two pairs of third-color pixel regions) on two sides of the first central light-transmitting region TA01. Along the first direction X, one second-color pixel region PA2 and one first-color pixel region PA1 may be respectively on two opposite sides of the first central light-transmitting region TA01. In such way, the other remaining second-color pixel region PA2 and the other remaining first-color pixel region PA1 may be respectively on two opposite sides of the first non-central light-transmitting region TAF01. The second-color pixel region PA2 and the first-color pixel region PA1 may be arranged along the second direction Y and between the first sub-light-transmitting column TAL01 and the second sub-light-transmitting column TAL02. Furthermore, the structure that four pixel regions PA of the first pixel group PAZ1 and the four pixel regions PA of the second pixel group PAZ2 are arranged symmetrically along the symmetry axis SA may be formed, and while ensuring a sufficient light-transmitting area of the light-transmitting regions TA, the space between the light-transmitting regions TA may be fully utilized to arrange the pixel regions PA to maximize the space utilization rate between adjacent light-transmitting regions TA.

Figure 13:
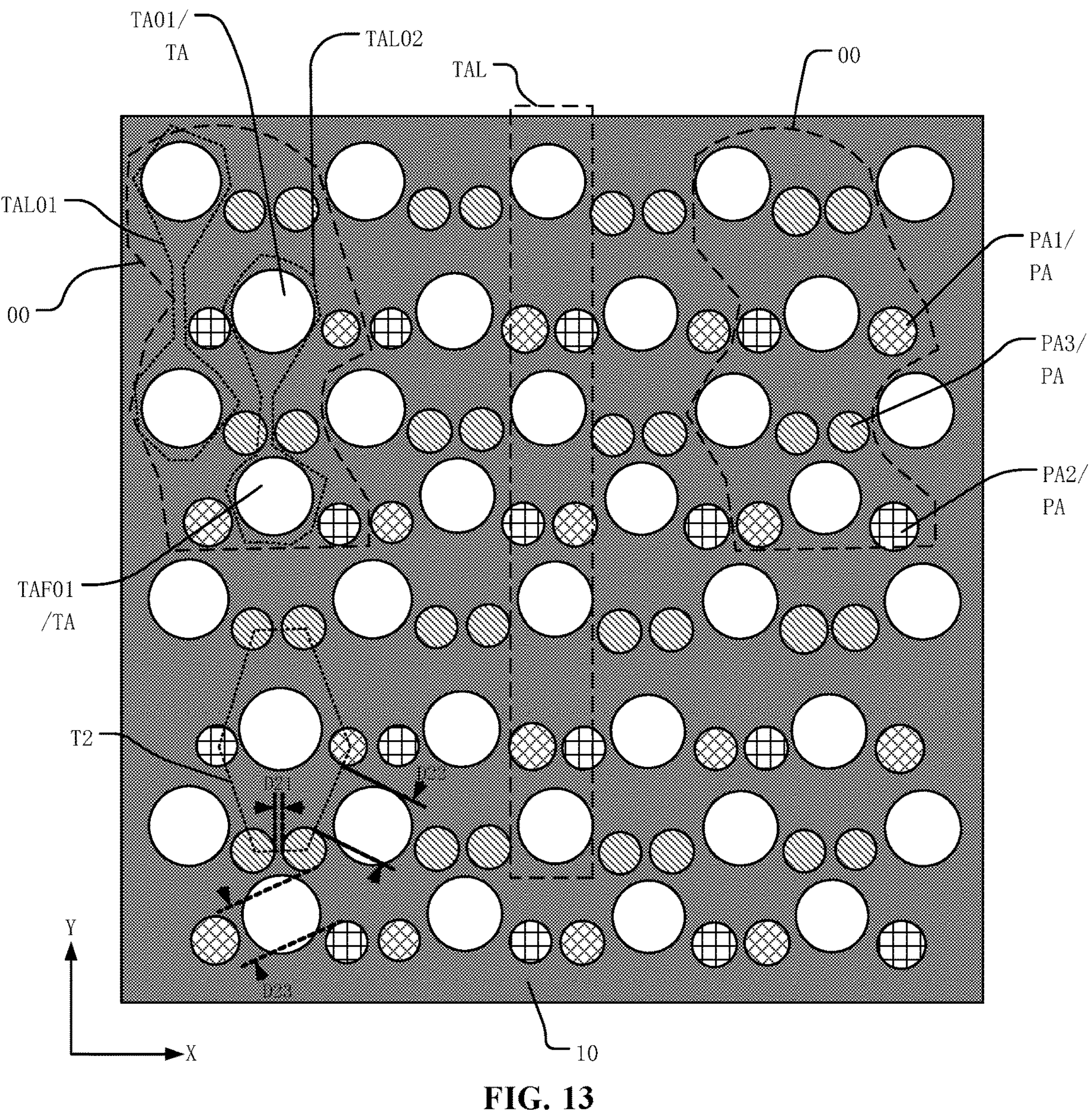
FIG. 13 illustrates another arrangement structural schematic of a plurality of repeating units in a first display region in FIG. 9.

Furthermore, In some embodiments of the present disclosure, FIG. 13 illustrates another arrangement structural schematic of a plurality of repeating units in the first display region in FIG. 9. In one repeating unit 00 in the present disclosure, the minimum distance D21 between two adjacent third-color pixel regions PA3 may be less than the minimum distance D22 between the third-color pixel regions PA3 and the first-color pixel regions PA1 which are adjacent to each other; and the minimum distance D21 between two adjacent third-color pixel regions PA3 may be less than the minimum distance D23 between the third-color pixel regions PA3 and the second-color pixel regions PA2 which are adjacent to each other.

The present disclosure describes that the arrangement of the pixel regions PA may need to be reasonably arranged according to the space between the light-transmitting regions TA. After arranging the plurality of light-transmitting regions TA in the first display region AA1, the plurality of light-transmitting regions TA may be evenly arranged. That is, the distance between two adjacent light-transmitting regions TA arranged in a same direction may be set as equal as possible. Furthermore, the arrangement of the light-transmitting regions TA may satisfy the maximum transmittance of the first display region AA1, and then the plurality of pixel regions PA may be arranged between adjacent light-transmitting regions TA. Therefore, when the plurality of pixel regions PA of different colors are arranged between the light-transmitting regions TA, in one repeating unit 00 of the present disclosure, it configures that the minimum distance D21 between adjacent two third-color pixel regions PA3 may be less than the minimum distance D22 between the third-color pixel regions PA3 and the first-color pixel regions PA1 which are adjacent to each other; and the minimum distance D21 between adjacent two third-color pixel regions PA3 may be less than the minimum distance D23 between the third-color pixel regions PA3 and the second-color pixel regions PA2 which are adjacent to each other. That is, the arrangement manner of the pixel region PA may fully utilize the space between the light-transmitting regions TA to maximize the space utilization rate between adjacent light-transmitting regions TA and ensure sufficient light transmittance; furthermore, the positions of the pixel regions PA may be reasonably arranged, which may be beneficial for improving the pixel arrangement density in the first display region AA1.

In some embodiments of the present disclosure, referring to FIGS. 1, 6, 8 and 14, FIG. 14 illustrates another local enlarged schematic of one repeating unit of the first display region in FIG. 6. In the present disclosure, the first display region AA1 may include the plurality of repeating units 01 (in order to be distinguished from the repeating unit 00 in above-mentioned embodiment, the repeating unit in the present disclosure may be labeled with 01); one repeating unit 01 may include four light-transmitting regions TA and eight pixel regions PA; in one repeating unit 01, the eight pixel regions PA may include two first-color pixel regions PA1, two second-color pixel regions PA2, and four third-color pixel regions PA3; and three third-color pixel regions PA3 may be respectively at three vertex positions of the second hexagon T2 arranged at intervals.

Figure 14:
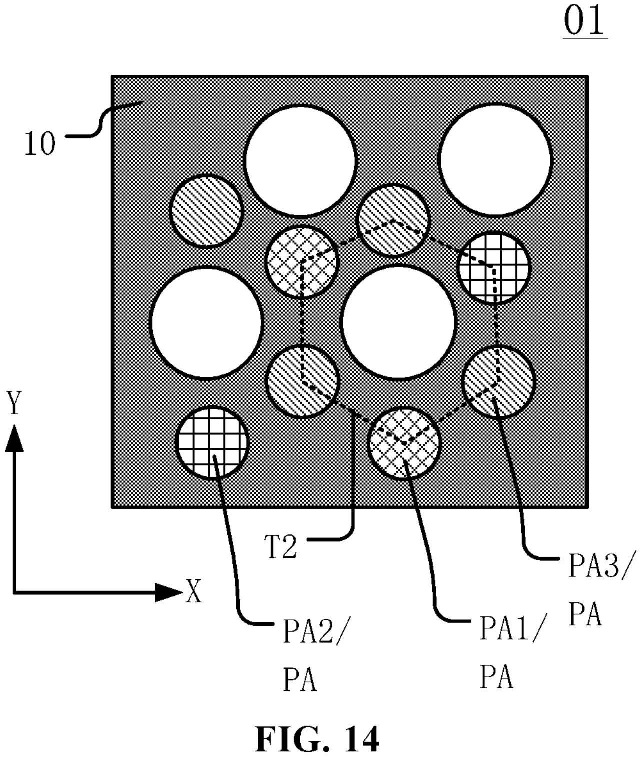
FIG. 14 illustrates another local enlarged schematic of one repeating unit of a first display region in FIG. 6.
Figure 15:
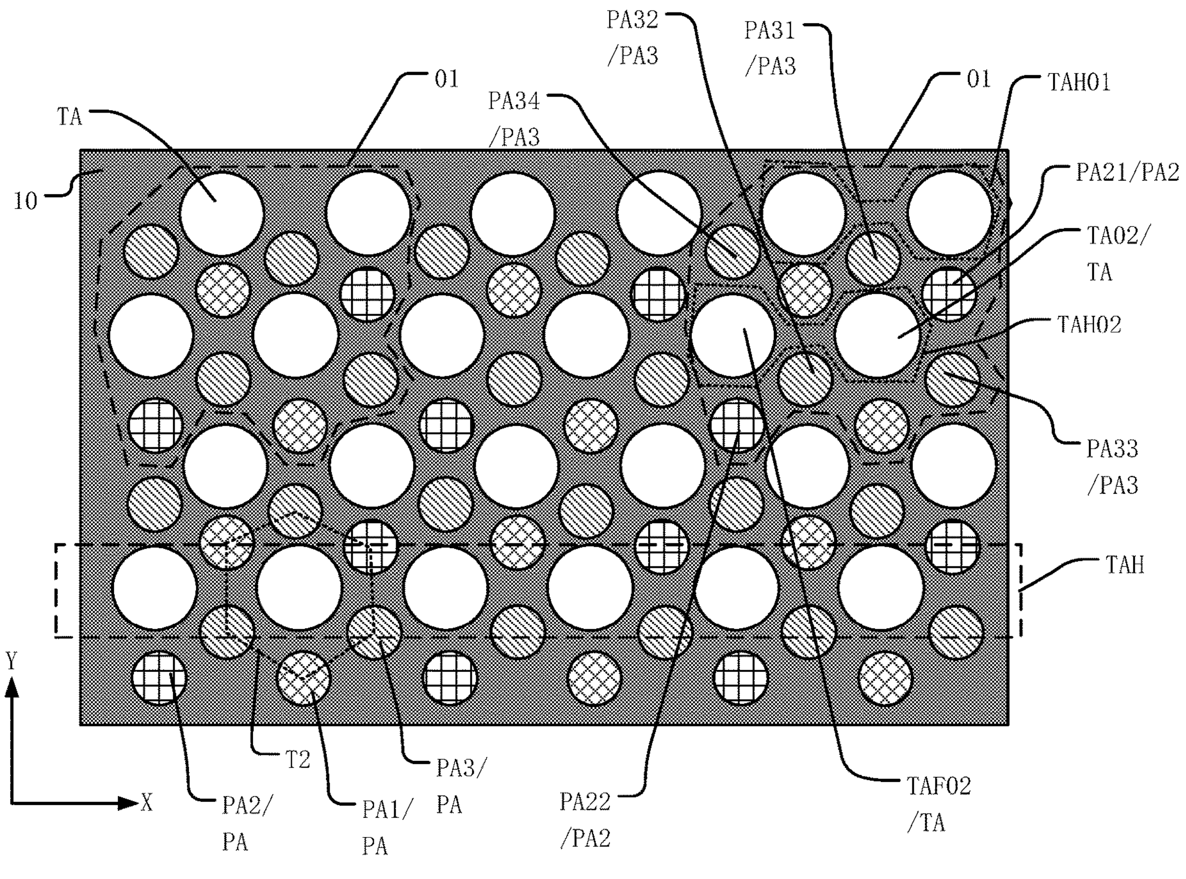
FIG. 15 illustrates an arrangement structural schematic of a plurality of repeating units in a first display region in FIG. 14.
Figure 16:
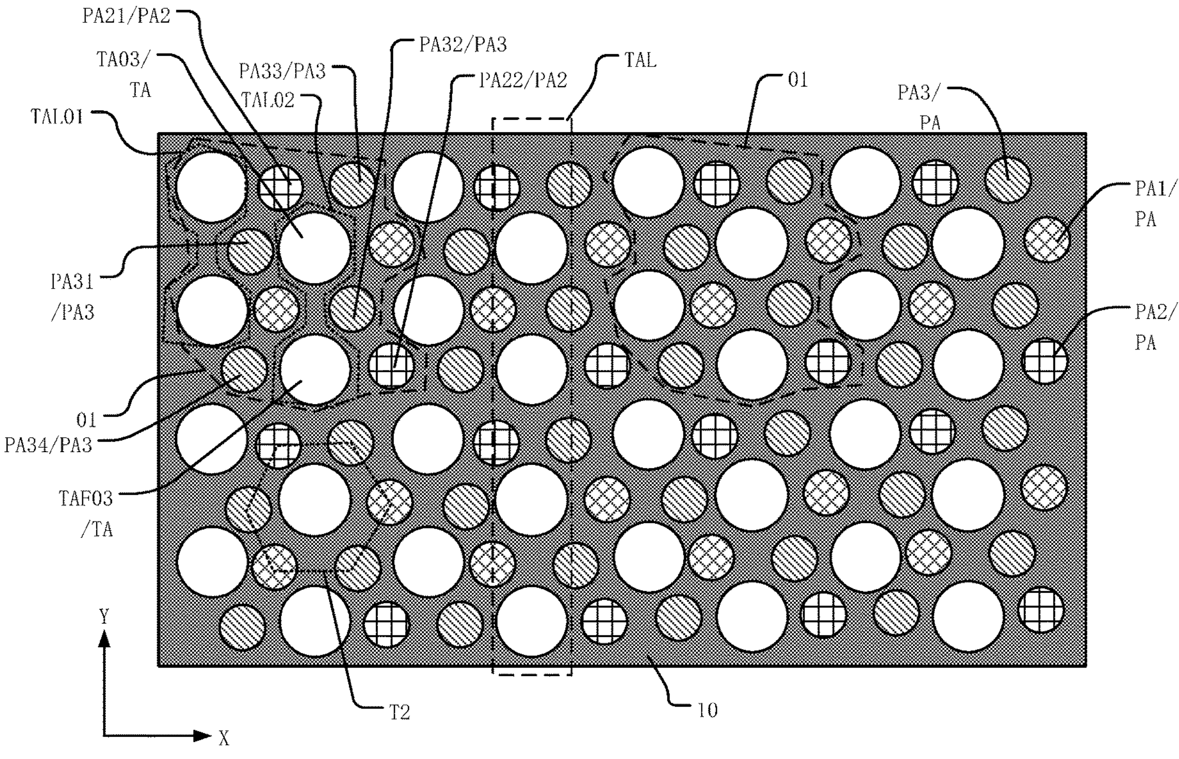
FIG. 16 illustrates another arrangement structural schematic of a plurality of repeating units in a first display region in FIG. 14.

The present disclosure describes that the arrangement manner of the pixel regions PA and the light-transmitting regions TA of the first display region AA1 may be formed by the plurality of repeating units 01 arranged in sequence along the first direction X or along the second direction Y. For example, the first display region AA1 may include a plurality of repeating units 01, a plurality of repeating units 01 may be sequentially arranged along the first direction X, and a plurality of repeating units 01 may be sequentially arranged along the second direction Y. Each repeating unit 01 may include four light-transmitting regions TA and eight pixel regions PA. As shown in FIG. 14, eight pixel regions PA in one repeating unit 01 may include two first-color pixel regions PA1, two second-color pixel regions PA2, and four third-color pixel regions PA3 (different fill patterns in FIG. 14 are used to distinguish pixel regions of different colors). In some embodiments of the present disclosure, the first-color pixel region PA1 may be a blue pixel region for configuring blue sub-pixels, the second-color pixel region PA2 may be a red pixel region for configuring red sub-pixels, and the third-color pixel region PA3 may be a green pixel region for configuring green sub-pixels, or the first-color pixel region PA1 may also be a pixel region of other colors, which may not be limited in the present disclosure.

In eight pixel regions PA included in one repeating unit 01 of the present disclosure, six pixel regions PA may be arranged by surrounding one light-transmitting region TA to form the second hexagon T2. That is, in one repeating unit 01, the six pixel regions PA forming the second hexagon T2 may include three third-color pixel regions PA3, two first-color pixel regions PA1, and one second-color pixel region PA2. In the present disclosure, it configures that three third-color pixel regions PA3 included in one repeating unit 01 may be respectively at the positions of three vertices, arranged at intervals, of the second hexagon T2. In such way, two first-color pixel regions PA1 and one second-color pixel region PA2 may be at the positions of remaining three vertices of the second hexagon T2, and the arrangement structure that six pixel regions PA surround one light-transmitting region TA to form the second hexagonal T2 may be formed in one repeating unit 01. In addition, three third-color pixel regions PA3 included in one repeating unit 01 may be respectively at the positions of three vertices arranged at intervals of the second hexagon T2, so that three third-color pixel regions PA3 may be staggered as possible to prevent the third-color pixel regions PA3 of a same color from being aggregated together, thereby ensuring the consistency of display colors as possible.

In some embodiments of the present disclosure, referring to FIGS. 1, 6, 8, 14 and 15, FIG. 15 illustrates an arrangement structural schematic of a plurality of repeating units in the first display region in FIG. 14.

In one repeating unit 01 of the present disclosure, four light-transmitting regions TA may be in two adjacent light-transmitting rows TAH; two light-transmitting regions TA may be arranged along the first direction X to form the first sub-light-transmitting row TAH01; and the other two light-transmitting regions TA may be arranged along the first direction X to form the second sub-light-transmitting row TAH02.

In four third-color pixel regions PA3, two third-color pixel regions PA3 may be between the first sub-light-transmitting row TAH01 and the second sub-light-transmitting row TAH02; and the other two third-color pixel regions PA3 may be on the side of the second sub-light-transmitting row TAH02 away from the first sub-light-transmitting row TAH01.

In four third-color pixel regions PA3, three third-color pixel regions PA3 may be arranged by surrounding one light-transmitting region TA in the second sub-light-transmitting row TAH02. One third-color pixel region PA3 may be between the first sub-light-transmitting row TAH01 and the second sub-light-transmitting row TAH02; and the other two third-color pixel regions PA3 may be on the side of the second sub-light-transmitting row TAH02 away from the first sub-light-transmitting row TAH01.

The light-transmitting region TA surrounded by three third-color pixel regions PA3 may be the second central light-transmitting region TA02, and the other light-transmitting region TA in the second sub-light-transmitting row TAH02 may be the second non-central light-transmitting region TAF02.

Two first-color pixel regions PA1 and one second-color pixel region PA2 may be arranged by surrounding the second central light-transmitting region TA02. In three third-color pixel regions PA3 (e.g., the third-color pixel region PA31, the third-color pixel region PA32, and the third-color pixel region PA33) arranged by surrounding the second central light-transmitting region TA02, one first-color pixel region PA1 may be configured between two adjacent third-color pixel regions PA3 (e.g., between the third-color pixel region PA31 and the third-color pixel region PA32); the other first-color pixel region PA1 may be configured between two adjacent third-color pixel regions PA3 (e.g., between the third-color pixel region PA32 and the third-color pixel region PA33); and one second-color pixel region PA2 may be configured between two adjacent third-color pixel regions PA3 (e.g., between the third-color pixel region PA33 and the third-color pixel region PA31).

In four third-color pixel regions PA3, in addition to three third-color pixel regions PA3 arranged by surrounding the second central light-transmitting region TA02, another third-color pixel region PA3 may be the fourth third-color pixel region PA34. The fourth third-color pixel region PA34 may be on the side of the first-color pixel region PA1 between the first sub-light-transmitting row TAH01 and the second sub-light-transmitting row TAH02 away from the second-color pixel region PA2.

In two second-color pixel regions PA2, in addition to one second-color pixel region PA2 (e.g., the second-color pixel region PA21) arranged by surrounding the second central light-transmitting region TA02, the other second-color pixel region PA2 may be the second second-color pixel region (e.g., the second-color pixel region PA22). Along the second direction Y, the fourth third-color pixel region PA34 and the second second-color pixel region PA22 may be on two opposite sides of the second non-central light-transmitting region TAF02.

In the present disclosure, it describes that in the eight pixel regions PA included in one repeating unit 01, six pixel regions PA may be arranged by surrounding one light-transmitting region TA to form the second hexagon T2. That is, in one repeating unit 01, six pixel regions PA forming the second hexagon T2 may include three third-color pixel regions PA3, two first-color pixel regions PA1, and one second-color pixel region PA2. In such way, three third-color pixel regions PA3 included in one repeating unit 01 may be respectively at the positions of the three vertices arranged at intervals of the second hexagon T2. Therefore, two first-color pixel regions PA1 and one second-color pixel region PA2 may be at the positions of remaining three vertices of the second hexagon T2, and in one repeating unit 00, six pixel regions PA may surround one light-transmitting region TA to form the arrangement structure of the second hexagon T2.

Four light-transmitting regions TA included in one repeating unit 01 of the present disclosure may be in two adjacent light-transmitting rows TAH. Two light-transmitting regions TA may be arranged along the first direction X to form the first sub-light-transmitting row TAH01, and the other two light-transmitting regions TA may be arranged along the first direction X to form the second sub-light-transmitting row TAH02. It can be understood that the first sub-light-transmitting row TAH01 can be understood as a part of the region in the light-transmitting row TAH, and the second sub-light-transmitting row TAH02 can also be understood as a part of the region in the light-transmitting row TAH. Three third-color pixel regions PA3 in one repeating unit 01 may be arranged by surrounding one light-transmitting region TA in the second sub-light-transmitting row TAH02. The light-transmitting region TA surrounded by the three third-color pixel regions PA3 may be named as the second central light-transmitting region TA02. Therefore, another light-transmitting region TA in the second sub-light-transmitting row TAH02 may be named as the second non-central light-transmitting region TAF02. Three third-color pixel regions PA3 in one repeating unit 01 may be at the positions of three vertices arranged at intervals of the second hexagon T2.

In the present disclosure, two first-color pixel regions PA1 and one second-color pixel region PA2 may be arranged by surrounding the second central light-transmitting region TA02. Two first-color pixel regions PA1 and one second-color pixel region PA2 may be respectively between two adjacent third-color pixel regions PA3 in three third-color pixel regions PA3 arranged by surrounding the second central light-transmitting region TA02. In four third-color pixel regions PA3, in addition to three third-color pixel regions PA3 arranged by surrounding the second central light-transmitting region TA02, another third-color pixel region PA3 may be named as the fourth third-color pixel region PA34, and the fourth third-color pixel region PA34 may be on the side of the first-color pixel region PA1 between the first sub-light-transmitting row TAH01 and the second sub-light-transmitting row TAH02 away from the second-color pixel region PA2. In two second-color pixel regions PA2 included in one repeating unit 01, in addition to one second-color pixel region PA2 (named as the second-color pixel region PA21) arranged by surrounding the second central light-transmitting region TA02, another second-color pixel region PA2 may be the second second-color pixel region (named as the second-color pixel region PA22). Therefore, along the second direction Y, the fourth third-color pixel region PA34 and the second second-color pixel region PA22 may be on two opposite sides of the second non-central light-transmitting region TAF02. Furthermore, the structure that the four pixel regions PA of the first pixel group PAZ1 and the four pixel regions PA of the second pixel group PAZ2 are arranged symmetrically along the symmetry axis SA may be formed. While ensuring a sufficient light-transmitting area of the light-transmitting regions TA, the space between the light-transmitting regions TA may be fully utilized to arrange the pixel regions PA to maximize the space utilization rate between adjacent light-transmitting regions TA.

In some embodiments of the present disclosure, referring to FIGS. 1, 6, 8, 14 and 16, FIG. 16 illustrates another arrangement structural schematic of a plurality of repeating units in the first display region in FIG. 14.

In the present disclosure, in one repeating unit 01, four light-transmitting regions TA may be in two adjacent light-transmitting columns TAL; the two light-transmitting regions TA may be arranged along the second direction Y to form the first sub-light-transmitting column TAL01; and the other two light-transmitting regions TA may be arranged along the second direction Y to form the second sub-light-transmitting column TAL02.

In four third-color pixel regions PA3, two third-color pixel regions PA3 may be between the first sub-light-transmitting column TAL01 and the second sub-light-transmitting column TAL02; and the other two third-color pixel regions PA3 may be on the side of the second sub-transmissive column TAL02 away from the first sub-transmissive column TAL01.

In four third-color pixel regions PA3, three third-color pixel regions PA3 may be arranged by surrounding one light-transmitting region TA in the second sub-light-transmitting column TAL02. One third-color pixel region PA3 may be between the first sub-light-transmitting column TAL01 and the second sub-light-transmitting column TAL02, and the other two third-color pixel regions PA3 may be on the side of the second sub-light-transmitting column TAL02 away from the first sub-light-transmitting column TAL01.

The light-transmitting region TA surrounded by three third-color pixel regions PA3 may be the third central light-transmitting region TA03, and the other light-transmitting region TA in the second sub-light-transmitting column TAL02 may be the third non-central light-transmitting region TAF03.

Two first-color pixel regions PA1 and one second-color pixel region PA2 may be arranged by surrounding the third central light-transmitting region TA03. In three third-color pixel regions PA3 (e.g., the third-color pixel region PA31, the third-color pixel region PA32, and the third-color pixel region PA33) arranged by surrounding the third central light-transmitting region TA03, one first-color pixel region PA1 may be configured between two adjacent third-color pixel regions PA3 (e.g., between the third-color pixel region PA31 and the third-color pixel region PA32); another first-color pixel region PA1 may be configured between two adjacent third-color pixel regions PA3 (e.g., between the third-color pixel region PA32 and the third-color pixel region PA33); and one second-color pixel region PA2 may be configured between two adjacent third-color pixel regions PA3 (e.g., between the third-color pixel region PA33 and the third-color pixel region PA31).

In four third-color pixel regions PA3, in addition to three third-color pixel regions PA3 arranged by surrounding the third central light-transmitting region TA03, another third-color pixel region PA3 may be the fourth third-color pixel region PA34. The fourth third-color pixel region PA34 may be on the side of the first-color pixel region PA1 between the first sub-light-transmitting column TAL01 and the second sub-light-transmitting column TAL02 away from the second-color pixel region PA2.

In two second-color pixel regions PA2, in addition to one second-color pixel region PA2 (e.g., the second-color pixel region PA21) arranged by surrounding the third central light-transmitting region TA03, the other second-color pixel region PA2 may be the second second-color pixel region (e.g., the second-color pixel region PA22). Along the first direction X, the fourth third-color pixel region PA34 and the second second-color pixel region PA22 may be on two opposite sides of the third non-central light-transmitting region TAF03.

In the present disclosure, it describes that in eight pixel regions PA included in one repeating unit 01, six pixel regions PA may be arranged by surrounding one light-transmitting region TA to form the second hexagon T2. That is, in one repeating unit 00, six pixel regions PA forming the second hexagon T2 may include three third-color pixel regions PA3, two first-color pixel regions PA1, and one second-color pixel region PA2. In such way, three third-color pixel regions PA3 included in one repeating unit 01 may be respectively at the positions of three vertices arranged at intervals of the second hexagon T2. Therefore, two first-color pixel regions PA1 and one second-color pixel region PA2 may be at the positions of remaining three vertices of the second hexagon T2, and in one repeating unit 00, six pixel regions PA may surround one light-transmitting region TA to form the arrangement structure of the second hexagon T2.

In the present disclosure, four light-transmitting regions TA included in one repeating unit 01 of the present disclosure may be in two adjacent light-transmitting columns TAL. Two light-transmitting regions TA may be arranged along the second direction Y to form the first sub-light-transmitting column TAL01, and the other two light-transmitting regions TA may be arranged along the second direction Y to form the second sub-light-transmitting column TAL02. It can be understood that the first sub-light-transmitting column TAL01 can be understood as a part of the region in the transmission column TAL, and the second sub-light-transmitting column TAL02 can also be understood as a part of the region in the transmission column TAL. Three third-color pixel regions PA3 in one repeating unit 01 may be arranged by surrounding one light-transmitting region TA in the second sub-light-transmitting column TAL02. The light-transmitting region TA surrounded by the three third-color pixel regions PA3 may be named as the third central light-transmitting region TA03, such that another light-transmitting region TA in the second sub-light-transmitting column TAL02 may be named as the third non-central light-transmitting region TAF03. Three third-color pixel regions PA3 in one repeating unit 00 may be at the positions of three vertices arranged at intervals of the second hexagon T2.

In the present disclosure, two first-color pixel regions PA1 and one second-color pixel region PA2 may be arranged by surrounding the third central light-transmitting region TA03. Two first-color pixel regions PA1 and one second-color pixel region PA2 may be respectively between two adjacent third-color pixel regions PA3 in three third-color pixel regions PA3 arranged by surrounding the third central light-transmitting region TA03. In the four third-color pixel regions PA3, in addition to three third-color pixel regions PA3 arranged by surrounding the third central light-transmitting region TA03, another third-color pixel region PA3 may be named as the fourth third-color pixel region PA34; and the fourth third-color pixel region PA34 may be on the side of the first-color pixel region PA1 between the first sub-light-transmitting column TAL01 and the second sub-light-transmitting column TAL02 away from the second-color pixel region PA2. In two second-color pixel regions PA2 included in one repeating unit 01, in addition to one second-color pixel region PA2 (named as the second-color pixel region PA21) arranged by surrounding the third central light-transmitting region TA03, another second-color pixel region PA2 may be the second second-color pixel region (named as the second-color pixel region PA22). Therefore, along the first direction X, the fourth third-color pixel region PA34 and the second second-color pixel region PA22 may be on two opposite sides of the third non-central light-transmitting region TAF03. Furthermore, the structure that four pixel regions PA of the first pixel group PAZ1 and the four pixel regions PA of the second pixel group PAZ2 are arranged symmetrically along the symmetry axis SA may be formed. While ensuring a sufficient light-transmitting area of the light-transmitting regions TA, the space between the light-transmitting regions TA may be fully utilized to arrange the pixel regions PA to maximize the space utilization rate between adjacent light-transmitting regions TA.

Figure 17:
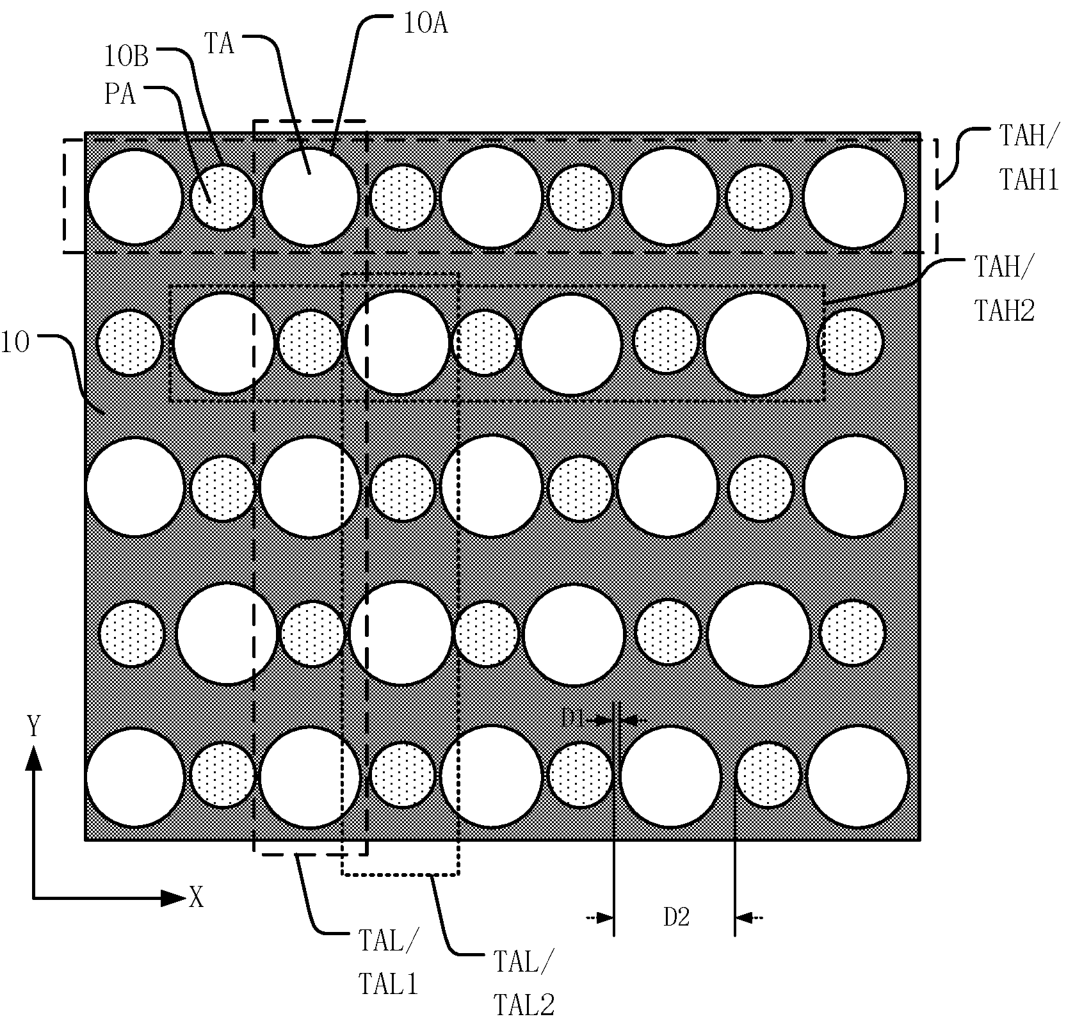
FIG. 17 illustrates another local enlarged schematic of an M region in FIG. 1.

In some embodiments of the present disclosure, referring to FIGS. 1 and 17, FIG. 17 illustrates another local enlarged schematic of the M region in FIG. 1, in the present disclosure, along the first direction X, one pixel region PA may be arranged between two adjacent light-transmitting regions TA in a same light-transmitting row TAH.

Along the second direction Y, one pixel region PA may be arranged between two adjacent light-transmitting regions TA in a same light-transmitting column TAL.

In the present disclosure, it describes staggered arrangement manner of the plurality of light-transmitting regions TA in the first display region AA1 of the display panel 000. For example, a plurality of light-transmitting regions TA may be arranged along the first direction X to form one light-transmitting row TAH; a plurality of light-transmitting rows TAH may be arranged along the second direction Y; a plurality of light-transmitting regions TA may be arranged along the second direction Y to form one light-transmitting column TAL; and a plurality of light-transmitting columns TAL may be arranged along the first direction X. The first direction X can be understood as the horizontal direction in FIG. 17 that is in parallel with the direction of the plane of the display panel 000, such that the second direction Y can be understood as the vertical direction in FIG. 17 that is in parallel with the direction of the plane of the display panel 000. In some embodiments of the present disclosure, the first direction X can be understood as the vertical direction in FIG. 17 that is in parallel with the direction of the plane of the display panel 000, such that the second direction Y can be understood as the horizontal direction in FIG. 17 (not shown) that is in parallel with the direction of the plane of the display panel 000. It can be understood that the present disclosure is only illustrated by taking that the first direction X and the second direction Y are perpendicular to each other along the direction in parallel with the plane of the display panel 000 as an example.

In the present disclosure, the plurality of light-transmitting rows TAH may be arranged to include at least the m-th light-transmitting row TAH1 and the (m+1)-th light-transmitting row TAH2. That is, the m-th light-transmitting row TAH1 and the (m+1)-th light-transmitting row TAH2 may be two adjacent light-transmitting rows TAH; and along the first direction X, the light-transmitting region TA in the m-th light-transmitting row TAH1 may be between two adjacent light-transmitting regions TA in the (m+1)-th light-transmitting row TAH2. The plurality of light-transmitting columns TAL may be arranged to at least include the n-th light-transmitting column TAL1 and the (n+1)-th light-transmitting column TAL2. That is, the n-th light-transmitting column TAL1 and the (n+1)-th light-transmitting column TAL2 may be two adjacent light-transmitting columns TAL; and along the second direction Y, the light-transmitting region TA in the n-th light-transmitting column TAL1 may be between two adjacent light-transmitting regions TA in the (n+1)-th light-transmitting column TAL2. Therefore, the light-transmitting regions TA within the first display region AA1 may be staggered with each other in both the first direction X and the second direction Y. In such way, it may avoid that the light-transmitting regions TA of adjacent light-transmitting rows TAH may be aggregated in a same light-transmitting column TAL, and also avoid that the light-transmitting regions TA of adjacent light-transmitting columns TAL may be aggregated in a same light-transmitting row TAH which may result in the plurality of pixel regions PA to be excessively aggregated and the graininess problem in pictures when the first display region AA1 is used for displaying. Therefore, the plurality of light-transmitting regions TA may be staggered along the first direction X and the second direction Y, which may avoid the picture graininess caused by the aggregation of pixels, thereby being beneficial for ensuring the transmittance of the first display region AA1 and improving the display quality of the first display region AA1 when the first display region AA1 is used for displaying.

The arrangement structure of the plurality of pixel regions PA of the first display region AA1 provided by the present disclosure may be that, along the first direction X, one pixel may be arranged between two adjacent light-transmitting regions TA in a same light-transmitting row TAH District PA. That is, the pixel region PA in a same light-transmitting row TAH may be arranged between two adjacent light-transmitting regions TA. Similarly, along the second direction Y, one pixel region PA may be configured between two adjacent light-transmitting regions TA in a same light-transmitting column TAL. That is, the pixel region PA in a same light-transmitting column TAL may be also arranged between two adjacent light-transmitting regions TA. In such way, the arrangement positions of the pixel regions PA in the first display region AA1 may be configured according to the arrangement structure of the light-transmitting regions TA. That is, while satisfying the maximum transmittance of the first display region AA1, the plurality of light-transmitting regions TA may be staggered along the first direction X and the second direction Y to avoid picture graininess caused by the aggregation of pixels. Meanwhile, after arranging the plurality of light-transmitting regions TA in the first display region AA1, each pixel region PA may be arranged between adjacent light-transmitting regions TA, and the arrangement position of the pixel region PA may be reasonably arranged according to the space between the light-transmitting regions TA. In such way, it may ensure that the minimum distance D1 between the light-transmitting region TA and the pixel region PA may be less than the minimum distance D2 between two adjacent pixel regions PA; and the space between the light-transmitting regions TA may be fully utilized to arrange the pixel regions PA, such that the minimum distance D1 between the pixel region PA and its adjacent light-transmitting region TA may be minimized as possible, thereby maximizing the space utilization rate between adjacent light-transmitting regions TA. Therefore, in the present disclosure, the light transmittance of the first display region AA1 may be maximized while ensuring the light-transmitting region TA with a sufficient region size. Furthermore, by reasonably arranging the position of the pixel region PA, the pixel region PA may be in the space between the light-transmitting regions TA, and the minimum distance D1 between the pixel region PA and its adjacent light-transmitting region TA may reach the minimum value as possible, which may be less than the minimum distance D2 between two adjacent pixel regions PA. In such way, it may realize the maximum space utilization rate of the first display region AA1 and further ensure the light transmittance and achieve a higher photosensitive effect.

Figure 18:
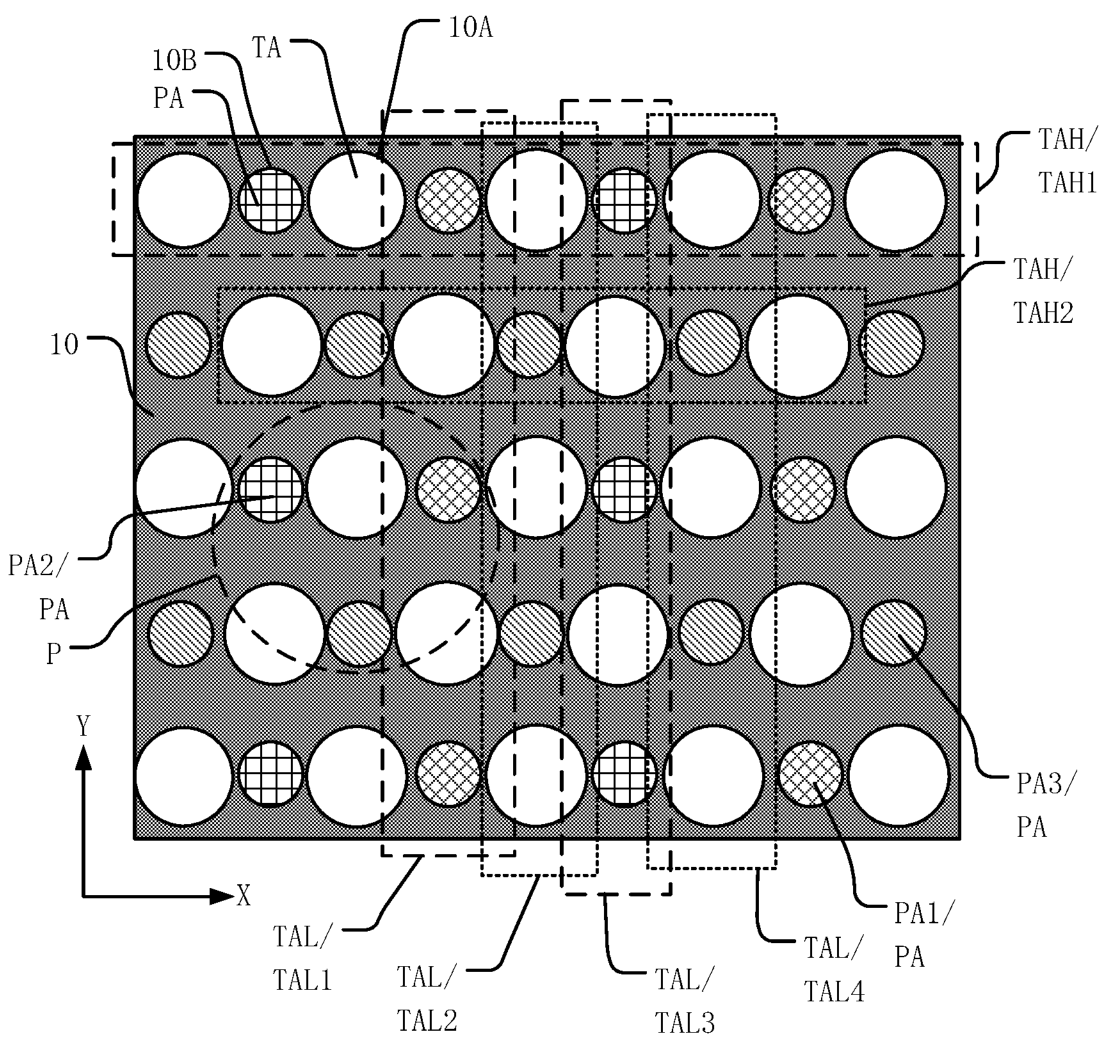
FIG. 18 illustrates another local enlarged schematic of an M region in FIG. 1.

In some embodiments of the present disclosure, referring to FIGS. 1, 17 and 18, FIG. 18 illustrates another local enlarged schematic of the M region in FIG. 1. In the present disclosure, the plurality of pixel regions PA may include first-color pixel regions PA1, second-color pixel regions PA2 and third-color pixel regions PA3.

The first-color pixel region PA1 and the second-color pixel region PA2 may be arranged at intervals along the first direction X; the first-color pixel region PA1 may be between two adjacent light-transmitting regions TA in the m-th light-transmitting row TAH1; and the second-color pixel region PA2 may be between two adjacent light-transmitting regions TA in the m-th light-transmitting row TAH1.

The third-color pixel region PA3 may be between two adjacent light-transmitting regions TA in the (m+1)-th light-transmitting row TAH2.

The first-color pixel region PA1 may be between two adjacent light-transmitting regions TA in the n-th light-transmitting column TAL1; the pixel region PA3 of the third-color may be between two adjacent light-transmitting regions TA in the (n+1)-th light-transmitting column TAL2 and the (n+3)-th light-transmitting column TAL4; and the second-color pixel region PA2 may be between two adjacent light-transmitting regions TA in the (n+2)-th light-transmitting column TAL3.

In the present disclosure, it describes that the plurality of pixel regions PA of the first display region AA1 may include the plurality of pixel regions of different colors. For example, the plurality of pixel regions PA may include the first-color pixel region PA1, the second-color pixel region PA2 and the third-color pixel region PA3. In some embodiments of the present disclosure, the first-color pixel region PA1 may be a blue pixel region for configuring blue sub-pixels; the second-color pixel region PA2 may be a red pixel region for configuring red sub-pixels; and the third-color pixel region PA3 may be a green pixel region for configuring green sub-pixels, or the first-color pixel region PA1 may also be a pixel region of other colors, which may not be limited in the present disclosure. In the present disclosure, it configures the arrangement manner of the plurality of pixel regions PA of different colors in the first display region AA1 to be that along the first direction X, the first-color pixel region PA1 and the second-color pixel region PA2 may be between two adjacent light-transmitting regions TA in a same light-transmitting row TAH. For example, for the m-th light-transmitting row TAH1, the first-color pixel region PA1 may be between two adjacent light-transmitting regions TA in the m-th light-transmitting row TAH1; the second-color pixel region PA2 may be between two adjacent light-transmitting regions TA in the m-th light-transmitting row TAH1; and the first-color pixel regions PA1 and the second-color pixel regions PA2 may be arranged alternately along the first direction X in sequence. Each of the first-color pixel region PA1 and the second-color pixel region PA2 may be between two adjacent light-transmitting regions in a same light-transmitting row TAH, for example, the m-th light-transmitting row TAH1, so that the pixel region PA3 of the third-color may be between two adjacent light-transmitting regions TA in the (m+1)-th light-transmitting row TAH2. In the present disclosure, it configures the arrangement manner of the plurality of pixel regions PA of different colors in the first display region AA1 to be that, along the second direction Y, for the four adjacent light-transmitting columns TAL, on the structure that the light-transmitting regions TA are staggered along the second direction Y, the first-color pixel region PA1 may be between two adjacent light-transmitting regions TA in the n-th light-transmitting column TAL1; the third-color pixel region PA3 may be between two adjacent light-transmitting regions TA in the n+1th light-transmitting column TAL2; the second-color pixel region PA2 may be between two adjacent light-transmitting regions TA in the n+2th light-transmitting column TAL3; and the third-color pixel region PA3 may be between two adjacent light-transmitting regions TA in the n+3th light-transmitting column TAL4. Therefore, each pixel region PA may be arranged between adjacent light-transmitting regions TA, such that the arrangement positions of the pixel regions PA may be reasonably configured according to the space between the light-transmitting regions TA. That is, the space between the light-transmitting regions TA may be fully utilized to arrange the pixel regions PA, and the effect of maximizing the space utilization rate between adjacent light-transmitting regions TA may be achieved. Moreover, in the present disclosure, the plurality of pixel regions PA of different colors included in the first display region AA1 may be reasonably arranged between the light-transmitting regions TA. Therefore, for one pixel unit P including the first-color pixel region PA1, the second-color pixel region PA2 and the third-color pixel region PA3, at least one of the first-color pixel region PA1, the second-color pixel region PA2 and the third-color pixel region PA3 may be shared (i.e., borrowed) by another pixel unit P to improve the display effect when the first display region AA1 is used for displaying. For example, in a pixel arrangement of RGBG, RG in a pixel unit may borrow B in an adjacent pixel unit to realize RGB color matching display and improve visual equivalent resolution.

Figure 19:
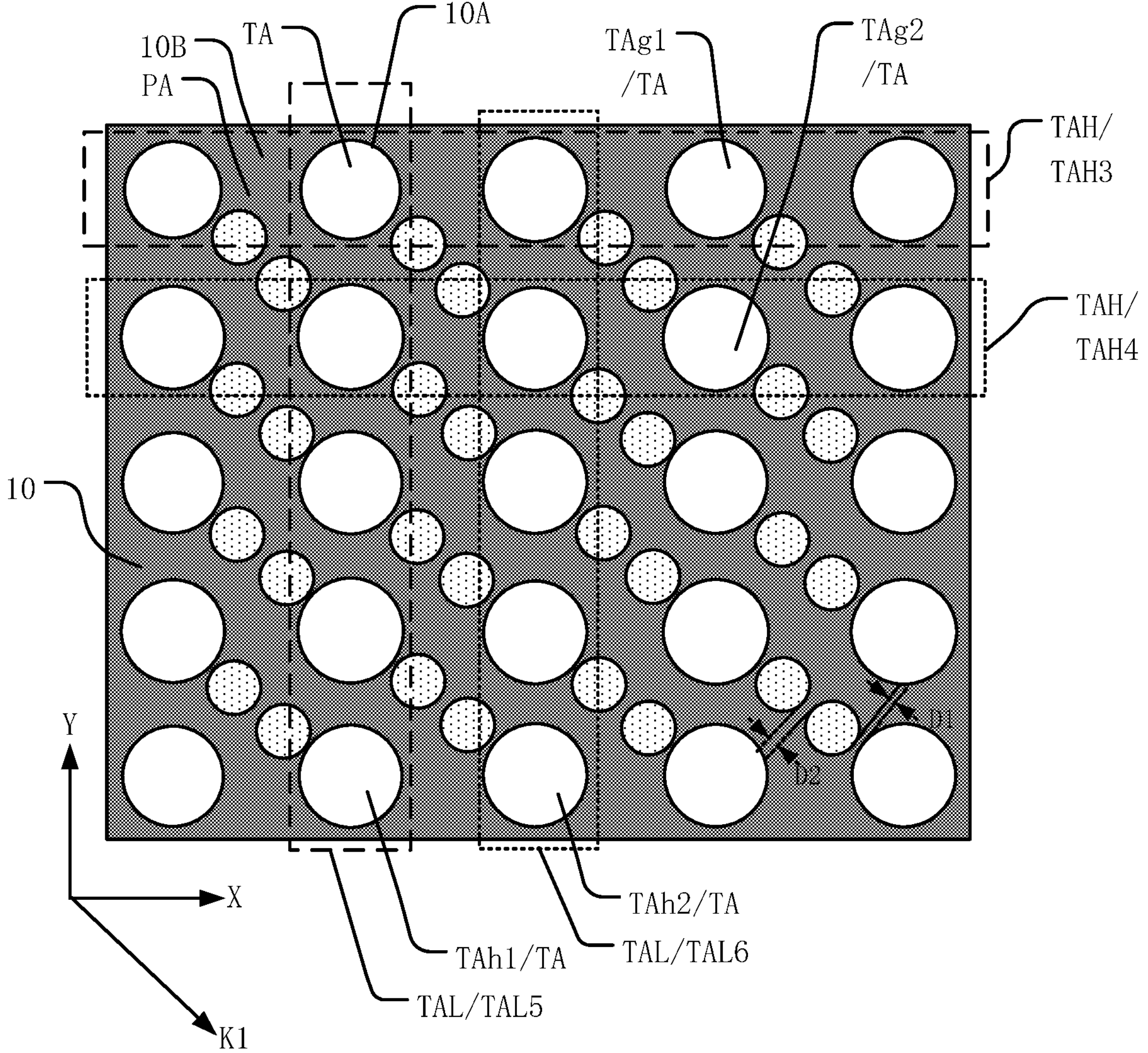
FIG. 19 illustrates another local enlarged schematic of an M region in FIG. 1.

In some embodiments of the present disclosure, referring to FIGS. 1 and 19, FIG. 19 illustrates another local enlarged schematic of the M region in FIG. 1. In the present disclosure, the plurality of light-transmitting regions TA may be arranged in an array.

The plurality of light-transmitting regions TA may be arranged along the first direction X to form one light-transmitting row TAH; and the plurality of light-transmitting rows TAH may be arranged along the second direction Y.

The plurality of light-transmitting regions TA may be arranged along the second direction Y to form one light-transmitting column TAL; and the plurality of light-transmitting columns TAL may be arranged along the first direction X. Along the direction in parallel with the plane of the display panel 000, the first direction X may intersect the second direction Y. The present disclosure is only illustrated by taking that the first direction X and the second direction Y are perpendicular to each other along the direction in parallel with the plane of the display panel 000 as an example.

The plurality of light-transmitting rows TAH may at least include the e-th light-transmitting row TAH3 and the (e+1)-th light-transmitting row TAH4; and along the first direction X, the g-th light-transmitting region TAg1 in the e-th light-transmitting row TAH3 and the g-th light-transmitting region TAg2 in the (e+1)-th light-transmitting row TAH4 may be in a same light-transmitting column TAL.

The plurality of light-transmitting columns TAL may at least include the f-th light-transmitting column TAL5 and the (f+1)-th light-transmitting column TALE; and along the second direction Y, the h-th light-transmitting region TAh1 in the f-th light-transmitting column TAL5 and the h-th light-transmitting region TAh2 in the (f+1)-th light-transmitting column TAL6 may be in a same light-transmitting row TAH, where e, f, g and h may be all positive integers.

In the present disclosure, it describes that in the first display region AA1 of the display panel 000, the arrangement manner of the light-transmitting regions TA may also be an array arrangement. For example, a plurality of light-transmitting regions TA arranged along the first direction X may form one light-transmitting row TAH, and all light-transmitting rows TAH may be sequentially arranged along the second direction Y; and a plurality of light-transmitting regions TA arranged along the second direction Y may form one light-transmitting column TAL, and all light-transmitting columns TAL may be sequentially arranged along the first direction X. In addition, the plurality of light-transmitting rows TAH may at least include the e-th light-transmitting row TAH3 and the (e+1)-th light-transmitting row TAH4 which are adjacent to each other. Along the first direction X, the g-th light-transmitting region Tag1 in the e-th light-transmitting row TAH3 and the g-th light-transmitting region Tag2 in the (e+1)-th light-transmitting row TAH4 adjacent to the e-th light-transmitting row may be in a same light-transmitting column TAL. Similarly, the plurality of light-transmitting columns TAL may at least include the f-th light-transmitting column TAL5 and the (f+1)-th light-transmitting column TAL6 which are adjacent to each other. Along the second direction Y, the h-th light-transmitting region TAh1 in the f-th light-transmitting column TAL5 and the h-th light-transmitting region TAh2 in the (f+1)-th light-transmitting column TAL6 adjacent to the f-th light-transmitting column may be in a same light-transmitting row TAH. Therefore, the structure of the plurality of light-transmitting regions TA arranged in an array may be formed in the first display region AA1, which may improve process efficiency of forming the plurality of light-transmitting regions TA at the process of forming the light-transmitting regions TA and the pixel regions PA through the light-blocking layer 10.

In some embodiments of the present disclosure, referring to FIGS. 1 and 19, in the present disclosure, along the third direction K1, two pixel regions PA may be included between two adjacent light-transmitting regions TA. The angle between the third direction KA and the first direction X may be an acute angle, and the angle between the third direction K1 and the second direction Y may be an obtuse angle.

In the present disclosure, it describes that in the first display region AA1, when the plurality of light-transmitting regions TA are arranged in an array, the arrangement structure of the plurality of pixel regions PA in the first display region AA1 may be that along the third direction K1, two pixel regions PA may be arranged between two adjacent light-transmitting regions TA. That is, along the diagonal direction between the first direction X and the second direction Y (the third direction K1), a plurality of pixel regions PA may be sequentially arranged between the light-transmitting regions TA; and two pixel regions PA may be configured between two adjacent light-transmitting regions TA along the third direction K1. Therefore, two pixel regions PA may be arranged between the light-transmitting regions TA arranged in an array, and the arrangement positions of the pixel regions PA in the first display region AA1 may be configured according to the arrangement structure of the light-transmitting regions TA. That is, while satisfying the maximum transmittance of the first display region AA1, after arranging the plurality of light-transmitting regions TA in the first display region AA1, two pixel regions PA may be arranged between adjacent light-transmitting regions TA along the third direction K1. The arrangement positions of the pixel regions PA may be reasonably arranged according to the space between the light-transmitting regions TA. In such way, it may ensure that the minimum distance D1 between the light-transmitting region TA and the pixel region PA may be less than the minimum distance D2 between two adjacent pixel regions PA; and the space between the light-transmitting regions TA may be fully utilized to arrange the pixel regions PA, such that the minimum distance D1 between the pixel region PA and its adjacent light-transmitting region TA may be minimized as possible, thereby maximizing the space utilization rate between adjacent light-transmitting regions TA.

It can be understood that the present disclosure may not limit specific angle degrees of the acute angle formed by the third direction KA and the first direction X and the obtuse angle formed by the third direction K1 and the second direction Y, which may only need to satisfy that the third direction K1 can be understood as the diagonal direction in FIG. 19 when the first direction X is understood as the horizontal direction in FIG. 19 and the second direction Y is understood as the vertical direction in FIG. 19. During an implementation, the structure of diagonally arranged pixel region PA may be configured according to the structure of the light-transmitting regions TA arranged in the array, which may not be described in detail in the present disclosure.

Figure 20:
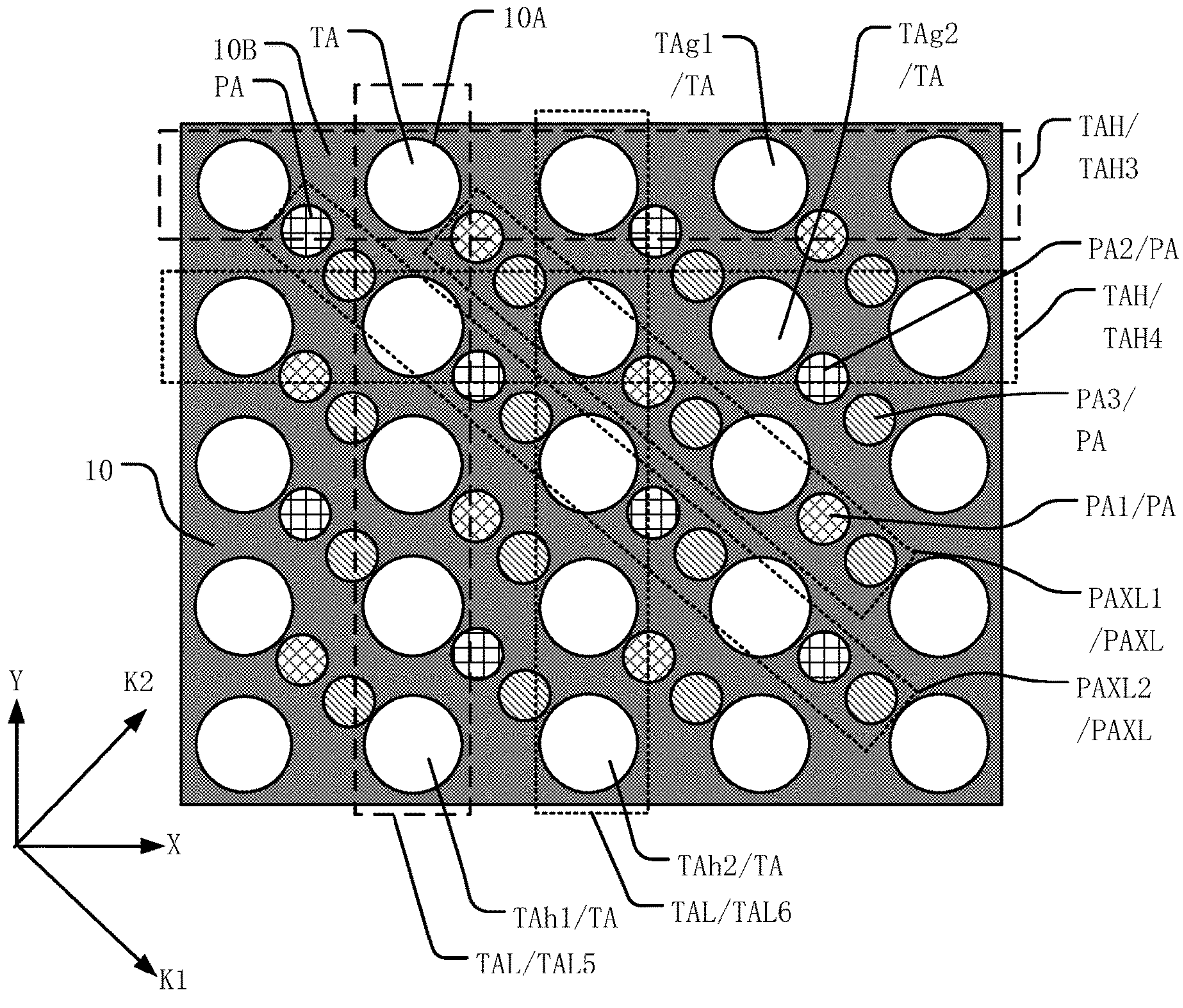
FIG. 20 illustrates another local enlarged schematic of an M region in FIG. 1.

In some embodiments of the present disclosure, referring to FIGS. 1, 19 and 20, FIG. 20 illustrates another local enlarged schematic of the M region in FIG. 1. In the present disclosure, the plurality of pixel regions PA arranged along the third direction K1 may form a pixel diagonal column PAXL, and the plurality of pixel diagonal columns PAXL may be arranged along the fourth direction K2. Along the direction in parallel with the plane of the display panel 000, the fourth direction K2 may intersect the third direction K1. It can be understood that the present disclosure is illustrated by taking the fourth direction K2 and the third direction K1 being perpendicular to each other, along the direction in parallel with the plane of the display panel 000, as an example.

The plurality of pixel regions PA may include the first-color pixel region PA1, the second-color pixel region PA2 and the third-color pixel region PA3.

Along the fourth direction K2, in two adjacent pixel diagonal columns PAXL, one pixel diagonal column PAXL may include the first-color pixel region PA1 and the third-color pixel region PA3 arranged along the third direction K1; and another pixel diagonal column PAXL may include the second-color pixel region PA2 and the third-color pixel region PA3 arranged along the third direction K1.

In the present disclosure, it describes that the plurality of pixel regions PA of the first display region AA1 may include the plurality of pixel regions of different colors. For example, the plurality of pixel regions PA may include the first-color pixel region PA1, the second-color pixel region PA2 and the third-color pixel region PA3. In some embodiments of the present disclosure, the first-color pixel region PA1 may be a blue pixel region for configuring blue sub-pixels, the second-color pixel region PA2 may be a red pixel region for configuring red sub-pixels, the third-color pixel region PA3 may be a green pixel region for configuring green sub-pixels, or the first-color pixel region PA1 may also be a pixel region of other colors, which may not be limited in the present disclosure. In the present disclosure, it configures the arrangement manner of the plurality of pixel regions PA of different colors in the first display region AA1 to be that the plurality of pixel regions PA arranged along the third direction K1 can be understood as forming one pixel diagonal column PAXL, and the plurality of pixel diagonal columns PAXL may be arranged along the fourth direction K2. Along the direction in parallel with the plane of the display panel 000, the fourth direction K2 may intersect or be perpendicular to the third direction K1. Along the fourth direction K2, for two adjacent pixel diagonal columns PAXL (the pixel diagonal columns PAXL1 and pixel diagonal columns PAXL2 which are adjacent to each other shown in FIG. 20), one pixel diagonal column PAXL (such as pixel diagonal column PAXL1) may include the first-color pixel region PA1 and the third-color pixel region PA3 arranged along the third direction K1, so that another pixel diagonal row PAXL (such as pixel diagonal row PAXL2) may include the second-color pixel region PA2 and the third-color pixel region PA3 arranged along the third direction K1. Therefore, two formed pixel regions PA may be arranged between adjacent light-transmitting regions TA along the third direction K1, and the arrangement positions of the pixel regions PA may be reasonably arranged according to the space between the light-transmitting regions TA. That is, the space between the light-transmitting regions TA may be fully utilized to arrange the pixel regions PA, thereby achieving the effect of maximizing the space utilization rate between adjacent light-transmitting regions TA. Moreover, according to the present disclosure, the plurality of pixel regions PA of different colors included in the first display region AA1 may be reasonably arranged between the light-transmitting regions TA. Therefore, for one pixel unit including the first-color pixel region PA1, the second-color pixel region PA2 and the third-color pixel region PA3, at least one of the first-color pixel region PA1, the second-color pixel region PA2 and the third-color pixel region PA3 may be borrowed by another pixel unit to improve the display effect when the first display region AA1 is used for displaying.

Figure 21:
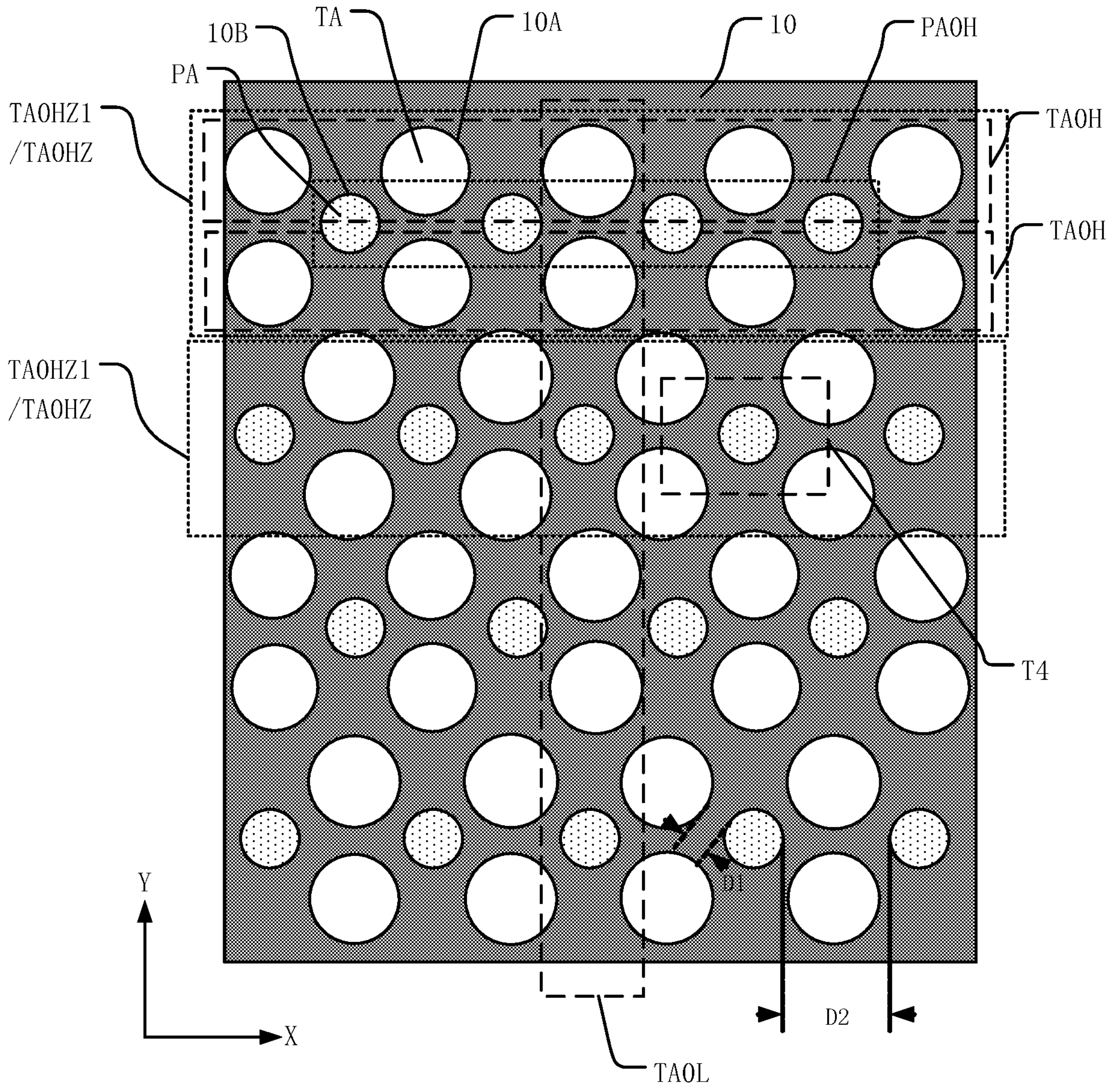
FIG. 21 illustrates another local enlarged schematic of an M region in FIG. 1.

In some embodiments of the present disclosure, referring to FIGS. 1 and 21, FIG. 21 illustrates another local enlarged schematic of the M region in FIG. 1. In the present disclosure, the plurality of light-transmitting regions TA may be arranged along the first direction X to form the light-transmitting row TA0H; and the plurality of light-transmitting rows TA0H may be arranged along the second direction Y.

The plurality of light-transmitting regions TA may be arranged along the second direction Y to form one light-transmitting column TA0L, and the plurality of light-transmitting columns TA0L may be arranged along the first direction X. Along the direction in parallel with the plane of the display panel 000, the first direction X may intersect the second direction Y. It can be understood that in the present disclosure, the first direction X and the second direction Y may be perpendicular to each other, along the direction in parallel with the plane of the display panel 000, as an example for illustration.

At least two adjacent light-transmitting rows TA0H may form one light-transmitting row group TA0HZ, and a plurality of light-transmitting regions TA in a same light-transmitting row group TA0HZ may be arranged in an array.

The plurality of light-transmitting row groups TA0HZ may at least include the i-th light-transmitting row group TA0HZ1 and the (i+1)-th light-transmitting row group TA0HZ2. Along the first direction X, the light-transmitting region TA in the i-th light-transmitting row group TA0HZ1 may be between two adjacent light-transmitting regions TA in the (i+1)-th light-transmitting row group TA0HZ2, where i may be a positive integer.

In the present disclosure, it describes that in the first display region AA1 of the display panel 000, only a part of the light-transmitting regions TA may be arranged in an array, and a part of the light-transmitting regions TA may be arranged in a staggered arrangement. For example, the plurality of light-transmitting regions TA arranged along the first direction X may form one light-transmitting row TA0H, and all light-transmitting rows TA0H may be sequentially arranged along the second direction Y. The plurality of light-transmitting regions TA arranged along the second direction Y may form one light-transmitting column TA0L (in order to be different from the light-transmitting column TAL and the light-transmitting row TAH in above-mentioned embodiment, the light-transmitting row of the present disclosure may be labeled as TA0H, and the light-transmitting column of the present disclosure may be labeled as TA0L); and the light-transmitting columns TA0L may be sequentially arranged along the first direction X, respectively. At least two adjacent light-transmitting rows TA0H of the present disclosure may form one light-transmitting row group TA0HZ. It can be understood that, in FIG. 21 of the present disclosure, only two light-transmitting rows TA0H may form one light-transmitting row group TA0HZ as an example for illustration. During an implementation, the number of light-transmitting rows TA0H included in one light-transmitting row group TA0HZ may include, but may not be limited to, above-mentioned description The plurality of light-transmitting regions TA in a same light-transmitting row group TA0HZ of the present disclosure may be arranged in an array (as shown in FIG. 21).

In the present disclosure, two adjacent light-transmitting row groups TA0HZ may be configured to be staggered with each other. For example, two adjacent light-transmitting row groups TA0HZ may include the i-th light-transmitting row group TA0HZ1 and the (i+1)-th light-transmitting row group TA0HZ2; and along the first direction X, the light-transmitting region TA in the i-th light-transmitting row group TA0HZ1 may be between two adjacent light-transmitting regions TA in the (i+1)-th light-transmitting row group TA0HZ2 (as shown in FIG. 21). In the present disclosure, the arrangement manner of a part of the light-transmitting regions TA in the first display region AA1 may be an array arrangement, and the arrangement manner of a part of the light-transmitting regions TA may be a staggered arrangement. Therefore, the structure of the plurality of light-transmitting regions TA arranged in an array may be formed in the first display region AA1. In the process of forming the light-transmitting regions TA and the pixel regions PA through the light-blocking layer 10, the process efficiency of forming the plurality of light-transmitting regions TA may be improved. Meanwhile, it may also prevent the light-transmitting regions TA of adjacent light-transmitting row groups TA0HZ from being aggregated in a same light-transmitting column TA0L by arranging two adjacent light-transmitting row groups TA0HZ to be staggered from each other. As a result, the plurality of pixel regions PA may be too aggregated, which may cause graininess problem in pictures when the first display region AA1 is used for displaying. Therefore, the staggered arrangement of two adjacent light-transmitting row groups TA0HZ may avoid image graininess caused by pixel aggregation, thereby improving the display quality of the first display region AA1.

In some embodiments of the present disclosure, referring to FIGS. 1 and 21, in the present disclosure, the plurality of pixel regions PA arranged along the first direction X may form one pixel row PA0H, and the plurality of pixel rows PA0H may be arranged along the second direction Y.

One pixel row PA0H may be included between two light-transmitting rows TA0H of one light-transmitting row group TA0HZ; and the pixel region PA may not be included between two adjacent light-transmitting row groups TA0HZ.

One light-transmitting row group TA0HZ may include four light-transmitting regions TA; the four light-transmitting regions TA may be in two adjacent light-transmitting rows TA0H; the geometric center points of four light-transmitting regions TA may be the vertices of one quadrilateral T4; and one pixel region PA may be configured within the range of one quadrilateral T4.

In the present disclosure, it describes that in the first display region AA1 of the display panel 000, only a part of the light-transmitting regions TA may be arranged in an array arrangement, and a part of the light-transmitting regions TA may be arranged in a staggered arrangement, which may be, for example, the structure shown in FIG. 21 that two adjacent light-transmitting row groups TA0HZ may be arranged in a staggered arrangement, and the light-transmitting regions TA in a same light-transmitting row group TA0HZ may be arranged in an array. At this point, the arrangement structure of the pixel regions PA in the first display region AA1 may be that one pixel row PA0H may be included between two light-transmitting rows TA0H of a same light-transmitting row group TA0HZ; and the light-transmitting regions TA in one light-transmitting row group TA0HZ may be arranged in an array. Therefore, one pixel region PA of the pixel row PA0H may be configured in a quadrilateral T4 formed by four light-transmitting regions TA of one light-transmitting row group TA0HZ, such that the space between the light-transmitting regions TA may be fully utilized to arrange the pixel regions PA, and the effect of maximizing the space utilization rate between adjacent light-transmitting regions TA may be achieved. The pixel region PA may not be included between two adjacent light-transmitting row groups TA0HZ of the present disclosure, which may be beneficial for further increasing the space ratio of the light-transmitting regions TA in the first display region AA1 and further improving the light transmittance of the first display region AA1 to achieve a higher photosensitive effect.

Figure 22:
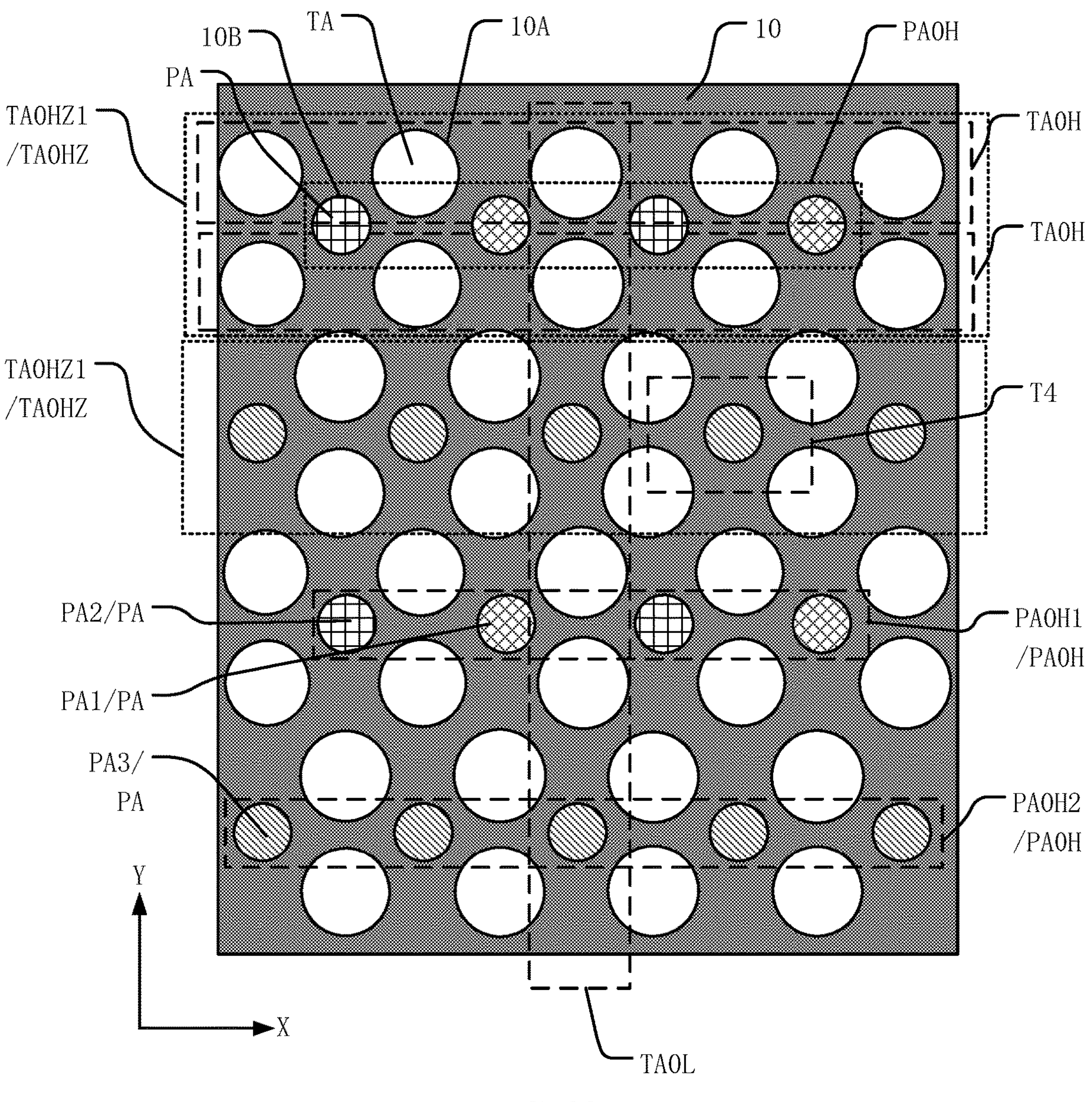
FIG. 22 illustrates another local enlarged schematic of an M region in FIG. 1.

In some embodiments of the present disclosure, referring to FIGS. 1, 21 and 22, FIG. 22 illustrates another local enlarged schematic of the M region in FIG. 1. In the present disclosure, the plurality of pixel regions PA may include the first-color pixel region PA1, the second-color pixel region PA2 and the third-color pixel region PA3.

In two adjacent pixel rows PA0H, one pixel row PA0H may include the plurality of first-color pixel regions PA1 and second-color pixel regions PA2 arranged along the first direction X; and the other pixel row PA0H may include the plurality of third-color pixel regions PA3 arranged along the first direction X.

In the present disclosure, it describes that the plurality of pixel regions PA of the first display region AA1 may include the plurality of pixel regions of different colors. For example, the plurality of pixel regions PA may include the first-color pixel region PA1, the second-color pixel region PA2 and the third-color pixel region PA3. In some embodiments of the present disclosure, the first-color pixel region PA1 may be a blue pixel region for configuring blue sub-pixels, the second-color pixel region PA2 may be a red pixel region for configuring red sub-pixels, the third-color pixel region PA3 may be a green pixel region for configuring green sub-pixels, or the first-color pixel region PA1 may also be a pixel region of other colors, which may not be limited in the present disclosure. In the present disclosure, it configures the arrangement manner of the plurality of pixel regions PA of different colors in the first display region AA1 to be that in two adjacent pixel rows PA0H, for example, two adjacent pixel rows PA0H1 and PA0H2 shown in FIG. 22, the pixel row PA0H1 may include the plurality of first-color pixel regions PA1 and second-color pixel regions PA2 arranged along the first direction X, and the pixel row PA0H2 may include the plurality of third-color pixel regions PA3 arranged along the first direction X. The space between the light-transmitting regions TA may be fully utilized to arrange the pixel regions PA, thereby achieving the effect of maximizing the space utilization rate between adjacent light-transmitting regions TA. Moreover, according to the present disclosure, the plurality of pixel regions PA of different colors included in the first display region AA1 may be reasonably arranged between the light-transmitting regions TA, so that for one pixel unit including the first-color pixel region PA1, the second-color pixel region PA2 and the third-color pixel region PA3, at least one of the first-color pixel region PA1, the second-color pixel region PA2 and the third-color pixel region PA3 may be borrowed by another pixel unit to improve the display effect when the first display region AA1 is used for displaying.

Figure 23:
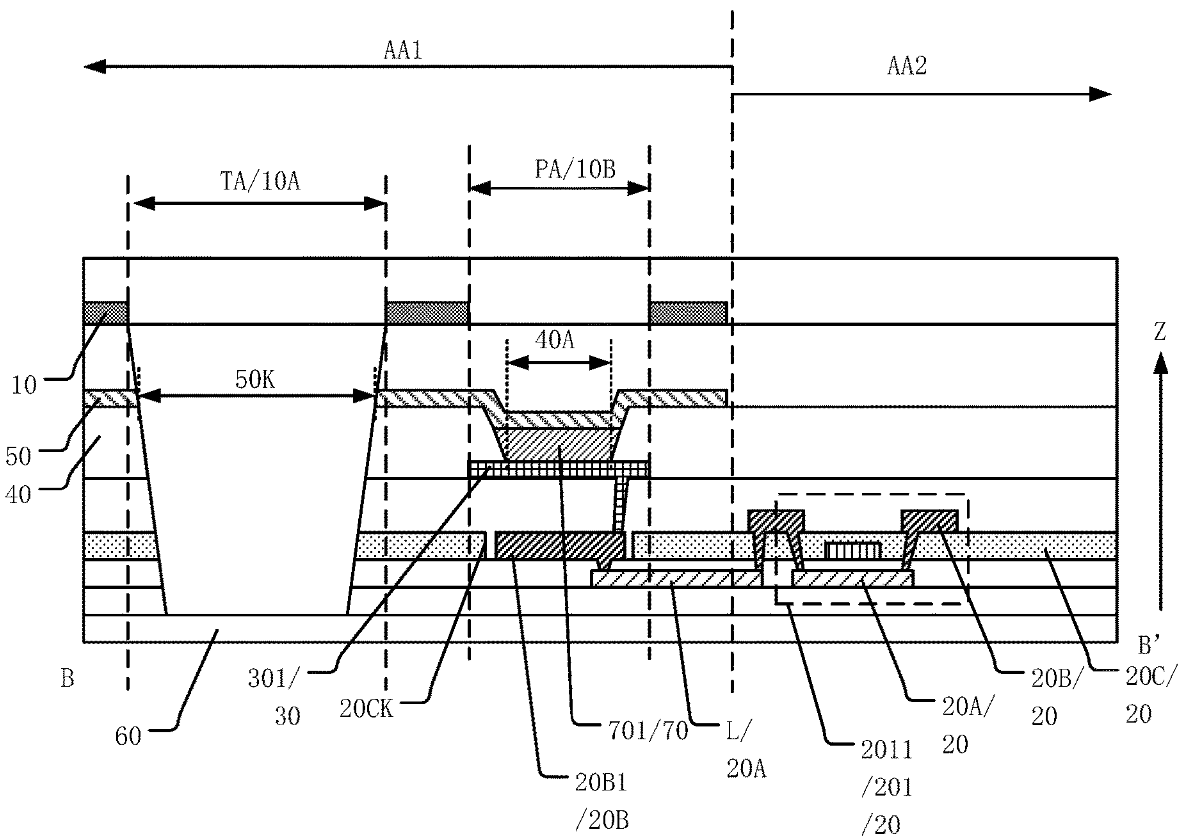
FIG. 23 illustrates a cross-sectional structural view along a line B-B' in FIG. 1.

In some embodiments of the present disclosure, referring to FIGS. 1 and 23, FIG. 23 illustrates a cross-sectional structural view along a line B-B' in FIG. 1. In the present disclosure, the display panel 000 may further include the second display region AA2 which is arranged at least partially around the first display region AA1, and the transmittance of the second display region AA2 may be lower than the transmittance of the first display region AA1.

The display panel 000 may also include a drive array layer 20. The array layer 20 may be on the side of the light-blocking layer 10 away from the light-emitting surface of the display panel 000 and include a plurality of pixel circuits 201; the pixel circuit 201 may include a first pixel circuit 2011; and the first pixel circuit 2011 may be in the second display region AA2 and drive the pixel region PA of the first display region AA1 to emit light.

The display panel 000 may further include an anode layer 30, where the anode layer 30 may be on the side of the drive array layer 20 facing the light-blocking layer 10 and include a plurality of first anode parts 301 in the first display region AA1.

The first pixel circuit 2011 may be electrically connected to the first anode part 301 through the first connection line L.

In the present disclosure, it describes that the film structure of the display panel 000 may include the drive array layer 20, and the drive array layer 20 may be on the side of the light-blocking layer 10 away from the light-emitting surface of the display panel 000. It can be understood that the light-emitting surface of the display panel 000 in the present disclosure can be understood as the surface of the display panel 000 for displaying pictures. The drive array layer 20 may include a plurality of conductive film layers such as metal film layers, for configuring a plurality of pixel circuits 201. The pixel circuit 201 may be configured to drive the sub-pixels in the display panel 000 to emit light. For example, when the display panel 000 is an organic light-emitting diode display panel, the pixel circuit 201 may be a pixel circuit structure including at least a plurality of transistors for electrically connecting with the organic light-emitting diodes of all sub-pixels, thereby realizing the light-emitting effect of the sub-pixels. It can be understood that only one transistor structure may be used to indicate the first pixel circuit 2011 in FIG. 23. During an implementation, the transistor connection structure of the first pixel circuit 2011 can be understood with reference to the existing technology. The display panel 000 of the present disclosure may further include the second display region AA2 arranged at least partially around the first display region AA1, the transmittance of the second display region AA2 may be lower than the transmittance of the first display region AA1. That is, the second display region AA2 may be used as a normal display region and also include a plurality of pixel regions, and the pixel regions may be arranged with sub-pixels for displaying. The present disclosure does not describe the structure of each sub-pixel in the second display region AA2 in the display panel 000, which may refer to the structure of the organic light-emitting diode display panel in the existing technology. The pixel circuit 201 of the present disclosure may include the first pixel circuit 2011. The first pixel circuit 2011 may be configured to drive the sub-pixels arranged in the pixel region PA of the first display region AA1 to emit light, and the first pixel circuit 2011 of the present disclosure may be in the second display region AA2. That is, the first pixel circuit 2011 may not be arranged in the first display region AA1 where the pixel region PA is located; and the plurality of electrically connected transistor structures included in the first pixel circuit 2011 may be arranged in the second display region AA2. In such way, the influence of the first pixel circuit 2011 on the transmittance of the first display region AA1 may be avoided, and the transmittance of the first display region AA1 may be further improved, thereby ensuring the photosensitive effect.

The pixel region PA of the first display region AA1 of the present disclosure can be understood as a sub-pixel. The anode layer 30 on the side of the drive array layer 20 facing the light-blocking layer 10 may include the plurality of first anode parts 301 in the first display region AA1, and the sub-pixel of one pixel region PA may correspond to one first anode part 301. The first pixel circuit 201 for driving the sub-pixel arranged in the pixel region PA of the first display region AA1 to emit light may be arranged in the second display region AA2. Therefore, the first pixel circuit 201 in the second display region AA2 of the present disclosure may be electrically connected to the first anode part 301 of the pixel region PA of the first display region AA1 through the first connection line L. It may realize that the first pixel circuit 201 of the second display region AA2 may provide an anode drive signal to the first anode part 301 of the first display region AA1, and the transmittance of the first display region AA1 may be ensured. Moreover, since the first pixel circuit 2011 for driving the pixel region PA in the first display region AA1 to emit light is arranged in the second display region AA2, the structural complexity of the first display region AA1 may be reduced, and the diffraction effect when external light passes the first display region may be reduced, thereby improving the image-forming quality of the camera disposed under the first display region AA1.

In some embodiments of the present disclosure, a transparent conductive material may be used for the first connection line L in the present disclosure, which may ensure the conductive effect and improve the transmittance of the first display region AA1.

It should be noted that FIG. 23 of the present disclosure is only an exemplary cross-sectional structural schematic illustrating a partial region in the first display region AA1 and the second display region AA2. In an implementation, the film layer structure of the display panel may include, but may not be limited to such structure, and may also include other structures capable of realizing the display function. The details can be understood with reference to the film layer structure of the organic light-emitting diode display panel in the existing technology which may not be described in detail in the present disclosure.

In some embodiments of the present disclosure, referring to FIGS. 1 and 23, in the present disclosure, the drive array layer 20 may include an active layer 20A and a first metal layer 20B; a first insulating layer 20C may be at least included between the active layer 20A and the first metal layer 20B; and the first metal layer 20B may be on the side of the active layer 20A facing the anode layer 30.

At least a part of the first connection lines L may be in the active layer 20A.

The first insulating layer 20C may include a first via hole 20CK, the first metal layer 20B may include a first connection part 20B1, the first connection part 20B1 may be in the first via hole 20CK, and the first connection line L may be electrically connected to the first anode part 301 through the first connection part 20B1.

In the present disclosure, it describes that the film layer structure of the display panel 000 may include the transparent conductive layer, such as the active layer 20A in the drive array layer 20. The pixel circuit 201 included in the drive array layer 20 may include oxide transistors. The material for fabricating the active layer of the oxide transistor may be an oxide active layer of the transparent conductive material. For example, the active layer 20A in the drive array layer 20 may be made of indium gallium zinc oxide (IGZO), which is a transparent conductive material. Therefore, in the present disclosure, at least a part of the first connecting line L may be arranged on the active layer 20A, so that the original film layer structure in the display panel 000 may be reused to form the first connecting line L. In such way, it may realize the electrical connection between the first anode part 301 of the first display region AA1 and the first pixel circuit 2011 of the second display region AA2, which may ensure the transmittance and also reduce the process steps, thereby being beneficial for reducing the thickness of entire panel and realizing the display panel with a thin structure.

In some embodiments of the present disclosure, the first metal layer 20B on the side of the active layer 20A facing the anode layer 30 of the present disclosure may be configured to dispose the source and drain electrodes of the transistor of the first pixel circuit 2011, such that at least the first insulating layer 20C may be included between the active layer and the first metal layer 20B. In some embodiments of the present disclosure, other insulating layers or metal conductive layers may also be included between the active layer 20A and the first metal layer 20B, which may not be limited in the present disclosure.

In the present disclosure, when the electrical connection between the first anode part 301 of the first display region AA1 and the first pixel circuit 2011 of the second display region AA2 is realized, the first insulating layer 20C may be configured to include the first via hole 20CK, and the first via hole 20CK may pass through at least the first insulating layer 20C, or when a plurality of insulating layers are included between the first metal layer 20B and the active layer 20A, the first via hole 20CK may pass through the plurality of insulating layers. The first metal layer 20B may include the first connection part 20B1; the first connection part 20B1 may be in the first via hole 20CK; and the first connection line L in the active layer 20A may be electrically connected to the first anode part 301 in the first display region AA1 through the first connection part 20B1.

It can be understood that other metal film layers may also be included between the first metal layer 20B and the anode layer 30 of the present disclosure. At this point, the first connection line L of the active layer 20A may also be electrically connected to the first anode part 301 in the first display region AA1 through the cooperation of the first connection part 20B1 and the connection parts of other metal film layers, which may not be limited in the present disclosure and may only need to satisfy that the first connecting line L may be at least partially in the active layer 20A, the first connecting line L may be configured by reusing the film structure included in the display panel 000, thereby ensuring transmittance and reducing panel thickness.

In some embodiments of the present disclosure, referring to FIG. 1 and FIG. 23, in the present disclosure, the display panel 000 may further include a pixel definition layer 40. The pixel definition layer 40 may be on the side of the anode layer 30 away from the drive array layer 20 and include a plurality of third opening regions 40A.

In a same pixel region PA, the orthographic projection of the third opening region 40A on the plane of the display panel 000 may be within the orthographic projection range of the first connection part 20B1 on the plane of the display panel 000; and the orthographic projection of the first connection part 20B1 on the plane of the display panel 000 may be within the orthographic projection range of the first via hole 20CK on the plane of the display panel 000.

In the present disclosure, it describes that the first pixel circuit 2011 in the second display region AA2 may be electrically connected to the first anode part 301 of the first display region AA1 through the first connection line L. The first connection line L may be electrically connected to the first anode part 301 through the first connection part 20B1. The display panel 000 may include the pixel definition layer 40 on the side of the anode layer 30 away from the drive array layer 20. The pixel definition layer 40 may include the plurality of third opening regions 40A. The third opening region 40A may be overlapped with the pixel region PA, that is, the region of the third opening region 40A can be understood as the region where the pixel region PA is located. In the present disclosure, for the same pixel region PA, the orthographic projection of the third opening region 40A on the plane of the display panel 000 may be configured to be within the orthographic projection range of the first connection part 20B1 on the plane of the display panel 000; and the orthographic projection of the first connection part 20B1 on the plane of the display panel 000 may be configured to be within the orthographic projection range of the first via hole 20CK on the plane of the display panel 000. That is, the third opening region 40A, the first connection part 20B1 and the first via hole 20CK may be overlapped with each other along the direction Z perpendicular to the plane of the display panel 000; the region of the third opening region 40A of the pixel definition layer 40 may be smaller than the region of the first connection part 20B1 in the first metal layer 20B; and the region of the first connection part 20B1 in the first metal layer 20B may be smaller than the region of the first via hole 20CK formed in the first insulating layer 20C. During the fabrication process of the display panel 000, in order to realize the electrical connection between the first pixel circuit 2011 in the second display region AA2 and the first anode part 301 in the first display region AA1 through the first connection line L, after fabricating the structure of the active layer 20A, such as the active part of the transistor and the first connection line L, at least one first insulating layer 20C may be formed, the first via hole 20CK may be formed, and then the first metal layer 20B may be formed on the side of the first insulating layer 20C away from the active layer 20A. At this point, the material of the un-patterned first metal layer 20B may be filled in the first via hole 20CK. Next, by patterning the first metal layer 20B, structures such as the first connection part 20B1 on the first metal layer 20B and the source and drain electrodes of the transistor may be formed. The material of the first metal layer 20B filled in the first via hole 20CK may easily cause unevenness of entire first metal layer 20B adjoined on the sidewall of the first via hole 20CK and easily affect the flatness of the anode layer 30 to be fabricated subsequently. Therefore, in the present disclosure, when the first metal layer 20B is patterned, the material of the first metal layer 20B that should be filled in the first via hole 20CK and adjoined on the sidewall of the first via hole 20CK may be completely etched. That is, the orthographic projection of the first connection part 20B1 of fabricated first metal layer 20B on the plane of the display panel 000 may be within the orthographic projection range of the first via hole 20CK on the plane of the display panel 000. In such way, the flatness of the anode layer 30 to be fabricated subsequently at the position corresponding to the first connection part 20B1 may be ensured, which may be beneficial for improving display quality.

It can be understood that the third opening region 40A of the pixel definition layer 40 of the present disclosure may be formed by opening a through hole, which passes through the pixel definition layer 40, in the pixel definition layer 40, and the cross-sectional shape of the through hole may be configured according to actual needs. As shown in FIG. 23, the cross-section of the through hole may be an inverted trapezoid. In such case, the range of the third opening region 40A of the pixel definition layer 40 may be based on the bottom edge of the inverted trapezoid.

In some embodiments of the present disclosure, referring to FIG. 1 and FIG. 23, in the present disclosure, the display panel 000 may further include a cathode layer 50 which is on the side of the anode layer 30 away from the drive array layer 20.

The cathode layer 50 may include a plurality of hollow regions 50K. Along the direction Z perpendicular to the plane of the display panel 000, the hollow region 50K may be overlapped with the light-transmitting region TA.

In the present disclosure, it describes that the cathode layer 50 may be further included on the side of the anode layer 30 of the display panel 000 away from the drive array layer 20; a light-emitting functional layer may be disposed between the cathode layer 50 and the first anode part 301 of the anode layer 30; the light-emitting functional layer may be an organic light-emitting material; and driven by the electric field formed by the first anode part 301 of the anode layer 30 and the cathode layer 50, the light-emitting effect of the pixel region PA may be achieved through carrier injection and recombination. In the present disclosure, it configures that the cathode layer 50 may include the plurality of hollow regions 50K; and the hollow region 50K and the light-transmitting region TA may be overlapped along the direction Z perpendicular to the plane of the display panel 000. In such way, the cathode layer 50 may be a whole-surface structure, only the hollow region 50K may be configured in the light-transmitting region TA, and the shape of the cathode layer 50 in the first display region AA1 except the pixel region PA may be consistent with the shape of the light-blocking layer 10, which may prevent the cathode layer 50 from affecting overall light transmittance of the first display region AA1 in the light transmittance region TA, thereby further improving the transmittance of the first display region AA1.

It can be understood that, as shown in FIG. 23, within the light-transmitting region TA of the present disclosure, the film layer structure of the display panel 000 may only include the film layer with high light transmittance, and remaining film layers with low light transmittance may be removed and then filled with the light-transmitting material with high light transmittance, which may further improve the light transmittance of the light-transmitting region TA.

In some embodiments of the present disclosure, referring to FIGS. 1, 2 and 23, in the present disclosure, the display panel 000 may include a substrate 60 and a light-emitting functional layer 70 on the side of the substrate 60; and the light-emitting functional layer 70 may include a plurality of light-emitting parts 701 which may be in the pixel regions PA.

The light-blocking layer 10 may be on the side of the light-emitting functional layer 70 away from the substrate 60.

In the present disclosure, it describes that the display panel 000 may include the substrate 60 and the light-emitting functional layer 70 on the side of the substrate 60. The substrate 60 may be used as a carrier substrate of the display panel 000; and the drive array layer the anode layer 30, the pixel definition layer 50, the light-emitting functional layer 70, and the cathode layer 50 may be fabricated on the substrate 60. The light-emitting functional layer 70 may also be disposed between the anode layer 30 and the cathode layer 50 of the display panel 000; and the light-emitting functional layer 70 may include a plurality of light-emitting parts 701. In some embodiments of the present disclosure, the light-emitting part 701 may be made of an organic light-emitting material, and the light-emitting parts of multiple colors may correspond to the pixel regions PA of multiple different colors; that is, the light-emitting parts 701 may be in the pixel regions PA. The light-blocking layer 10 of the present disclosure may be on the side of the light-emitting functional layer 70 away from the substrate 60. In some embodiments of the present disclosure, the light-blocking layer 10 may be on the side of the cathode layer 50 away from the substrate 60, that is, the light-blocking layer 10 may be disposed on the light-emitting side of the light-emitting functional layer 70 of the display panel 000. The first opening region and the second opening region 10B formed by the light-blocking structure of the light-blocking layer 10 may respectively obtain the light-transmitting region TA and the pixel region PA.

Figure 24:
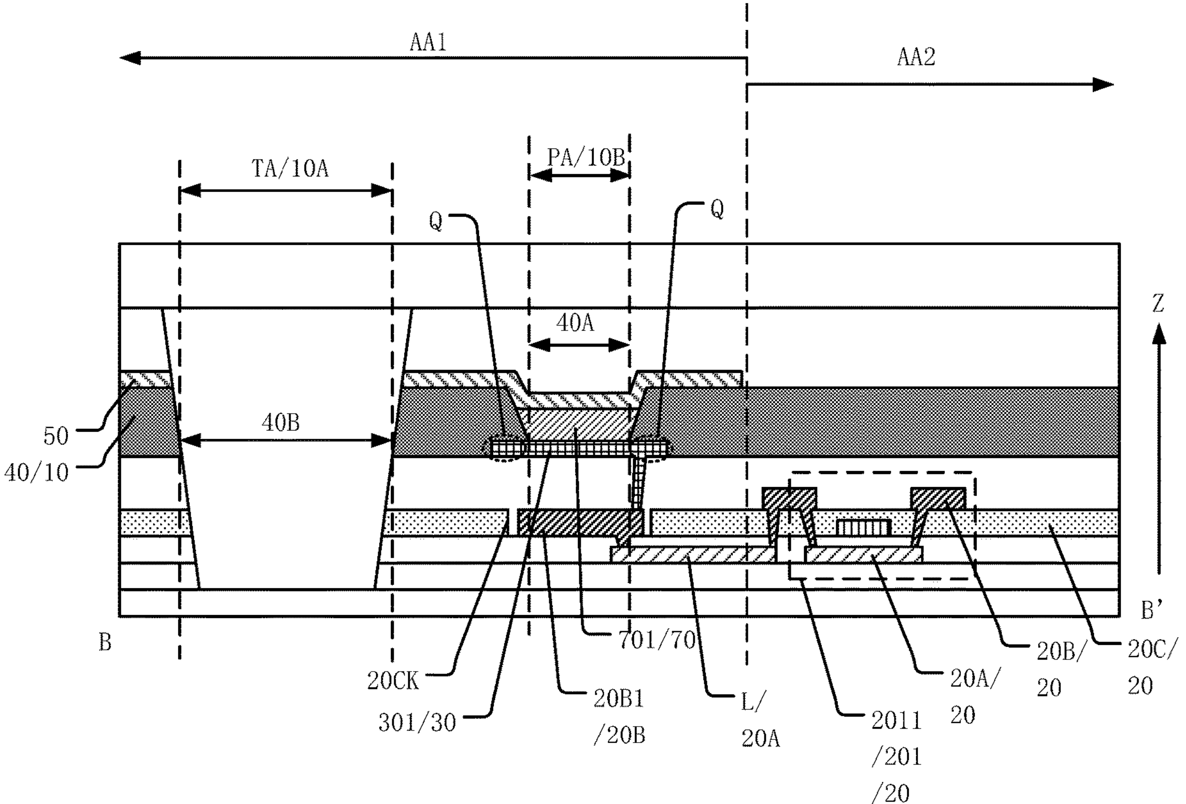
FIG. 24 illustrates another cross-sectional structural view along a line B-B' in FIG. 1.

In some embodiments of the present disclosure, FIG. 24 illustrates another cross-sectional structural view along a line B-B' in FIG. 1. In the present disclosure, the display panel 000 may further include the pixel definition layer 40 which may include a plurality of third opening regions 40A and a plurality of fourth opening regions 40B.

The pixel definition layer 40 may be reused as the light-blocking layer 10, the third opening region 40A may be reused as the second opening region 10B, and the fourth opening region 40B may be reused as the first opening region 10A.

In the present disclosure, it describes that the display panel 000 may further include the pixel definition layer 40, and the plurality of third opening regions 40A included in the pixel definition layer 40 may be configured to dispose the light-emitting parts 701 of the light-emitting functional layer 70, that is, the position of the third opening region 40A may be the position of the pixel region PA. The material for fabricating the pixel definition layer 40 of the present disclosure may be a black opaque material. Therefore, the pixel definition layer 40 may be configured to prevent external light from irradiating a part of the first anode part 301 (normally, when the first anode part 301 is fabricated, the first anode part 301 may have a part beyond the first opening region 40A, for example, the region Q as shown in FIG. 24); and the pixel definition layer 40 may avoid the reflection phenomenon caused by the external light irradiating on a partial region Q of the first anode part 301 beyond the first opening region 40A, thereby improving the display effect. The pixel definition layer 40 made of the black opaque material of the present disclosure may be reused as the light-blocking layer 10, and the pixel definition layer 40 may include the plurality of third opening regions 40A and the plurality of fourth opening regions 40B. At this point, the third opening region 40A may be reused as the second opening region 10B, and the fourth opening region 40B may be reused as the first opening region 10A. Therefore, the pixel definition layer 40 made of black opaque material may respectively define the regions where the pixel region PA and the light-transmitting region TA are located, thereby avoiding adding other light-blocking film layers in the display panel, which may be beneficial for realizing overall thin design of the panel.

It can be understood that the third opening region 40A of the pixel definition layer of the present disclosure may be formed by opening a through hole, which passes through the pixel definition layer 40, in the pixel definition layer 40; and the cross-sectional shape of the through hole may be configured according to actual needs. As shown in FIG. 24, the cross-section of the through hole may be an inverted trapezoid. In such case, the range of the third opening region 40A of the pixel definition layer 40 may be based on the bottom edge of the inverted trapezoid.

Figure 25:
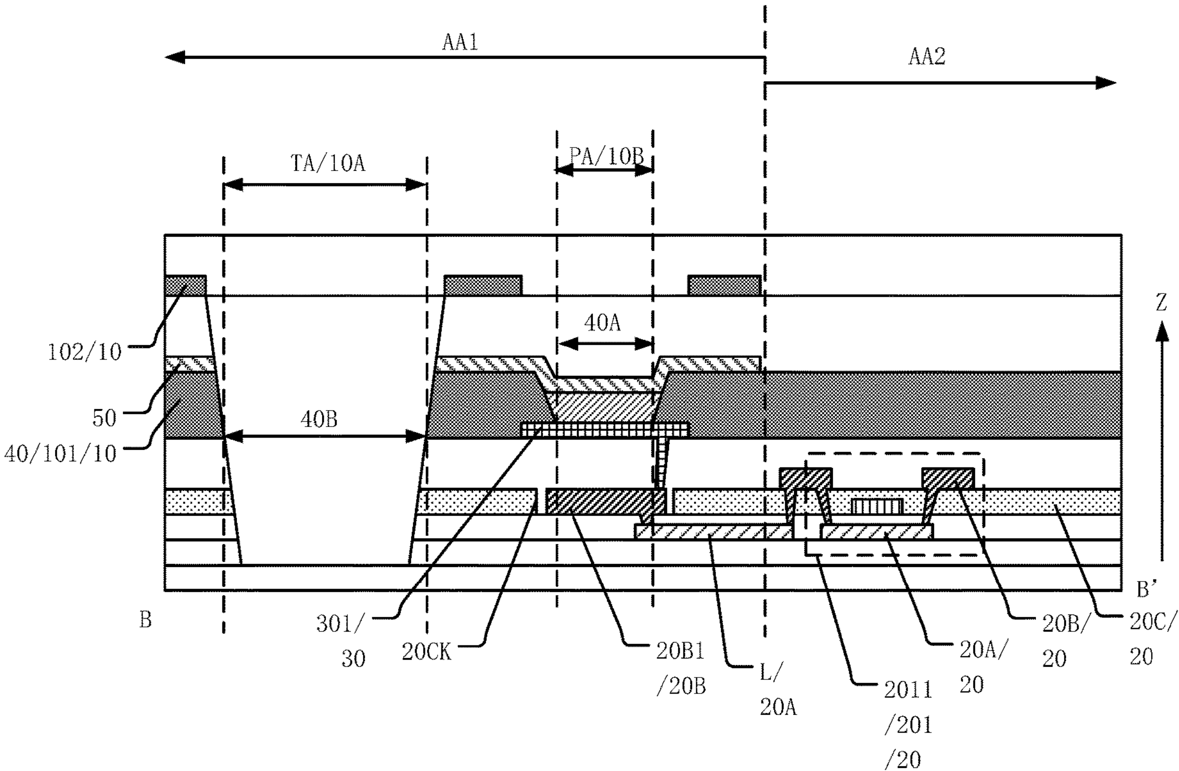
FIG. 25 illustrates another cross-sectional structural view along a line B-B' in FIG. 1.

In some embodiments of the present disclosure, referring to FIGS. 1 and 25, FIG. 25 illustrates another cross-sectional structural view along a line B-B' in FIG. 1, the light-blocking layer 10 of the present disclosure may include the first light-blocking layer 101 and the second light-blocking layer 102. When the display panel 000 includes the black pixel definition layer 40 and the light-blocking layer on the side of the pixel definition layer 40 away from the substrate 60, the black pixel definition layer 40 may be used as the first light-blocking layer 101, and the light-blocking layer on the side of the pixel definition layer 40 away from the substrate may be used as the second light-blocking layer 102. The first light-blocking layer 101 and the second light-blocking layer 102 may each include the first opening region 10A and the second opening region 10B, respectively. When the first opening region 10A of the first light-blocking layer 101 and the first opening region 10A of the second light-blocking layer 102 are overlapped with each other along the direction Z perpendicular to the plane of the display panel, and when the first opening region 10A of the first light-blocking layer 101 is within the range of the first opening region 10A of the second light-blocking layer 102, the boundary of smaller first opening region 10A of the first light-blocking layer 101 can be understood as the boundary of the light-transmitting region TA. When the second opening region 10B of the first light-blocking layer 101 and the second opening region 10B of the second light-blocking layer 102 are overlapped with each other along the direction Z perpendicular to the plane of the display panel and when the second opening region 10B of the first light-blocking layer 101 is within the range of the second opening region 10B of the second light-blocking layer 102, the boundary of smaller second opening region 10B of the first light-blocking layer 101 can be understood as the boundary of the pixel region PA (as shown in FIG. 25). Therefore, the regions where the pixel region PA and the light-transmitting region TA of the first display region AA1 are located may be jointly defined by the plurality of light-blocking layers 10 in the display panel 000.

Figure 26:
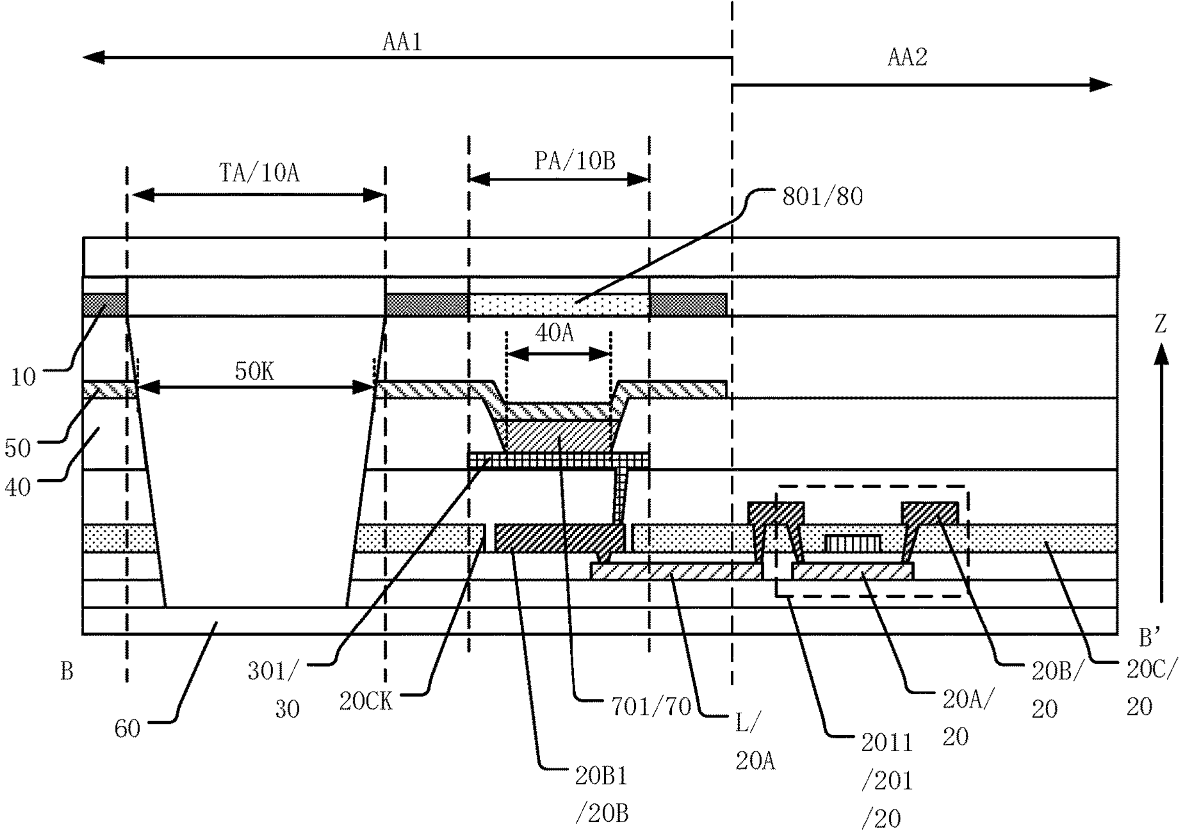
FIG. 26 illustrates another cross-sectional structural view along a line B-B' in FIG. 1.

In some embodiments of the present disclosure, referring to FIGS. 1 and 26, FIG. 26 illustrates another cross-sectional structural view along a line B-B' in FIG. 1, the display panel 000 may further include a color resist layer 80. The color resist layer 80 may be on the side of the light-emitting functional layer 70 away from the substrate 60; the color resist layer 80 may include a plurality of color resists 801; and the orthographic projection of the color resists 801 on the substrate 60 may be overlapped with the orthographic projection of the third opening region on the substrate 60.

In the present disclosure, it describes that the display panel 000 may further include the color resist layer 80 which may be on the side of the light-emitting functional layer 70 away from the substrate 60. In some embodiments of the present disclosure, the color resist layer 80 may be on the side of the cathode layer 50 away from the substrate 60 and may be fabricated after the cathode layer 50 and the thin film encapsulation layer are fabricated. Normally, in an organic light-emitting display panel, since the light-emitting functional layer 70 made of an organic light-emitting material emits light by itself, it is not necessary to provide a polarizer. However, the reflection of the external light on the cathode layer 50 may cause low product contrast ratio. Therefore, in normal organic light-emitting display panel, a circular polarizer may need to be configured to reduce the reflection of the external ambient light. Although the circular polarizer can reduce the reflection of external ambient light and improve the contrast ratio of the organic light-emitting display panel when the panel is used outdoor. However, the circular polarizer may have problems such as low transmittance, thick thickness, poor foldability and the like. Therefore, in the present disclosure, the color resist layer 80 may be disposed on the side of the light-emitting functional layer 70 away from the substrate 60 through a color filter fabrication process to replace the circular polarizer in the organic light-emitting display panel. Using the filtering principle of the color filter, the orthographic projection of the color resist 801 on the substrate 60 may be overlapped with the orthographic projection of the third opening region 40A on the substrate 60, that is, the color resist 801 may cover the light-emitting part 701, which may not only play the role of anti-reflection, but also filter the spectrum of the sub-pixels of each pixel region PA to narrow the spectrum and improve the color purity, thereby being beneficial for improving the display effect. The light-blocking layer 10 of the present disclosure may be used as a black matrix structure disposed between the color resists 801, and the light-blocking layer 10 may absorb ambient light and achieve the effect of blocking external light reflection.

It can be understood that the light-blocking layer 10 of the present disclosure may be a black matrix structure between the color resists 801; or in some other optional embodiments, the light-blocking layer 10 may also be a film layer structure separately provided in the display panel 000, which may not be limited in the present disclosure.

Figure 27:
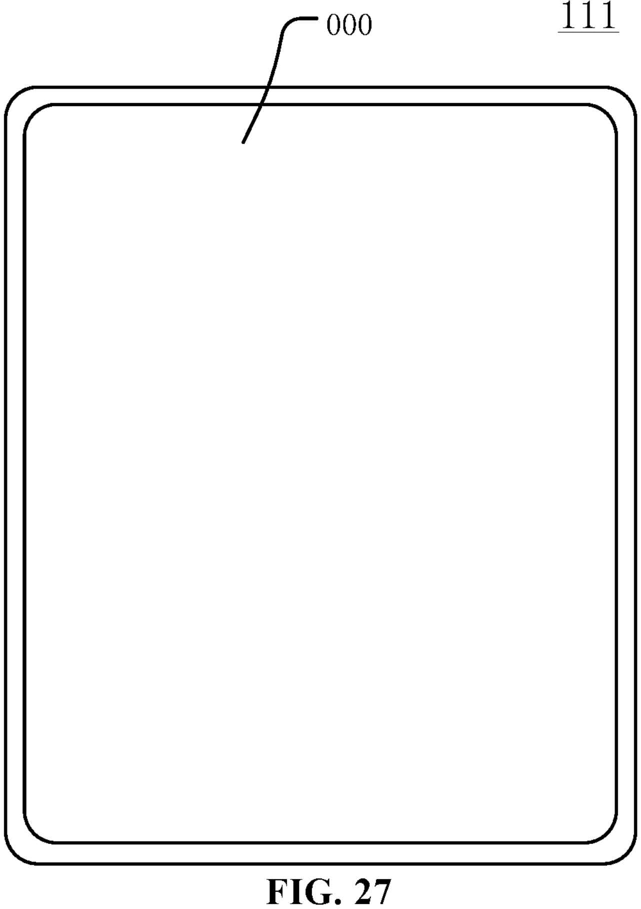
FIG. 27 illustrates a planar structural schematic of a display apparatus according to various embodiments of the present disclosure.

In some embodiments of the present disclosure, referring to 27, FIG. 27 illustrates a planar structural schematic of a display apparatus according to various embodiments of the present disclosure. The display apparatus 111 provided by the present disclosure may include the display panel 000 provided by above embodiments of the present disclosure. The embodiment of FIG. 27 may only take a mobile phone as an example to describe the display apparatus 111. It can be understood that the display apparatus 111 provided in embodiments of the present disclosure may include other display apparatuses 111 having a display function, such as a computer, a TV, and a vehicle-mounted display apparatus, which may not be limited in the present disclosure. The display apparatus 111 provided by embodiments of the present disclosure may have the beneficial effects of the display panel 000 provided by embodiments of the present disclosure, which may refer to specific description of the display panel 000 in above embodiments and may not be described in detail herein.

From above-mentioned embodiments, it may be seen that the display panel and the display apparatus provided by the present disclosure may achieve at least following beneficial effects.

The display panel provided by the present disclosure may include at least the first display region; the first display region may also be used as the configuration region corresponding to the photosensitive element; the first display region may include the plurality of light-transmitting regions and the plurality of pixel regions; the pixel region may be configured to dispose sub-pixels for display; and the light-transmitting region may not be disposed with sub-pixels for display and may only be configured to make that the transmittance of the light-transmitting region is greater than the transmittance of the pixel region through external light. When the photosensitive element is not used, the plurality of pixel regions in the first display region may display pictures normally; and when the photosensitive element needs to be used, the plurality of light-transmitting regions in the first display region may enable external light to enter the photosensitive element in the region to realize the photosensitive function. The display panel of the present disclosure may include the light-blocking layer; and the light-blocking layer may include at least the first opening region and the second opening region within the range of the first display region. The first opening region may correspond to the position of the light-transmitting region, and the second opening region may correspond to the position of the pixel region. In the present disclosure, along the direction in parallel with the plane of the display panel, the minimum distance D1 between the light-transmitting region and the pixel region may be configured to be less than the minimum distance D2 between two adjacent pixel regions, so that the arrangement positions of the pixel regions in the first display region may be configured according to the arrangement structure of the light-transmitting regions. That is, on the basis of satisfying the maximum transmittance of the first display region, after arranging the plurality of light-transmitting regions in the first display region, each pixel region may be arranged between adjacent light-transmitting regions; furthermore, the arrangement positions of the pixel regions may be reasonably arranged according to the space between the light-transmitting regions, so that the minimum distance D1 between the light-transmitting region and the pixel region may be less than the minimum distance D2 between two adjacent pixel regions. The space between the light-transmitting regions may be fully utilized to arrange the pixel regions to minimum the distance D1 between the pixel region and its adjacent light-transmitting regions as possible, thereby realizing maximum space utilization rate between adjacent light-transmitting regions. In the present disclosure, the light-transmitting regions may be ensured to have a sufficient area to maximize the light transmittance of the first display region; in addition, by reasonably arranging the positions of the pixel regions, the pixel regions may not only be in the space between the light-transmitting regions, but also the minimum distance D1 between the pixel region and its adjacent light-transmitting regions may reach the minimum value as possible which may be less than the minimum distance D2 between two adjacent pixel regions. The maximum space utilization rate of the first display region may be achieved, which may provide favorable conditions for improving the PPI (i.e., pixels per inch which refers to the number of pixels per inch) in the first display region. Furthermore, the display quality of the first display region may be ensured as possible while ensuring the light transmittance to achieve a higher photosensitive effect.

Although some embodiments of the present disclosure have been described in detail through examples, those skilled in the art should understand that above-mentioned examples may be provided for illustration only and may not limit the scope of the present disclosure. Those skilled in the art should understand that modifications may be made to above-mentioned embodiments without departing from the scope of the present disclosure. The scope of the disclosure may be defined by the appended claims.

What is claimed is:

1. A display panel, comprising:

a first display region, wherein the first display region includes a plurality of light-transmitting regions and a plurality of pixel regions; and a transmittance of a light-transmitting region of the plurality of light-transmitting regions is greater than a transmittance of a pixel region of the plurality of pixel regions; and a light-blocking layer, wherein:

the light-blocking layer includes a first opening region and a second opening region;

along a direction perpendicular to a plane of the display panel, the first opening region is overlapped with the light-transmitting region, and the second opening region is overlapped with the pixel region; and along a direction in parallel with the plane of the display panel, a minimum distance between the light-transmitting region and the pixel region is D1, and a minimum distance between two adjacent pixel regions is D2, wherein D1<D2, wherein:

a first multiple light-transmitting regions is arranged along a first direction to form a light-transmitting row, and a plurality of light-transmitting rows is arranged along a second direction;

a second multiple light-transmitting regions is arranged along the second direction to form a light-transmitting column, and a plurality of light-transmitting columns is arranged along the first direction, wherein along the direction in parallel with the plane of the display panel, the first direction intersects the second direction;

the plurality of light-transmitting rows at least includes an m-th light-transmitting row and an (m+1)-th light-transmitting row; and along the first direction, a light-transmitting region in the m-th light-transmitting row is between two adjacent corresponding light-transmitting regions in the (m+1)-th light-transmitting row;

the plurality of light-transmitting columns at least includes an n-th light-transmitting column and an (n+1)-th light-transmitting column; and along the second direction, a light-transmitting region in the n-th light-transmitting column is between two adjacent corresponding light-transmitting regions in the (n+1)-th light-transmitting column, wherein m and n are both positive integers;

the plurality of light-transmitting regions includes a plurality of first-light-transmitting regions; a geometric center point of each of six first-light-transmitting regions is a vertex of a first hexagon; and a geometric center point of each of six pixel regions is a vertex of a second hexagon; and one vertex of the second hexagon corresponds to one side of the first hexagon.

2. The display panel according to claim 1, wherein:

a shape of an orthographic projection of the light-transmitting region on the plane of the display panel includes a circle; and a shape of an orthographic projection of the pixel region on the plane of the display panel includes at least one of a circle, an ellipse, or a rectangle with chamfered corners.

3. The display panel according to claim 1, wherein:

an area of an orthographic projection of the light-transmitting region on the plane of the display panel is S1; and an area of an orthographic projection of the pixel region on the plane of the display panel is S2, wherein S1>S2.

4. The display panel according to claim 1, wherein:

the plurality of light-transmitting regions includes a plurality of second-light-transmitting regions, and a second-light-transmitting region of the plurality of second-light-transmitting regions is in the first hexagon;

connection lines between a geometric center point of the second-light-transmitting region and two adjacent vertices of the first hexagon form one triangle; and one pixel region is configured within a range of the one triangle.

5. The display panel according to claim 4, wherein:

the first display region includes a plurality of repeating units; one repeating unit includes four light-transmitting regions and eight pixel regions; and in the one repeating unit, the eight pixel regions include two first-color pixel regions, two second-color pixel regions, and four third-color pixel regions;

in the one repeating unit, two light-transmitting regions are arranged along the first direction to form a first light-transmitting group; the other two light-transmitting regions are arranged along the first direction to form a second light-transmitting group; the first light-transmitting group and the second light-transmitting group are arranged along the second direction; four pixel regions are arranged along the first direction to form a first pixel group; the other four pixel regions are arranged along the first direction to form a second pixel group; and the first pixel group and the second pixel group are arranged along the second direction;

the first pixel group is between the first light-transmitting group and the second light-transmitting group; and the second pixel group is on a side of the second light-transmitting group away from the first light-transmitting group; and a line connecting geometric center points of light-transmitting regions in the second-light-transmitting group is configured as a symmetry axis; and the first pixel group and the second pixel group are symmetrically arranged along the symmetry axis.

6. The display panel according to claim 4, wherein:

the first display region includes a plurality of repeating units; one repeating unit includes four light-transmitting regions and eight pixel regions; and in the one repeating unit, the eight pixel regions include two first-color pixel regions, two second-color pixel regions, and four third-color pixel regions; and the four third-color pixel regions are respectively at four vertex positions of two opposite sides of the second hexagon.

7. The display panel according to claim 6, wherein:

in the one repeating unit, the four light-transmitting regions are in two adjacent light-transmitting rows, wherein two light-transmitting regions are arranged along the first direction to form a first sub-light-transmitting row, and the other two light-transmitting regions are arranged along the first direction to form a second sub-light-transmitting row; and the four third-color pixel regions are arranged by surrounding a light-transmitting region in the second sub-light-transmitting row;

in the four third-color pixel regions, two third-color pixel regions are arranged along the first direction to form a first third-color pixel row, and the other two third-color pixel regions are arranged along the first direction to form a second third-color pixel row; and along the second direction, the first third-color pixel row is between the first sub-light-transmitting row and the second sub-light-transmitting row, and the second third-color pixel row is on a side of the second sub-light-transmitting row away from the first third-color pixel row; and in the two first-color pixel regions and the two second-color pixel regions, along the first direction, one first-color pixel region is between the two third-color pixel regions in the first third-color pixel row, and one second-color pixel region is between the two third-color pixel regions in the second third-color pixel row; another first-color pixel region is on a side of the two third-color pixel regions in the second third-color pixel row away from the one second-color pixel region; and another second-color pixel region is on a side of the two third-color pixel regions in the first third-color pixel row away from the one first-color pixel region.

8. The display panel according to claim 6, wherein:

in the one repeating unit, the four light-transmitting regions are in two adjacent light-transmitting columns, wherein two light-transmitting regions are arranged along the second direction to form a first sub-light-transmitting column; and the other two light-transmitting regions are arranged along the second direction to form a second sub-light-transmitting column;

the four third-color pixel regions are arranged by surrounding one light-transmitting region in the second sub-light-transmitting column; the light-transmitting region surrounded by the four third-color pixel regions is a first central light-transmitting region; and another light-transmitting region in the second sub-light-transmitting column is a first non-central light-transmitting region;

along the second direction, two third-color pixel regions are on two opposite sides of the first central light-transmitting region; and along the first direction, two third-color pixel regions are on two opposite sides of the first central light-transmitting region;

along the first direction, one second-color pixel region and one first-color pixel region are respectively on two opposite sides of the first central light-transmitting region;

along the first direction, another second-color pixel region and another first-color pixel region are respectively on two opposite sides of the first non-central light-transmitting region; and one second-color pixel region and one first-color pixel region are arranged along the second direction and between the first sub-light-transmitting column and the second sub-light-transmitting column.

9. The display panel according to claim 4, wherein:

the first display region includes a plurality of repeating units; one repeating unit includes four light-transmitting regions and eight pixel regions; and in the one repeating unit, the eight pixel regions include two first-color pixel regions, two second-color pixel regions, and four third-color pixel regions; and three third-color pixel regions are respectively at three vertex positions of the second hexagon which are spaced apart from each other at intervals.

10. The display panel according to claim 9, wherein:

in the one repeating unit, the four light-transmitting regions are in two adjacent light-transmitting rows, wherein two light-transmitting regions are arranged along the first direction to form a first sub-light-transmitting row; and the other two light-transmitting regions are arranged along the first direction to form a second sub-light-transmitting row;

in the four third-color pixel regions, two third-color pixel regions are between the first sub-light-transmitting row and the second sub-light-transmitting row; and the other two third-color pixel regions are on a side of the second sub-light-transmitting row away from the first sub-light-transmitting row;

in the four third-color pixel regions, three third-color pixel regions are arranged by surrounding one light-transmitting region in the second sub-light-transmitting row, wherein one third-color pixel region is between the first sub-light-transmitting row and the second sub-light-transmitting row, and the other two third-color pixel regions are on the side of the second sub-light-transmitting row away from the first sub-light-transmitting row;

the one light-transmitting region surrounded by the three third-color pixel regions is a second central light-transmitting region, and another light-transmitting region in the second sub-light-transmitting row is a second non-central light-transmitting region;

two first-color pixel regions and one second-color pixel region are arranged by surrounding the second central light-transmitting region; in the three third-color pixel regions arranged by surrounding the second central light-transmitting region, one first-color pixel region is arranged between two adjacent third-color pixel regions; another first-color pixel region is arranged between two adjacent third-color pixel regions; and one second-color pixel region is arranged between two adjacent third-color pixel regions;

in the four third-color pixel regions, in addition to the three third-color pixel regions arranged by surrounding the second central light-transmitting region, another third-color pixel region is a fourth third-color pixel region, wherein the fourth third-color pixel region is on a side of a first-color pixel region between the first sub-light-transmitting row and the second sub-light-transmitting row away from a second-color pixel region; and in the two second-color pixel regions, in addition to one second-color pixel region arranged by surrounding the second central light-transmitting region, another second-color pixel region is a second second-color pixel region, wherein along the second direction, the fourth third-color pixel region and the second second-color pixel region are on two opposite sides of the second non-central light-transmitting region.

11. The display panel according to claim 9, wherein:

in the one repeating unit, the four light-transmitting regions are in two adjacent light-transmitting columns, wherein two light-transmitting regions are arranged along the second direction to form a first sub-light-transmitting column; and the other two light-transmitting regions are arranged along the second direction to form a second sub-light-transmitting column;

in the four third-color pixel regions, two third-color pixel regions are between the first sub-light-transmitting column and the second sub-light-transmitting column; and the other two third-color pixel regions are on a side of the second sub-transmissive column away from the first sub-transmissive column;

in the four third-color pixel regions, three third-color pixel regions are arranged by surrounding one light-transmitting region in the second sub-light-transmitting column, wherein one third-color pixel region is between the first sub-light-transmitting column and the second sub-light-transmitting column, and the other two third-color pixel regions are on a side of the second sub-light-transmitting column away from the first sub-light-transmitting column;

the one light-transmitting region surrounded by the three third-color pixel regions is a third central light-transmitting region, and another light-transmitting region in the second sub-light-transmitting column is a third non-central light-transmitting region;

two first-color pixel regions and one second-color pixel region are arranged by surrounding the third central light-transmitting region; in the three third-color pixel regions arranged by surrounding the third central light-transmitting region, one first-color pixel region is arranged between two adjacent third-color pixel regions; another one first-color pixel region is arranged between two adjacent third-color pixel regions; and one second-color pixel region is arranged between two adjacent third-color pixel regions;

in the four third-color pixel regions, in addition to the three third-color pixel regions arranged by surrounding the third central light-transmitting region, another third-color pixel region is a fourth third-color pixel region, wherein the fourth third-color pixel region is on a side of a first-color pixel region between the first sub-light-transmitting column and the second sub-light-transmitting column away from a second-color pixel region; and in the two second-color pixel regions, in addition to one second-color pixel region arranged by surrounding the third central light-transmitting region, another second-color pixel region is a second second-color pixel region, wherein along the first direction, the fourth third-color pixel region and the second second-color pixel region are on two opposite sides of the third non-central light-transmitting region.

12. The display panel according to claim 1, wherein:

a first multiple light-transmitting regions is arranged along the first direction to form a light-transmitting row, and a plurality of light-transmitting rows is arranged along the second direction; a second multiple light-transmitting regions is arranged along the second direction to form a light-transmitting column, and a plurality of light-transmitting columns is arranged along the first direction, wherein along the direction in parallel with the plane of the display panel, the first direction intersects the second direction; at least two adjacent light-transmitting rows form one light-transmitting row group, and a plurality of light-transmitting regions in a same light-transmitting row group is arranged in an array; and a plurality of light-transmitting row groups at least includes an i-th light-transmitting row group and an (i+1)-th light-transmitting row group; along the first direction, a light-transmitting region in the i-th light-transmitting row group is between two adjacent light-transmitting regions in the (i+1)-th light-transmitting row group, wherein i is a positive integer; and/or a plurality of pixel regions arranged along the first direction forms a pixel row, and a plurality of pixel rows is arranged along the second direction; a pixel row is included between two light-transmitting rows of the one light-transmitting row group; a pixel region is not included between two adjacent light-transmitting row groups; the one light-transmitting row group includes four light-transmitting regions; the four light-transmitting regions are in two adjacent light-transmitting rows; geometric center points of the four light-transmitting regions are vertices of one quadrilateral; and one pixel region is arranged within a range of the one quadrilateral.

13. The display panel according to claim 1, further including:

a pixel definition layer, wherein:

the pixel definition layer includes a plurality of third opening regions and a plurality of fourth opening regions; and the pixel definition layer is reused as the light-blocking layer, a third opening region of the plurality of third opening regions is reused as the second opening region, and a fourth opening region of the plurality of fourth opening regions is reused as the first opening region.

14. The display panel according to claim 1, further including:

a substrate and a light-emitting functional layer on a side of the substrate, wherein the light-emitting functional layer includes a plurality of light-emitting parts; the plurality of light-emitting parts is in the plurality of pixel regions; and the light-blocking layer is on a side of the light-emitting functional layer away from the substrate.

15. A display panel, comprising:

a first display region, wherein the first display region includes a plurality of light-transmitting regions and a plurality of pixel regions; and a transmittance of a light-transmitting region of the plurality of light-transmitting regions is greater than a transmittance of a pixel region of the plurality of pixel regions; and a light-blocking layer, wherein:

the light-blocking layer includes a first opening region and a second opening region;

along a direction perpendicular to a plane of the display panel, the first opening region is overlapped with the light-transmitting region, and the second opening region is overlapped with the pixel region; and along a direction in parallel with the plane of the display panel, a minimum distance between the light-transmitting region and the pixel region is D1, and a minimum distance between two adjacent pixel regions is D2, wherein D1<D2, wherein:

a first multiple light-transmitting regions is arranged along a first direction to form a light-transmitting row, and a plurality of light-transmitting rows is arranged along a second direction;

a second multiple light-transmitting regions is arranged along the second direction to form a light-transmitting column, and a plurality of light-transmitting columns is arranged along the first direction, wherein along the direction in parallel with the plane of the display panel, the first direction intersects the second direction;

the plurality of light-transmitting rows at least includes an m-th light-transmitting row and an (m+1)-th light-transmitting row; and along the first direction, a light-transmitting region in the m-th light-transmitting row is between two adjacent corresponding light-transmitting regions in the (m+1)-th light-transmitting row;

the plurality of light-transmitting columns at least includes an n-th light-transmitting column and an (n+1)-th light-transmitting column; and along the second direction, a light-transmitting region in the n-th light-transmitting column is between two adjacent corresponding light-transmitting regions in the (n+1)-th light-transmitting column, wherein m and n are both positive integers;

along the first direction, one pixel region is arranged between two adjacent light-transmitting regions in a same light-transmitting row; and along the second direction, one pixel region is arranged between two adjacent light-transmitting regions in a same light-transmitting column; and/or the plurality of pixel regions include first-color pixel regions, second-color pixel regions and third-color pixel regions; the first-color pixel regions and the second-color pixel regions are arranged to be spaced apart from each other at intervals along the first direction; a first-color pixel region is between two adjacent light-transmitting regions in an m-th light-transmitting row; a second-color pixel region is between two adjacent light-transmitting regions in the m-th light-transmitting row; a third-color pixel region is between two adjacent light-transmitting regions in an (m+1)-th light-transmitting row; another first-color pixel region is between two adjacent light-transmitting regions in an n-th light-transmitting column; another third-color pixel region is between two adjacent light-transmitting regions in an (n+1)-th light-transmitting column and an (n+3)-th light-transmitting column; and another second-color pixel region is between two adjacent light-transmitting regions in an (n+2)-th light-transmitting column.

16. A display panel, comprising:

a first display region, wherein the first display region includes a plurality of light-transmitting regions and a plurality of pixel regions; and a transmittance of a light-transmitting region of the plurality of light-transmitting regions is greater than a transmittance of a pixel region of the plurality of pixel regions; and a light-blocking layer, wherein:

the light-blocking layer includes a first opening region and a second opening region;

along a direction perpendicular to a plane of the display panel, the first opening region is overlapped with the light-transmitting region, and the second opening region is overlapped with the pixel region; and along a direction in parallel with the plane of the display panel, a minimum distance between the light-transmitting region and the pixel region is D1, and a minimum distance between two adjacent pixel regions is D2, wherein D1<D2, wherein:

the plurality of light-transmitting regions is arranged in an array;

a first multiple light-transmitting regions is arranged along the first direction to form a light-transmitting row, and a plurality of light-transmitting rows is arranged along the second direction;

a second multiple light-transmitting regions is arranged along the second direction to form a light-transmitting column, and a plurality of light-transmitting columns is arranged along the first direction, wherein along the direction in parallel with the plane of the display panel, the first direction intersects the second direction;

the plurality of light-transmitting rows at least includes an e-th light-transmitting row and an (e+1)-th light-transmitting row; and along the first direction, a g-th light-transmitting region in the e-th light-transmitting row and a g-th light-transmitting region in the (e+1)-th light-transmitting row are in a same light-transmitting column;

the plurality of light-transmitting columns at least includes an f-th light-transmitting column and an (f+1)-th light-transmitting column; and along the second direction, an h-th light-transmitting region in the f-th light-transmitting column and an h-th light-transmitting region in the (f+1)-th light-transmitting column are in a same light-transmitting row, wherein e, f, g and h are all positive integers;

along a third direction, two pixel regions are between two adjacent light-transmitting regions, wherein an angle between the third direction and the first direction is an acute angle; and an angle between the third direction and the second direction is an obtuse angle; and/or a plurality of pixel regions arranged along the third direction forms a pixel diagonal column, and a plurality of pixel diagonal columns is arranged along a fourth direction, wherein along the direction in parallel with the plane of the display panel, the fourth direction intersects the third direction; the plurality of pixel regions include first-color pixel regions, second-color pixel regions and third-color pixel regions; along the fourth direction, in two adjacent pixel diagonal columns, one pixel diagonal column includes a first-color pixel region and a third-color pixel region which are arranged along the third direction; and another pixel diagonal column includes a second-color pixel region and a third-color pixel region which are arranged along the third direction.

* * * * *